US008000137B2

(12) United States Patent
Ogura et al.

(10) Patent No.: US 8,000,137 B2
(45) Date of Patent: Aug. 16, 2011

(54) NONVOLATILE SEMICONDUCTOR MEMORY DEVICE AND USAGE METHOD THEREOF

(75) Inventors: Taku Ogura, Amagasaki (JP); Natsuo Ajika, Amagasaki (JP); Shoji Shukuri, Amagasaki (JP); Satoshi Shimizu, Amagasaki (JP); Yoshiki Kawajiri, Amagasaki (JP); Masaaki Mihara, Amagasaki (JP)

(73) Assignee: Genusion, Inc., Hyogo (JP)

( * ) Notice: Subject to any disclaimer, the term of this patent is extended or adjusted under 35 U.S.C. 154(b) by 68 days.

(21) Appl. No.: 12/400,015

(22) Filed: Mar. 9, 2009

(65) Prior Publication Data

US 2009/0244972 A1    Oct. 1, 2009

(30) Foreign Application Priority Data

Mar. 27, 2008  (JP) ............................... P2008-084244
Mar. 28, 2008  (JP) ............................... P2008-085873

(51) Int. Cl.
*G11C 16/04* (2006.01)

(52) U.S. Cl. .......... 365/185.05; 365/185.18; 365/185.26

(58) Field of Classification Search ............ 365/185.05, 365/185.18, 185.26
See application file for complete search history.

(56) References Cited

U.S. PATENT DOCUMENTS

| 4,740,713 | A | | 4/1988 | Sakurai et al. | |
|---|---|---|---|---|---|
| 5,270,587 | A | * | 12/1993 | Zagar | 326/50 |
| 5,594,687 | A | * | 1/1997 | Lin et al. | 365/185.1 |
| 5,745,417 | A | | 4/1998 | Kobayashi et al. | |
| 5,898,606 | A | | 4/1999 | Kobayashi et al. | |
| 6,215,701 | B1 | * | 4/2001 | Yao et al. | 365/185.18 |
| 6,414,872 | B1 | * | 7/2002 | Bergemont et al. | 365/185.05 |
| 7,221,596 | B2 | | 5/2007 | Pesavento et al. | |
| 7,447,064 | B1 | * | 11/2008 | Bu et al. | 365/185.01 |
| 2008/0019162 | A1 | | 1/2008 | Ogura et al. | |

FOREIGN PATENT DOCUMENTS

| JP | 1986-172435 | 8/1986 |
|---|---|---|
| JP | 2006-066529 | 3/2006 |
| JP | 2008-047274 | 2/2008 |

* cited by examiner

*Primary Examiner* — Pho M Luu
(74) *Attorney, Agent, or Firm* — The Marbury Law Group PLLC

(57) ABSTRACT

A nonvolatile semiconductor memory device includes a first PMOS transistor and a second PMOS transistor having a gate, the first and the second PMOS transistors being connected in series; and a first NMOS transistor and a second NMOS transistor having a gate, the first and the second NMOS transistors being connected in series; wherein the gate of the second PMOS transistor and the gate of the second NMOS transistor are commonly connected and floated.

20 Claims, 87 Drawing Sheets

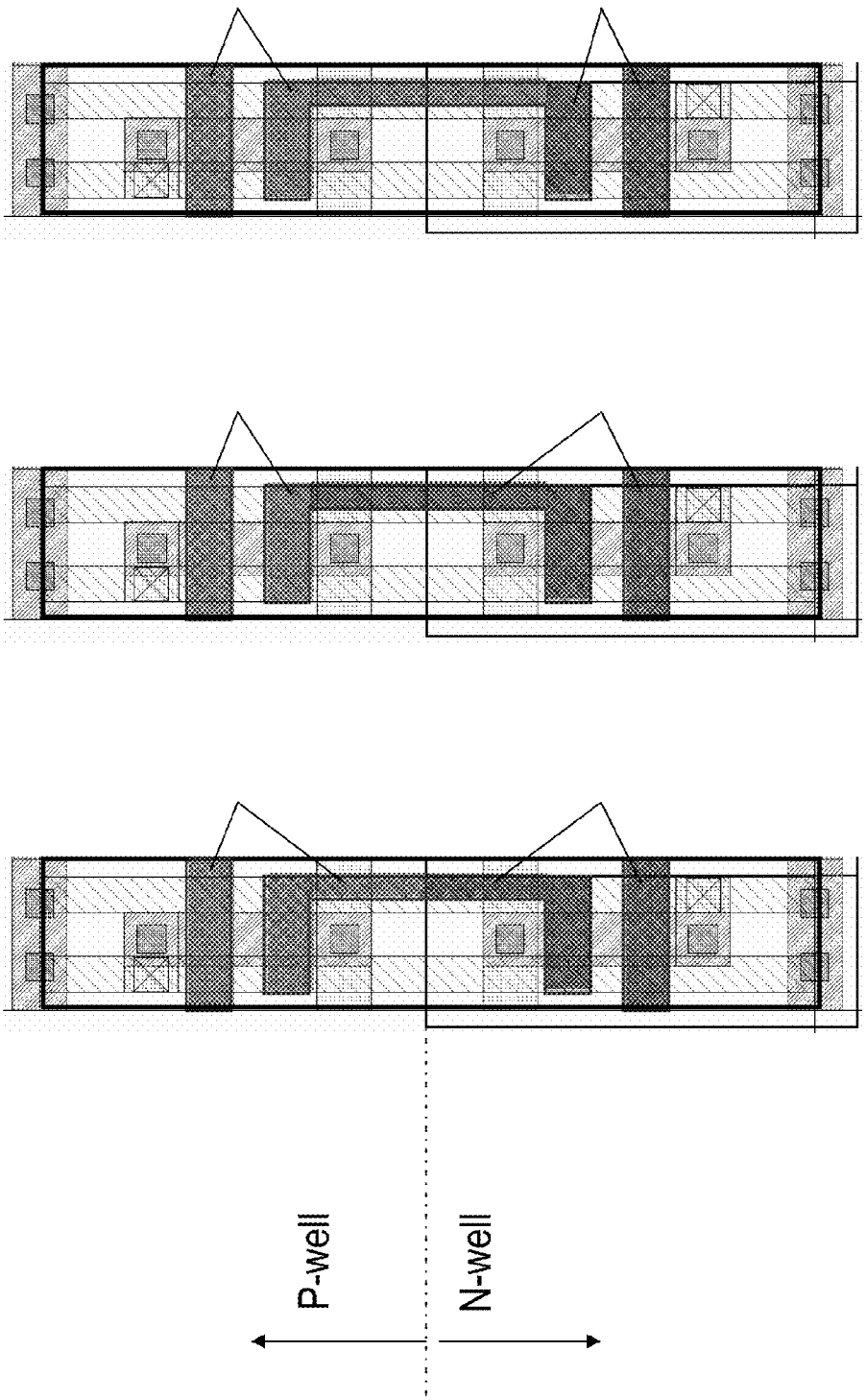

Fig. 9B

⟨When determined by a current value of an N type MOS transistor MN⟩
Data"1": Vth_MN < Vref → LMN > Lref
Data"0": Vth_MN > Vref → LMN < Lref ⟨When determined by a current value of an P type MOS transistor MP⟩
Data"1": Vth_MP < Vref → LMP < Lref
Data"0": Vth_MP > Vref → LMP > Lref

|  |  | STBY | Simultaneous programming data "1" & "0" | | PROGRAM Data"1" | PROGRAM Data"0" | READ① | READ② |
|---|---|---|---|---|---|---|---|---|
|  |  |  | Data "1" | Data "0" |  |  |  |  |
| SELECTED | VGP | – | VGP_sel | VGP_sel | VGP_unsel | VGP_sel | 0V | 0V |
|  | VGN | – | VGN_sel | VGN_sel | VGN_sel | VGN_unsel | VCC | 0V |
|  | VDN | – | VDN_sel | VDN_unsel | VDN_sel | VDN_unsel | sense | 0V |
|  | VDP | – | VDP_unsel | VDP_sel | VDP_unsel | VDP_sel | 0V | sense |
| COMMON | VSN | 0V | 0V/HiZ | 0V/HiZ | 0V/HiZ | 0V | 0V | 0V |
|  | VSP | 0V/VCC | 0V/VCC/HiZ | 0V/VCC/HiZ | 0V | 0V/VCC/HiZ | VCC | VCC |
|  | VPW | 0V | VPW_p | VPW_p | VPW_p | VPW_p | 0V | 0V |
|  | VNW | 0V/VCC | VNW_p | VNW_p | VNW_p | VNW_p | VCC | VCC |
| NON-SELECTED | VGP | 0V | VGP_unsel | VGP_unsel | VGP_unsel | VGP_unsel | 0V | 0V |
|  | VGN | 0V | VGN_unsel | VGN_unsel | VGN_unsel | VGN_unsel | 0V | 0V |
|  | VDN | 0V | VDN_unsel | VDN_unsel | VDN_unsel | VDN_unsel | 0V | 0V |
|  | VDP | 0V/VCC | VDP_unsel | VDP_unsel | VDP_unsel | VDP_unsel | 0V | VCC |

Where data "0" and data "1" are programmed in separate steps.

<Inequations which express the relationship of each potential>

VGN_sel ≧ VDN_sel > VDP_sel ≧ VGP_sel
VDN_sel > VDN_unsel ≧ VGN_unsel
VGP_unsel ≧ VDP_unsel > VDP_sel
VNW_p ≧ VPW_p
VNW_p ≧ 0V
VCC > sense > 0V

| | | STBY | Simultaneous programming data "1" & "0" | | PROGRAM | | READ① | READ② |
|---|---|---|---|---|---|---|---|---|
| | | | Data "1" | Data "0" | Data"1" | Data"0" | | |
| SELECTED | VGP | – | -7V | -7V | 0V | -7V | 0V | 0V |
| | VGN | – | 7V | 7V | 7V | 0V | VCC | 0V |
| | VDN | – | 7V | 0V | 7V | 0V | 1V | 0V |
| | VDP | – | 0V | -7V | 0V | -7V | 0V | 1V |
| COMMON | VSN | 0V | HiZ | HiZ | HiZ | 0V | 0V | 0V |
| | VSP | 0V/VCC | HiZ | HiZ | 0V | HiZ | 0V | VCC |
| | VPW | 0V | 0V | 0V | 0V | 0V | 0V | 0V |
| | VNW | 0V/VCC | 0V | 0V | 0V | 0V | 0V | VCC |
| NON-SELECTED | VGP | 0V/VCC | 0V | 0V | 0V | 0V | 0V | 0V |
| | VGN | 0V | 0V | 0V | 0V | 0V | 0V | 0V |
| | VDN | 0V | 0V | 0V | 0V | 0V | 0V | 0V |
| | VDP | 0V/VCC | 0V | 0V | 0V | 0V | 0V | VCC |

Where data "0" and data "1" are programmed in separate steps.

(*) READ① : 0V
    READ② : VCC

VCC=1.8V

Fig. 13

A current which flows to an NMOS.

Fig. 24B

\<When determined by the current difference of the N type MOS transistors MNT and MNB\>

Data"1": $Vth\_MNT < Vth\_MNB \rightarrow L\_MNT > L\_MNB$

Data"0": $Vth\_MNT > Vth\_MNB \rightarrow L\_MNT < L\_MNB$

\<When determined by the current difference of the P type MOS transistors MPT and MPB\>

Data"1": $Vth\_MPT < Vth\_MPB \rightarrow L\_MPT < L\_MPB$

Data"0": $Vth\_MPT > Vth\_MPB \rightarrow L\_MPT > L\_MPB$

| | | STBY | Simultaneous programming data "1" & "0" | | PROGRAM 2step method | | | | READ① | READ② |
|---|---|---|---|---|---|---|---|---|---|---|
| | | | | | Step1(FN) | | → Step2(BTBT-HE) | | | |
| | | | Data "1" | Data "0" | Data "1" | Data "0" | Data "1" | Data "0" | | |
| SELECTED | VGP | — | VGP_sel | VGP_sel | VGP_unsel | VGP_unsel | VGP_sel | VGP_sel | 0V | 0V |
| | VGN | — | VGN_sel | VGN_sel | VGN_unsel | VGN_unsel | VGN_unsel | VGN_unsel | VCC | 0V |
| | VDN_T | — | VDN_sel | VDN_sel | VDN_unsel | VDN_unsel | VDN_unsel | VDN_unsel | senseT | 0V |
| | VDP_T | — | VDP_unsel | VDP_sel | VDP_sel | VDP_sel | VDP_sel | VDP_sel | 0V | senseT |
| | VDN_B | — | VDN_sel | VDN_unsel | VDN_unsel | VDN_unsel | VDN_unsel | VDN_unsel | senseB | 0V |
| | VDP_B | — | VDP_sel | VDP_sel | VDP_unsel | VDP_unsel | VDP_sel | VDP_sel | 0V | senseB |
| COMMON | VSN | 0V | 0V/HiZ | 0V/HiZ | 0V/HiZ | 0V/HiZ | 0V | 0V | 0V | 0V |
| | VSP | 0V/VCC | 0V/VCC/HiZ | 0V/VCC/HiZ | 0V | 0V | 0V/VCC/HiZ | 0V/VCC/HiZ | 0V | VCC |
| | VPW | 0V | VPW_p | VPW_p | VPW_p | VPW_p | VPW_p | VPW_p | 0V | 0V |
| | VNW | 0V/VCC | VNW_p | VNW_p | VNW_p | VNW_p | VNW_p | VNW_p | 0V | 0V |
| NON-SELECTED | VGP | 0V/VCC | VGP_unsel | VGP_unsel | VGP_unsel | VGP_unsel | VGP_unsel | VGP_unsel | 0V | VCC |
| | VGN | 0V | VGN_unsel | VGN_unsel | VGN_unsel | VGN_unsel | VGN_unsel | VGN_unsel | 0V | 0V |
| | VDN_T | 0V/VCC | VDN_unsel | VDN_unsel | VDN_unsel | VDN_unsel | VDN_unsel | VDN_unsel | 0V | VCC |
| | VDP_T | 0V/VCC | VDP_unsel | VDP_unsel | VDP_unsel | VDP_unsel | VDP_unsel | VDP_unsel | 0V | 0V |
| | VDN_B | 0V | VDN_unsel | VDN_unsel | VDN_unsel | VDN_unsel | VDN_unsel | VDN_unsel | 0V | VCC |
| | VDP_B | 0V/VCC | VDP_unsel | VDP_unsel | VDP_unsel | VDP_unsel | VDP_unsel | VDP_unsel | 0V | VCC |

Where an FN tunneling operation and a BTBT-HE operation are performed separately.

<Inequations which express the relationships of each potential>

$VGN\_sel \geqq VDN\_sel > VDP\_sel \geqq VGP\_sel$ $VDN\_sel > VDN\_unsel \geqq VGN\_unsel$ $VGP\_unsel \geqq VDP\_unsel > VDP\_sel$ $VNW\_p \geqq VPW\_p, VNW\_p \geqq 0V$ $VCC > senseT > 0V, VCC > senseB > 0V$

|  |  | STBY | Simultaneous programming data "1" & "0" | | PROGRAM 2step method | | | | READ① | READ② |
|  |  |  |  |  | Step1(FN) | | Step2(BTBT-HE) | | | |
|  |  |  | Data "1" | Data "0" | Data "1" | Data "0" | Data "1" | Data "0" | | |
| SELECTED | VGP | — | −7V | −7V | 0V | 0V | −7V | −7V | 0V | 0V |
|  | VGN | — | 7V | 7V | 7V | 7V | 0V | 0V | VCC | 0V |
|  | VDN_T | — | 7V | 0V | 7V | 0V | 0V | 0V | 1V | 0V |
|  | VDP_T | — | 0V | −7V | 0V | 0V | 0V | −7V | 0V | 1V |
|  | VDN_B | — | 0V | 7V | 0V | 7V | 0V | 0V | 1V | 0V |
|  | VDP_B | — | −7V | 0V | 0V | 0V | −7V | 0V | 0V | 1V |
| COMMON | VSN | 0V | HiZ | HiZ | HiZ | HiZ | HiZ | HiZ | 0V | 0V |
|  | VSP | 0V/VCC | HiZ | HiZ | 0V | 0V | 0V | 0V | VCC | VCC |
|  | VPW | 0V | 0V | 0V | 0V | 0V | 0V | 0V | 0V | 0V |
|  | VNW | 0V/VCC | 0V | 0V | 0V | 0V | 0V | 0V | VCC | VCC |
| NON-SELECTED | VGP | 0V | 0V | 0V | 0V | 0V | 0V | 0V | 0V | 0V |
|  | VGN | 0V | 0V | 0V | 0V | 0V | 0V | 0V | 0V | 0V |
|  | VDN_T | 0V/VCC | 0V | 0V | 0V | 0V | 0V | 0V | 0V | 0V |
|  | VDP_T | 0V/VCC | 0V | 0V | 0V | 0V | 0V | 0V | VCC | VCC |
|  | VDN_B | 0V | 0V | 0V | 0V | 0V | 0V | 0V | 0V | 0V |
|  | VDP_B | 0V/VCC | 0V | 0V | 0V | 0V | 0V | 0V | VCC | VCC |

(*) READ① : 0V
READ② : VCC

VCC=1.8V

Fig. 29

| | | STBY | PROGRAM Data"1" | PROGRAM Data"0" | READ① | READ② |
|---|---|---|---|---|---|---|
| SELECTED | VCG | — | VCG_sel_FN | VCG_sel_BT | 0V | 0V |
| | VGP | — | VGP_unsel | VGP_sel | 0V | 0V |
| | VGN | — | VGN_sel | VGN_unsel | VCC | 0V |
| | VDN | — | VDN_sel | VDN_unsel | sense | Sense |
| | VDP | — | VDP_unsel | VDP_sel | 0V | 0V |
| COMMON | VSN | 0V | 0V/HiZ | 0V | 0V | 0V |
| | VSP | 0V/VCC | 0V | 0V/VCC/HiZ | 0V | VCC |
| | VPW | 0V | VPW_p | VPW_p | 0V | 0V |
| | VNW | 0V/VCC | VNW_p | VNW_p | 0V | VCC |
| | VNWC | VCC | VCC | VCG_sel_BT | VCC | VCC |
| NON-SELECTED | VCG | 0V | VCG_unsel | VCG_unsel | 0V | 0V |
| | VGP | 0V/VCC | VGP_unsel | VGP_unsel | 0V | VCC |
| | VGN | 0V | VGN_unsel | VGN_unsel | 0V | 0V |
| | VDN | 0V | VDN_unsel | VDN_unsel | 0V | 0V |
| | VDP | 0V/VCC | VDP_unsel | VDP_unsel | 0V | VCC |

Where data "0" and data "1" are programmed in separate steps in order to improve BTBT-HE injection efficiency and FN tunneling efficiency by VCG voltage.

<Inequations which express the relationships of each potential>

VGN_sel ≧ VDN_sel > VDP_sel ≧ VGP_sel
VDN_sel > VDN_unsel ≧ VGN_unsel
VGP_unsel ≧ VDP_unsel > VDP_sel
VNW_p ≧ VPW_p, VNW_p ≧ 0V
VCC > sense > 0V
VCG_sel_BT ≧ VCG_unsel ≧ VCG_sel_FN

| | | STBY | PROGRAM Data"1" | PROGRAM Data"0" | READ① | READ② |
|---|---|---|---|---|---|---|
| SELECTED | VCG | - | -2V | VCC | 0V | 0V |
| | VGP | - | 0V | -7V | 0V | 0V |
| | VGN | - | 7V | 0V | VCC | 0V |
| | VDN | - | 7V | 0V | 1V | 0V |
| | VDP | - | 0V | -7V | 0V | 1V |
| COMMON | VSN | 0V | HiZ | 0V | 0V | 0V |
| | VSP | 0V/VCC | 0V | HiZ | 0V | VCC |
| | VPW | 0V | 0V | 0V | 0V | 0V |
| | VNW | 0V/VCC | 0V | VCC | VCC | VCC |
| | VNWC | VCC | VCC | VCC | VCC | VCC |
| NON-SELECTED | VCG | 0V | 0V | 0V | 0V | 0V |
| | VGP | 0V/VCC | 0V | 0V | VCC | VCC |
| | VGN | 0V | 0V | 0V | 0V | 0V |
| | VDN | 0V | 0V | 0V | 0V | 0V |
| | VDP | 0V/VCC | 0V | 0V | 0V | VCC |

(*) READ① : 0V
READ② : VCC

VCC=1.8V

Fig. 47

| | | STBY | PROGRAM 2step method | | | | READ 1 | READ 2 |
|---|---|---|---|---|---|---|---|---|
| | | | Step 1 (FN) | | Step 2 (BTBT-HE) | | | |
| | | | Data "1" | Data "0" | Data "1" | Data "0" | | |
| SELECTED | VCG | - | VCG_selFN | VCG_selFN | VCG_selBT | VCG_selBT | 0V | 0V |
| | VGP | - | VGP_unsel | VGP_sel | VGP_sel | VGP_sel | 0V | 0V |
| | VGN | - | VGN_sel | VGN_unsel | VGN_unsel | VGN_unsel | VCC | 0V |
| | VDN_T | - | VDN_sel | VDN_unsel | VDN_unsel | VDN_unsel | senseT | 0V |
| | VDP_T | - | VDP_unsel | VDP_unsel | VDP_sel | VDP_sel | 0V | senseT |
| | VDN_B | - | VDN_sel | VDN_unsel | VDN_unsel | VDN_unsel | senseB | 0V |
| | VDP_B | - | VDP_unsel | VDP_unsel | VDP_sel | VDP_sel | 0V | senseB |
| COMMON | VSN | 0V | 0V/HiZ | 0V/HiZ | 0V | 0V | 0V | 0V |
| | VSP | 0V/VCC | 0V | 0V | 0V/VCC/HiZ | 0V/VCC/HiZ | VCC | VCC |
| | VPW | 0V | VPW_p | VPW_p | VPW_p | VPW_p | 0V | 0V |
| | VNW | 0V/VCC | VNW_p | VNW_p | VNW_p | VNW_p | VCC | VCC |
| | VNWC | VCC | VCC | VCC | VCG_selBT | VCG_selBT | VCC | VCC |
| NON-SELECTED | VCG | 0V | VCG_unsel | VCG_unsel | VCG_unsel | VCG_unsel | 0V | 0V |
| | VGP | 0V/VCC | VGP_unsel | VGP_unsel | VGP_unsel | VGP_unsel | 0V | 0V |
| | VGN | 0V | VGN_unsel | VGN_unsel | VGN_unsel | VGN_unsel | VCC | VCC |
| | VDN_T | 0V/VCC | VDN_unsel | VDN_unsel | VDN_unsel | VDN_unsel | 0V | 0V |
| | VDP_T | 0V/VCC | VDP_unsel | VDP_unsel | VDP_unsel | VDP_unsel | 0V | VCC |
| | VDN_B | 0V | VDN_unsel | VDN_unsel | VDN_unsel | VDN_unsel | VCC | 0V |
| | VDP_B | 0V/VCC | VDP_unsel | VDP_unsel | VDP_unsel | VDP_unsel | 0V | VCC |

Where data "0" and data "1" are programmed in separate steps in order to improve BTBT-HE injection efficiency and FN-tunneling efficiency by VCG voltage.

<Inequations which express the relationships of each potential>

$VGN\_sel \geqq VDN\_sel > VDP\_sel \geqq VGP\_sel$ $VDN\_sel > VDN\_unsel \geqq VGN\_unsel$ $VGP\_unsel \geqq VDP\_unsel > VDP\_sel$ $VNW\_p \geqq VPW\_p, VNW\_p \geqq 0V$ $VCC > senseT > 0V, VCC > senseB > 0V$ $VCG\_selBT \geqq VCG\_unsel \geqq VCG\_selFN$

| | | STBY | PROGRAM 2step method | | | | READ1 | READ2 |
|---|---|---|---|---|---|---|---|---|
| | | | Step1(FN) | | Step2(BTBT-HE) | | | |
| | | | Data "1" | Data "0" | Data "1" | Data "0" | | |
| SELECTED | VCG | – | -2V | -2V | VCC | VCC | 0V | 0V |
| | VGP | – | 0V | 0V | -7V | -7V | 0V | 0V |
| | VGN | – | 7V | 7V | 0V | 0V | VCC | 0V |
| | VDN_T | – | 7V | 0V | 0V | 0V | 1V | 0V |
| | VDP_T | – | 0V | 7V | 0V | -7V | 0V | 1V |
| | VDN_B | – | 0V | 7V | 0V | 0V | 1V | 0V |
| | VDP_B | – | 0V | 0V | 0V | 0V | 0V | 0V |
| COMMON | VSN | 0V | HiZ | HiZ | 0V | HiZ | 0V | 0V |
| | VSP | 0V/VCC | 0V | 0V | 0V | 0V | 0V | VCC |
| | VPW | 0V | 0V | 0V | 0V | 0V | 0V | 0V |
| | VNW | 0V/VCC | 0V | 0V | 0V | 0V | VCC | VCC |
| | VCC | 0V/VCC | VCC | VCC | VCC | VCC | VCC | VCC |
| NON-SELECTED | VCG | 0V | 0V | 0V | 0V | 0V | 0V | 0V |
| | VGP | 0V/VCC | 0V | 0V | 0V | 0V | VCC | VCC |
| | VGN | 0V | 0V | 0V | 0V | 0V | 0V | 0V |
| | VDN_T | 0V | 0V | 0V | 0V | 0V | 0V | 0V |
| | VDP_T | 0V/VCC | 0V | 0V | 0V | 0V | VCC | VCC |
| | VDN_B | 0V | 0V | 0V | 0V | 0V | 0V | 0V |
| | VDP_B | 0V/VCC | 0V | 0V | 0V | 0V | 0V | VCC |

(*) READ1 : 0V
READ2 : VCC

VCC=1.8V

Fig. 54

| Operation | Program "0" (CHE-injection) | Program "1" (CHE-injection) | Erase (AHH-injection) | Restore (Latch Sense) |
|---|---|---|---|---|
| VPM | VPP_P | VPP_P | VCC | VCC |
| VPST/VPSB | VPP_P/VPP_P | VPP_P/VPP_P | GND/GND | VCC/VCC |
| PRE | VPP_P | VPP_P | VCC | — |
| SL | VPP_P | VPP_P | VPP_E | — |
| WL | VCC | VCC | VCC | GND |
| BLT/BLB | GND/VCC | VCC/GND | GND/GND | GND/GND |

<One example of a voltage>
VPP_P=6V, VPP_E=9V

Fig. 59

9V output at the time of selection 0V output at the time of non-selection

Total number of stages: odd number (3 or more stages)
All stages: CVSL

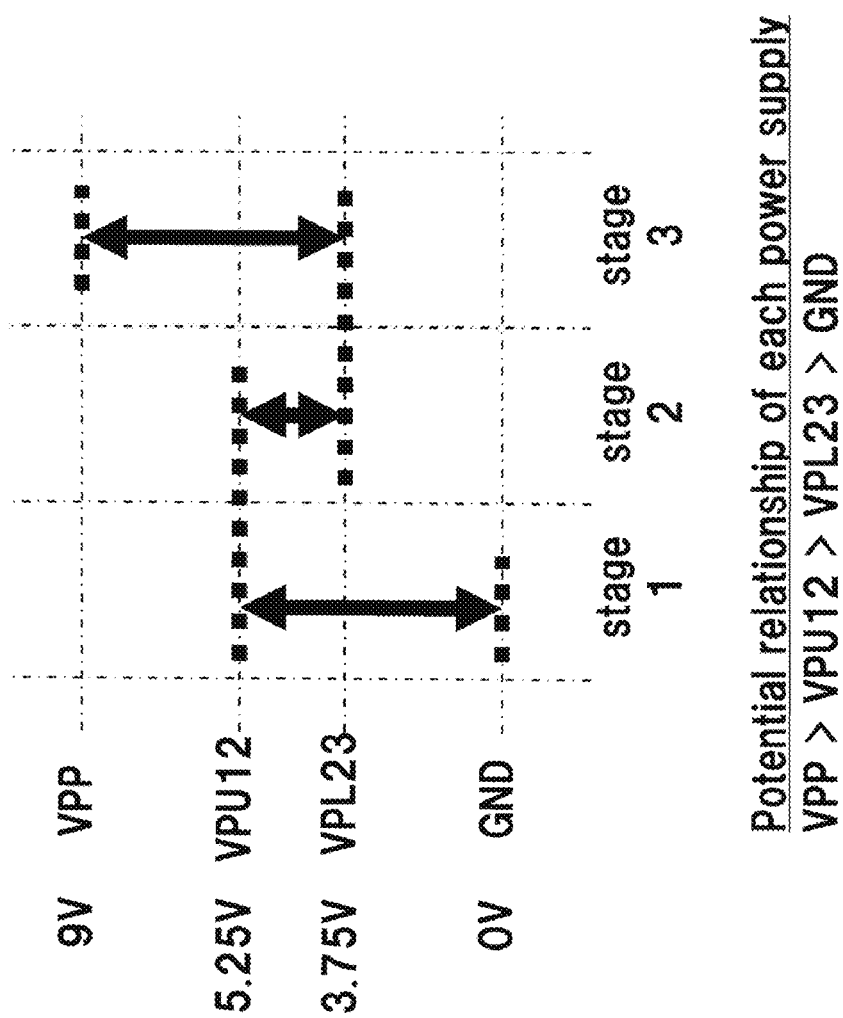

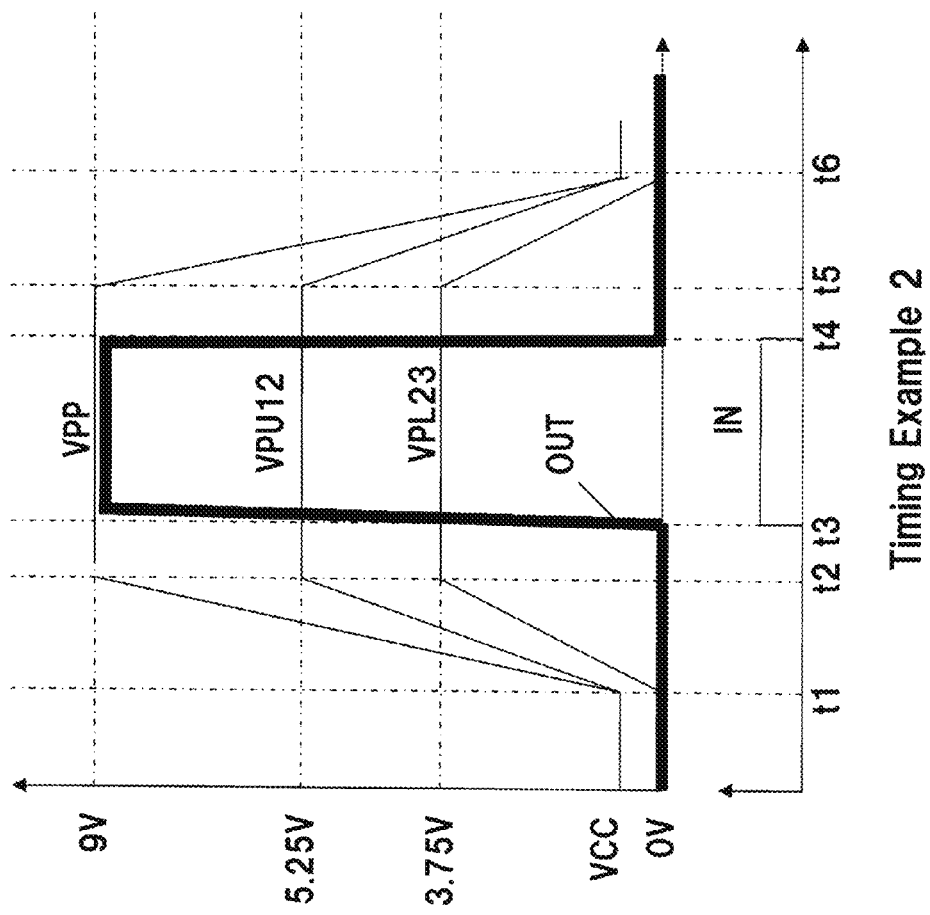
Fig. 69B Timing Example 2

Total number of stages: both odd and even number is possible, however 3 stages or more
All stages: CVSL

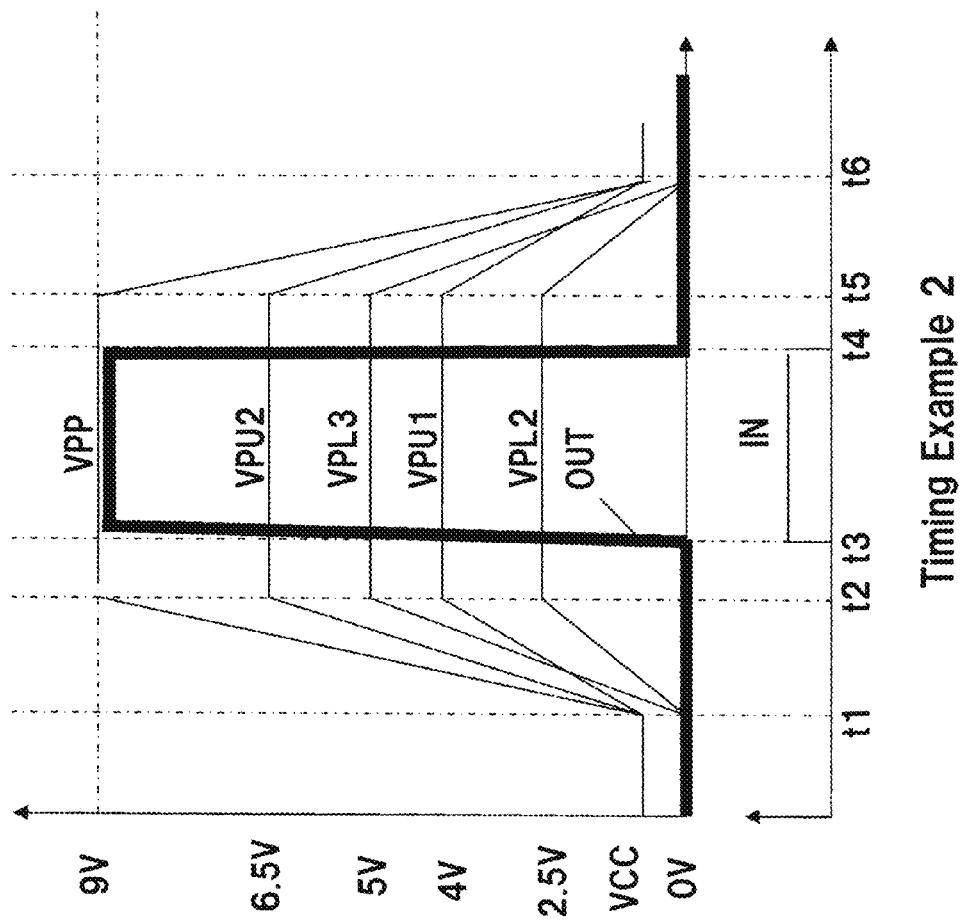
Fig. 72B Timing Example 2

Total number of stages: both odd and even number is possible, however 2 stages or more
All stages: Latch type CVSL Dependency of number of stages N of Vds_max Dependency of number of stages N of Vg_max

NONVOLATILE SEMICONDUCTOR MEMORY DEVICE AND USAGE METHOD THEREOF

CROSS REFERENCE TO RELATED APPLICATION

This application is based upon and claims the benefit of priority from the prior Japanese Patent Application No. 2008-084244, filed on Mar. 27, 2008 and the prior Japanese Patent Application No. 2008-085873, filed on Mar. 28, 2008, the entire contents of which are incorporated herein by reference.

FIELD OF THE INVENTION

The present invention relates to an electrically reprogrammable nonvolatile semiconductor memory element and an electrically reprogrammable nonvolatile semiconductor memory device which uses the electrically reprogrammable nonvolatile semiconductor memory element.

BACKGROUND OF THE INVENTION

Accompanied with the necessity of redundancy which accompanies an increase in capacity of an internal SRAM, the necessity of separately tuning an LCD driver etc after it has been mounted on a board and the expansion in various usages of individual identification information (ID code, keys for encryption decoding and IC card numbers etc) there is an increased necessity for low cost fuses. Conventionally, as a fuse memory which can be formed by a standard CMOS process, there were memories which include polysilicon or wire metal layers which are melted a laser or a current and there were also memories which include insulation gate layers which are damaged by a voltage.

However, a fuse memory which includes parts which melt or insulation parts which break in this way are not suitable for the purposes required by reprogramming stated above because such fuse memories can only be programmed once. However, while floating gate type nonvolatile memory elements can create fuses which can be electrically erased and programmed, because additional processes are required to be introduced to a standard CMOS process similar to a conventional flash memory for forming a floating gate, they are not adequate in terms of cost. Therefore, a variety of proposals have been made for realizing a floating gate type nonvolatile semiconductor element by a standard CMOS process (one layer polysilicon).

SUMMARY OF THE INVENTION

In the present invention, a non-volatile semiconductor memory element which solves the above stated problems without leading to a noticeable increase in cell size and also solves the problem of disturb is proposed.

In order to solve the above stated problems, the present invention proposes a nonvolatile semiconductor memory device comprising: a first PMOS transistor and a second PMOS transistor having a gate, the first and the second PMOS transistors being connected in series; and a first NMOS transistor and a second NMOS transistor having a gate, the first and the second NMOS transistors being connected in series; wherein the gate of the second PMOS transistor and the gate of the second NMOS transistor are commonly connected and floated.

The non-volatile semiconductor memory device of the present invention may also further comprise a first n type well formed in a substrate, the first and the second PMOS transistors being formed in the first n type well; and a second p type well formed in the substrate, the first and the second NMOS transistors being formed in the second p type well.

The non-volatile semiconductor memory device of the present invention may also further comprise a third well to enclose the first n type well and the second p type well.

The non-volatile semiconductor memory device of the present invention may also further comprise a capacitor commonly connected to the gates of the second PMOS and the second NMOS.

The nonvolatile semiconductor memory device of the present invention wherein the first and the second PMOS transistors and the first and the second NMOS transistors may be configured to a first cell unit; the nonvolatile semiconductor memory device may also further comprise a third PMOS transistor and a fourth PMOS transistor having a gate, the third and the fourth PMOS transistors being connected in series; and a third NMOS transistor and a fourth NMOS transistor having a gate, the third and the fourth NMOS transistors being connected in series; wherein the gate of the fourth PMOS transistor and the gate of the fourth NMOS transistor are commonly connected and floated, and the third and the fourth PMOS transistors and the third and the fourth NMOS transistors are configured to a second cell unit; and wherein the first cell unit and the second cell unit store a pair of complementary data.

According to the present invention, the nonvolatile semiconductor memory device is proposed wherein the first PMOS transistor has a gate, the third PMOS transistor has a gate, and the gates of the first PMOS transistor and the third PMOS transistor are commonly connected to a first row line; and wherein the first NMOS transistor has a gate, the third NMOS transistor has a gate, and the gates of the first NMOS transistor and the third NMOS transistor are commonly connected to a second row line.

The non-volatile semiconductor memory device of the present invention may also further comprise a sense amplifier to detect a current flowing through the first and the second PMOS transistor or through the first and the second NMOS transistor.

The non-volatile semiconductor memory device of the present invention may also further comprise a sense amplifier to compare a first current flowing through the first and the second PMOS transistor or through the first and the second NMOS transistor and a second current flowing through the third and the fourth PMOS transistor or through the third and the fourth NMOS transistor.

The non-volatile semiconductor memory device of the present invention may also further comprise a programming circuit for applying a first voltage to a terminal of the first PMOS transistor, for turning the first PMOS transistor on, and applying a second voltage higher than the first voltage to a substrate node of the second PMOS transistor in order to inject electrons into the gate of the second PMOS transistor.

According to the present invention, the nonvolatile semiconductor memory device is proposed wherein the first voltage is a negative voltage.

According to the present invention, the nonvolatile semiconductor memory device is proposed wherein the second voltage is a positive voltage.

The non-volatile semiconductor memory device of the present invention may also further comprise an erasing circuit for applying a third voltage to a terminal of the first NMOS transistor in order to extract electrons from the gate of the second NMOS transistor.

The non-volatile semiconductor memory device of the present invention may also further comprise a programming circuit for applying a first voltage to a terminal of the first PMOS transistor, for turning the first PMOS transistor on, and applying a second voltage higher than the first voltage to a substrate node of the second PMOS transistor in order to inject electrons into the gate of the second PMOS transistor; and an erasing circuit for applying a third voltage to a terminal of the third NMOS transistor in order to extract electrons from the gate of the third NMOS transistor.

The non-volatile semiconductor memory device of the present invention may also further comprise a programming circuit for applying a first voltage to a terminal of the first PMOS transistor, for turning the first PMOS transistor on, applying a fourth voltage higher than the first voltage to a node of the capacitor, and applying a second voltage higher than the first voltage to a substrate node of the second PMOS transistor in order to inject electrons into the gate of the second PMOS transistor.

The non-volatile semiconductor memory device of the present invention may also further comprise an erasing circuit for applying a fifth voltage to a node of the capacitor, and applying a third voltage higher than the fifth voltage to a terminal of the first NMOS transistor in order to extract electrons from the gate of the second NMOS transistor.

The non-volatile semiconductor memory device of the present invention may also further comprise a programming circuit for applying a first voltage to a terminal of the first PMOS transistor, for turning the first PMOS transistor on, applying a fourth voltage higher than the first voltage to a node of the capacitor, and applying a second voltage higher than the first voltage to a substrate node of the second PMOS transistor in order to inject electrons into the gate of the second PMOS transistor; and an erasing circuit for applying a fifth voltage to a node of the capacitor, and applying a third voltage to a terminal of the third NMOS transistor in order to extract electrons from the gate of the third NMOS transistor.

The non-volatile semiconductor memory device of the present invention may also further comprise a first capacitor commonly connected to the gates of the second PMOS and the second NMOS, wherein the first and the second PMOS transistors, the first and the second NMOS transistors, and the first capacitor are configured to a first cell unit; and a third PMOS transistor and a fourth PMOS transistor having a gate, the third and the fourth PMOS transistors being connected in series; a third NMOS transistor and a fourth NMOS transistor having a gate, the third and the fourth NMOS transistors being connected in series; and a second capacitor commonly connected to the gates of the fourth PMOS and the fourth NMOS; wherein the gate of the fourth PMOS transistor and the gate of the fourth NMOS transistor are commonly connected and floated, and the third and the fourth PMOS transistors, the third and the fourth NMOS transistors and the second capacitor are configured to a second cell unit; and wherein the first cell unit and the second cell unit store a pair of complementary data.

According to the present invention, the nonvolatile semiconductor memory device is proposed wherein the first PMOS transistor has a gate, the third PMOS transistor has a gate, and the gates of the first PMOS transistor and the third PMOS transistor are commonly connected to a first row line; wherein the first NMOS transistor has a gate, the third NMOS transistor has a gate, and the gates of the first NMOS transistor and the third NMOS transistor are commonly connected to a second row line; and wherein the first capacitor and the second capacitor are commonly connected to a third row line.

According to the present invention, the nonvolatile semiconductor memory device is proposed wherein source and drain nodes of the first and the second PMOS transistors and the first and the second NMOS transistors are asymmetrically formed.

According to the present invention, the nonvolatile semiconductor memory device is proposed wherein the gate of the second PMOS transistor is made of p type polysilicon and the gate of the second NMOS transistor is made of n type polysilicon.

BRIEF DESCRIPTION OF THE DRAWINGS

FIG. 8 is a layout view which shows a distribution of a gate silicon layer of a memory cell.

FIG. 9B is a chart which shows a contrast in a current sense.

FIG. 12A is a chart which shows each potential applied to each terminal in each operation mode of the nonvolatile semiconductor memory device of embodiment one.

FIG. 12B is in equations which express the relationships between each potential in FIG. 12A.

FIG. 13 is a specific example of each potential applied to each terminal in each operation mode of the nonvolatile semiconductor memory device of embodiment one.

FIG. 24B is a chart which shows a contrast in a current sense.

FIG. 28A is a chart which shows each potential which is applied to each terminal in each operation mode of the nonvolatile semiconductor memory device of embodiment two.

FIG. 28B is in equations which express the relationships of each potential in FIG. 28A.

FIG. 29 is a specific example of each potential which is applied to each terminal in each operation mode of the nonvolatile semiconductor memory device of embodiment two.

FIG. 46A is a chart which shows each potential applied to each terminal in each operation mode of the nonvolatile semiconductor memory device of embodiment three.

FIG. 46B is in equations which express the relationships of each potential in FIG. 46A.

FIG. 47 is a specific example of each potential applied to each terminal in each operation mode of the nonvolatile semiconductor memory device of embodiment three.

FIG. 53A is a chart which shows each potential applied to each terminal in each operation mode of the nonvolatile semiconductor memory device of embodiment four.

FIG. 53B is in equations which express the relationships of each potential in FIG. 53A.

FIG. 54 is a specific example of each potential applied to each terminal in each operation mode of the nonvolatile semiconductor memory device of embodiment four.

FIG. 59 is chart which shows the operation conditions of a memory cell.

FIG. 68 is an example of the application of a voltage in the level converter circuit related to embodiments five to seven of the present invention.

FIG. 69B is a voltage application timing example in the level inverter circuit related to embodiments five to seven of the present invention.

FIG. 72B is a voltage application timing example in the level inverter circuit related to embodiment eight of the present invention.

DETAILED DESCRIPTION OF THE INVENTION

The embodiments of the present invention will be explained below while referring to the diagrams. Furthermore, in the embodiments the same structural elements have the same symbols and to avoid repetition between embodiments explanations are omitted.

Embodiment One

Embodiment one of the present invention will be explained while referring to FIG. 1 to FIG. 21.

Figure 1:
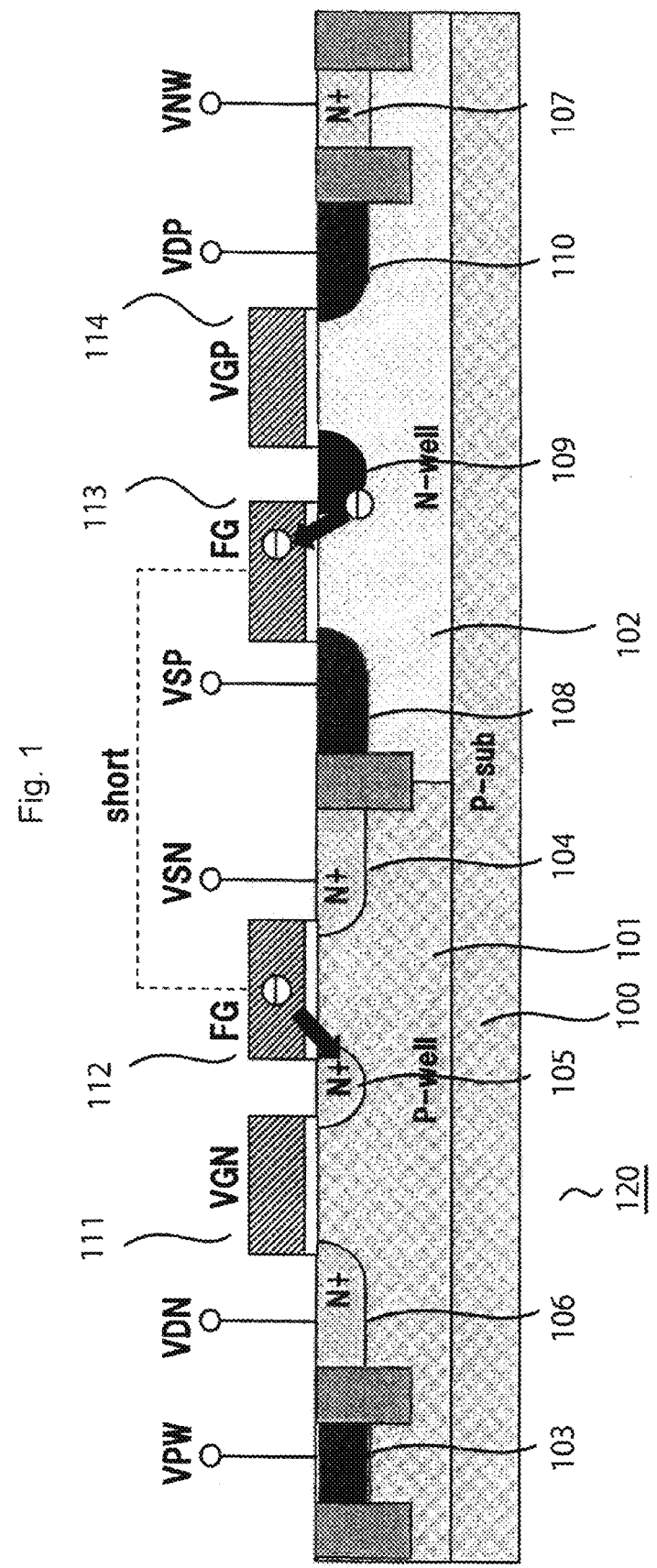
FIG. 1 is a cross sectional diagram of a memory cell of embodiment one.

As is shown in FIG. 1, a memory cell 120 of the nonvolatile semiconductor memory device related to embodiment one of the present invention is formed from a semiconductor substrate 100, a p type well (P-well) 101 which is formed on the semiconductor substrate 100 and is connected to VPW via a P+ diffusion layer 103, and an n type well (N-well) 102 which is formed on the semiconductor substrate 100 and connected to VNW via an N+ diffusion layer 107.

An NMOS transistor 111 and an NMOS transistor 112 are formed on the well 101 and connected in series between VDN and VSN. An N+ diffusion layer 106 is connected to VDN and the NMOS transistor 111 is formed between the N+ diffusion layer 106 and an N+ diffusion layer 105. An N+ diffusion layer 104 is connected to VSN and the NMOS transistor 112 is formed between the N+ diffusion layer 104 and the N+ diffusion layer 105.

A PMOS transistor 113 and a PMOS transistor 114 are formed on the well 102 and connected in series between VDP and VSP. A P+ diffusion layer 110 is connected to VDP and the PMOS transistor 114 is formed between the P+ diffusion layer 110 and a P+ diffusion layer 109. A P+ diffusion layer 108 is connected to VSP and the PMOS transistor 113 is formed between the P+ diffusion layer 108 and the P+ diffusion layer 109.

A gate of the NMOS transistor 111 is connected to VGN, a gate of the PMOS transistor 114 is connected to VGP, the gates of the NMOS transistor 112 and the PMOS transistor 113 are commonly connected (short), and function as a floating gate FG which is in a floating state. Data is stored according to the accumulation state of electrons in this floating gate FG.

Injection of electrons to the floating gate FG is performed by a BTBT-HE process from the diffusion layer 109 which is the drain of the PMOS transistor 113. Extraction of electrons from the floating gate FG to the diffusion layer 105 which is the drain of the NMOS transistor 112 is performed using an FN tunneling current. The potential of VPW is the same as the P-sub potential (GND).

Each diffusion layer of the BTBT-HE injection region (P+ diffusion layer 109) and the FN tunneling region (N+ diffusion layer 105) may have the same structure as the other diffusion layer regions (P+ diffusion layer 108 and N+ diffusion layer 104). The effects in this case are that manufacture is easy.

It is preferred that each diffusion layer of the BTBT-HE injection region (P+ diffusion layer 109) and the FN tunneling region (N+ diffusion layer 105) have a different structure from the other diffusion layer regions (P+ diffusion layer 108 and N+ diffusion layer 104). In this case, this is because optimization for increasing the concentration of impurities, for example, becomes possible in order to improve BTBT-HE injection efficiency and FN tunneling efficiency.

Next, a transformation example of embodiment one of the present invention will be explained while referring to FIG. 2.

Figure 2:
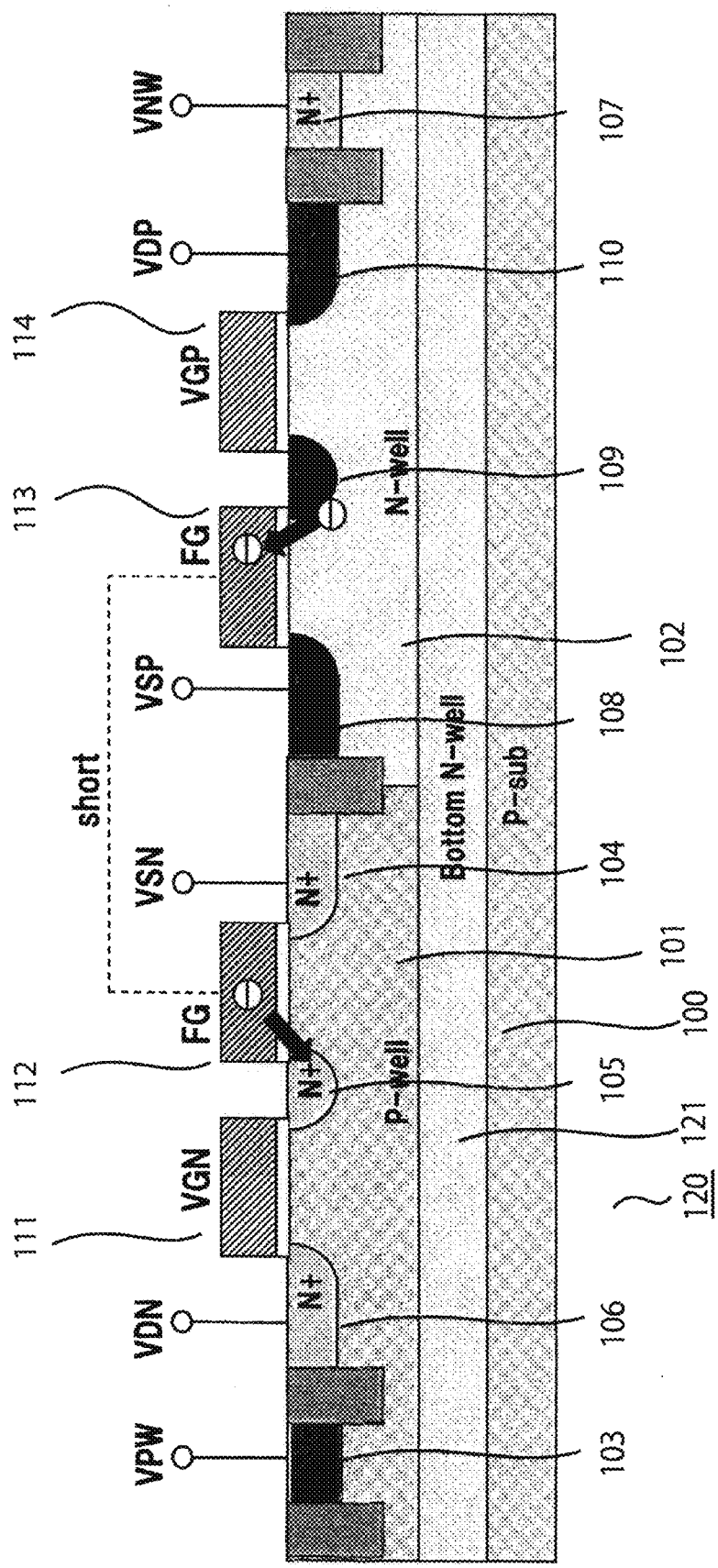
FIG. 2 is a cross sectional diagram of the memory cell related to a transformation example of embodiment one.

As is shown in FIG. 2, the memory cell 120 of the nonvolatile semiconductor memory device related to the transformation example of embodiment one of the present invention if formed from the semiconductor substrate 100, an n type well 121 (Bottom N-well) formed on the semiconductor substrate 100, the p type well 101 (P-well) formed on the well 121 and connected to VPW via the P+ diffusion layer 103, and the n type well 102 (N-well) formed on the well 121 and connected to VNW via the N+ diffusion layer 107. That is, the memory cell 120 of embodiment two is formed within a triple well.

Figure 3:
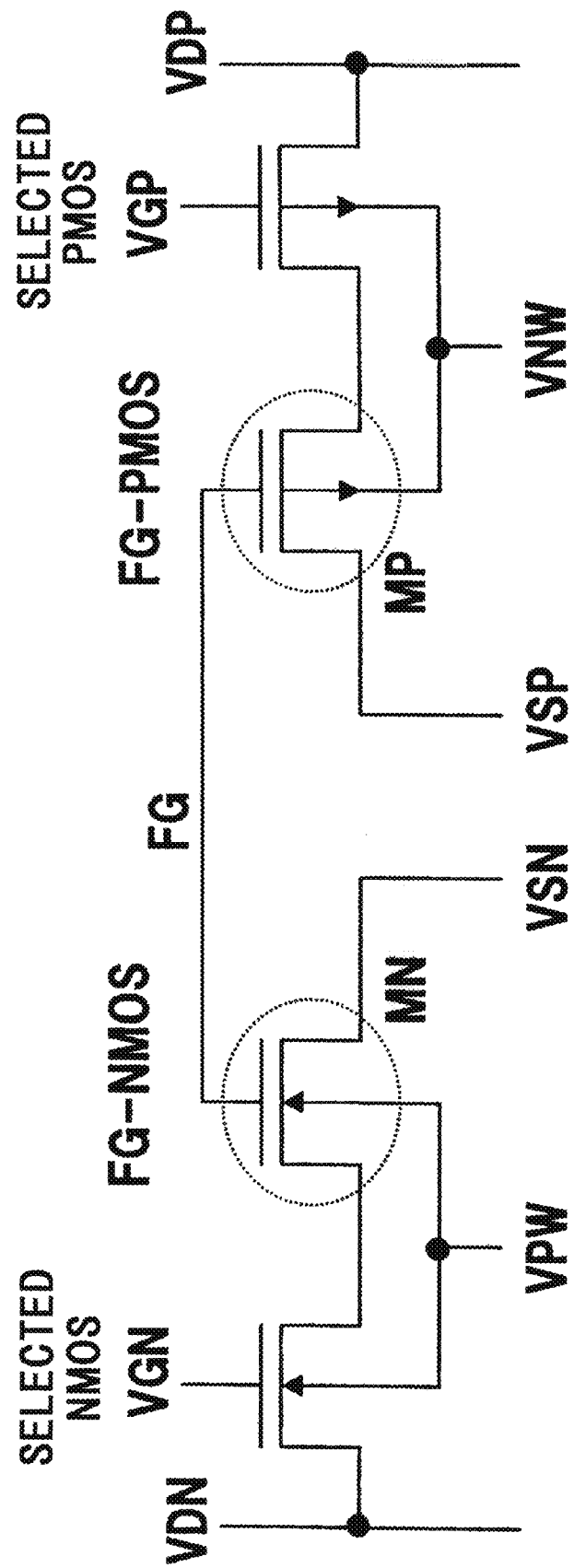
FIG. 3 is an equivalent circuit diagram of the memory cell of embodiment one.

An equivalent circuit view of the memory cell of embodiment one is shown in FIG. 3. VDN and VDP are terminals which are connected to a sense amplifier or a programming driver, and VSN and VSP are terminals which are connected to a source line. An NMOS transistor (NMOS transistor 111 in FIG. 1 and FIG. 2) in which the gate is connected to VGN, and an FG-NMOS transistor (NMOS transistor 112 in FIG. 1 and FIG. 2) are connected in series between VDN and VSN. A select NMOS transistor and FG-NMOS transistor are connected to a common well and its terminal is VPW. A select PMOS transistor (PMOS transistor 114 in FIG. 1 and FIG. 2) in which the gate is connected to VGP and an FG-PMOS transistor (PMOS transistor 113 in FIG. 1 and FIG. 2) are connected in series between VDP and VSP. The select PMOS transistor and FG-PMOS transistor are connected to a common well and its terminal is VNW. In other words, this memory cell has eight terminals, VGN, VGP, VDN, VDP, VSN, VSP, VPW and VNW.

Figure 4:
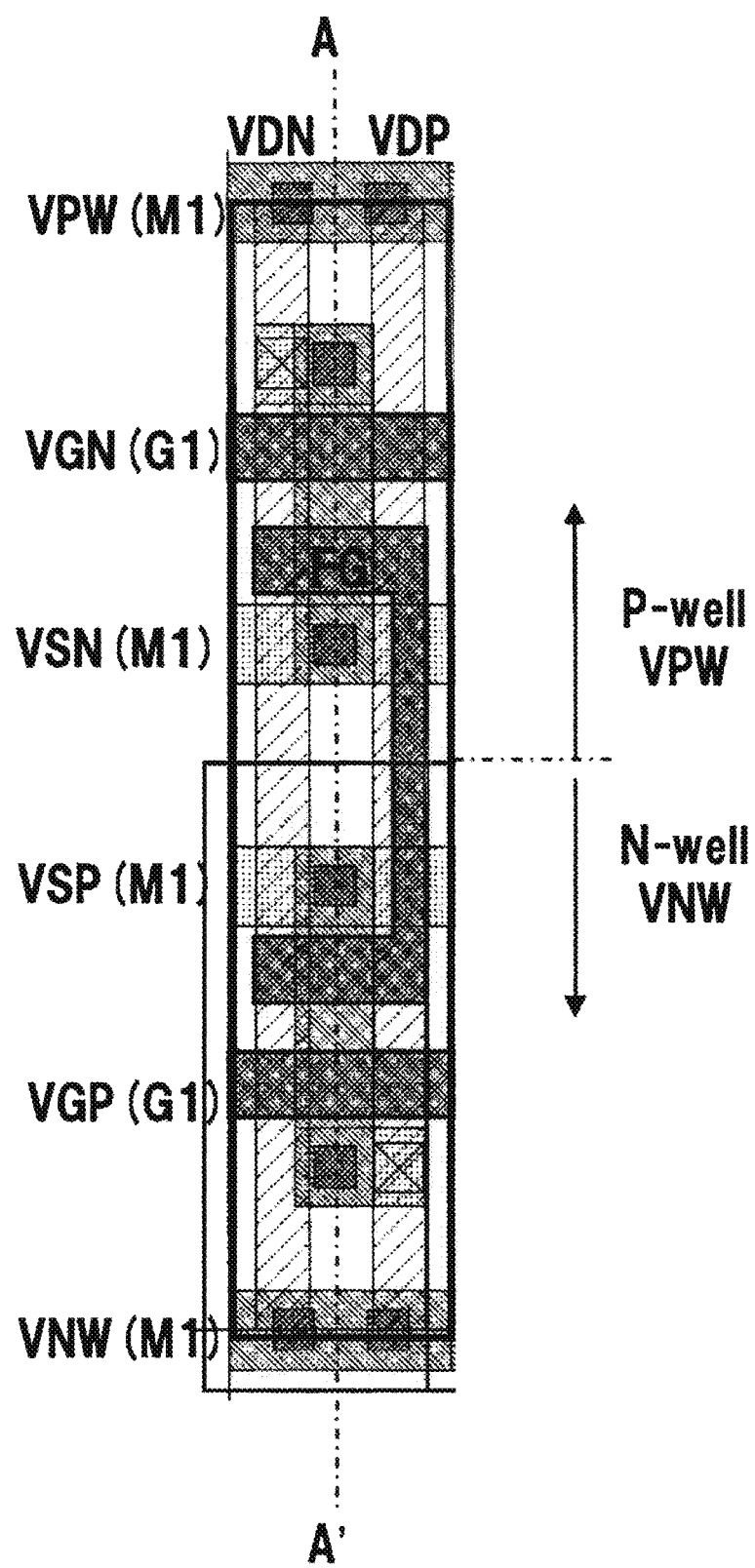
FIG. 4 is a layout view of the memory cell of embodiment one.

A layout view of the memory cell of embodiment one is shown in FIG. 4. VGN, VGP and FG are all formed on the first polysilicon layer (G1), and VPW, VSN, VSP and VNW are all formed on the first metal layer (M1). VDN and VDP which intersect VPW, VSN, VSP and VNW, are formed on the second metal layer. The layout shown in FIG. 4 is compact and as well as making high integration possible it is also possible to realize a polysilicon layer by a one layer standard CMOS process.

Among the transistor which form the nonvolatile semiconductor memory element, transistors which have a slightly thick gate oxide film among the transistors which can be realized by a standard CMOS process are used. For example, an I/O transistor (for example, gate oxide film thickness=7 nm) is used.

As stated above, a BTBT-HE (Hot Electron) mode in the P+ diffusion/gate overlap region of a P type MOS transistor is used as an injection operation of electrons to a floating gate and an FN tunneling mode in the N+ diffusion/gate overlap region of a N type MOS transistor is used as an extraction operation of electrons from a floating gate. Because both the phenomenon of BTBT-HE electron injection and FN tunneling electron extraction which are used occur in an overlap region between a diffusion layer and a floating gate and not in a channel region of a MOS transistor, a large MOS type capacitor for improving a coupling ratio is no longer necessary and cell area size can be reduced.

Because the BTBT-HE injection and FN tunneling electron extraction operations are performed on each memory cell, this means that data "1" and data "0" can be programmed to each bit and it is possible to replace an EEPROM.

A characteristic of both the BTBT-HE injection and FN tunneling electron extraction is that the operation current is small and a suitable structure can be realized for systems in which low power consumption is requested.

A current value of an N type MOS transistor MN or P type MOS transistor MP in which data is decided by an FG potential is determined by a sense amplifier circuit.

Figure 5:
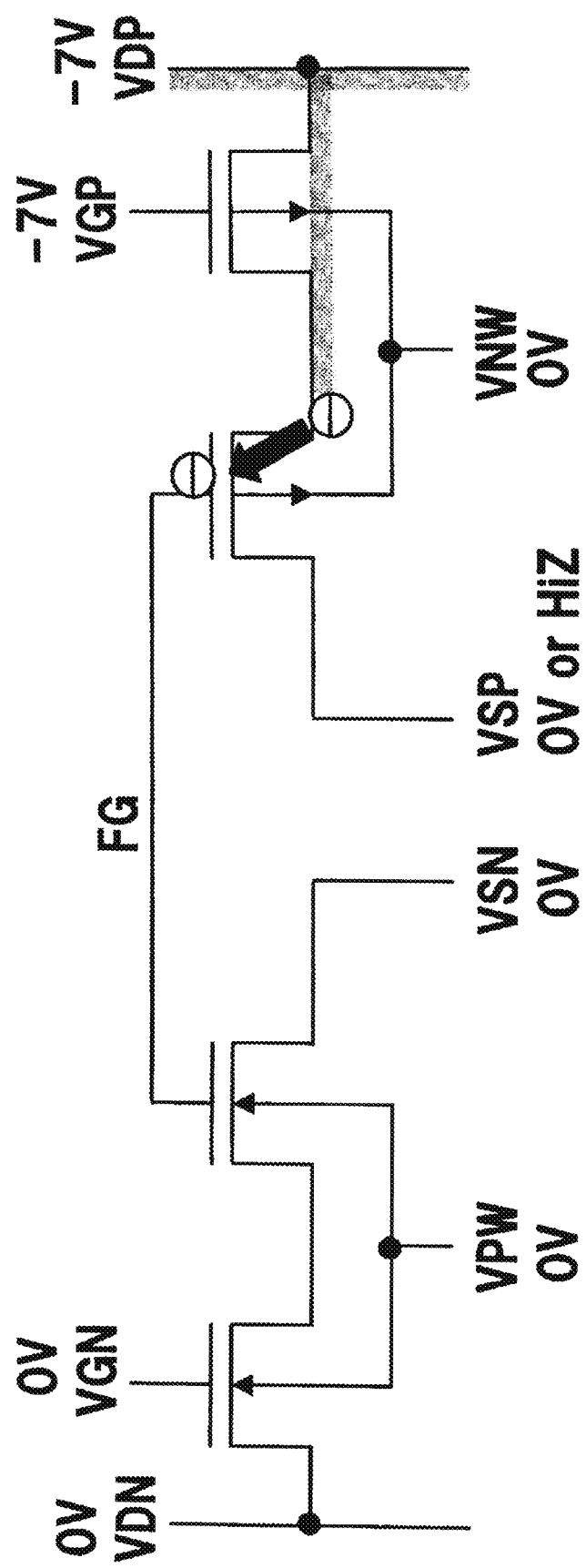
FIG. 5 is an equivalent circuit diagram of the memory cell of embodiment one.
Figure 6:
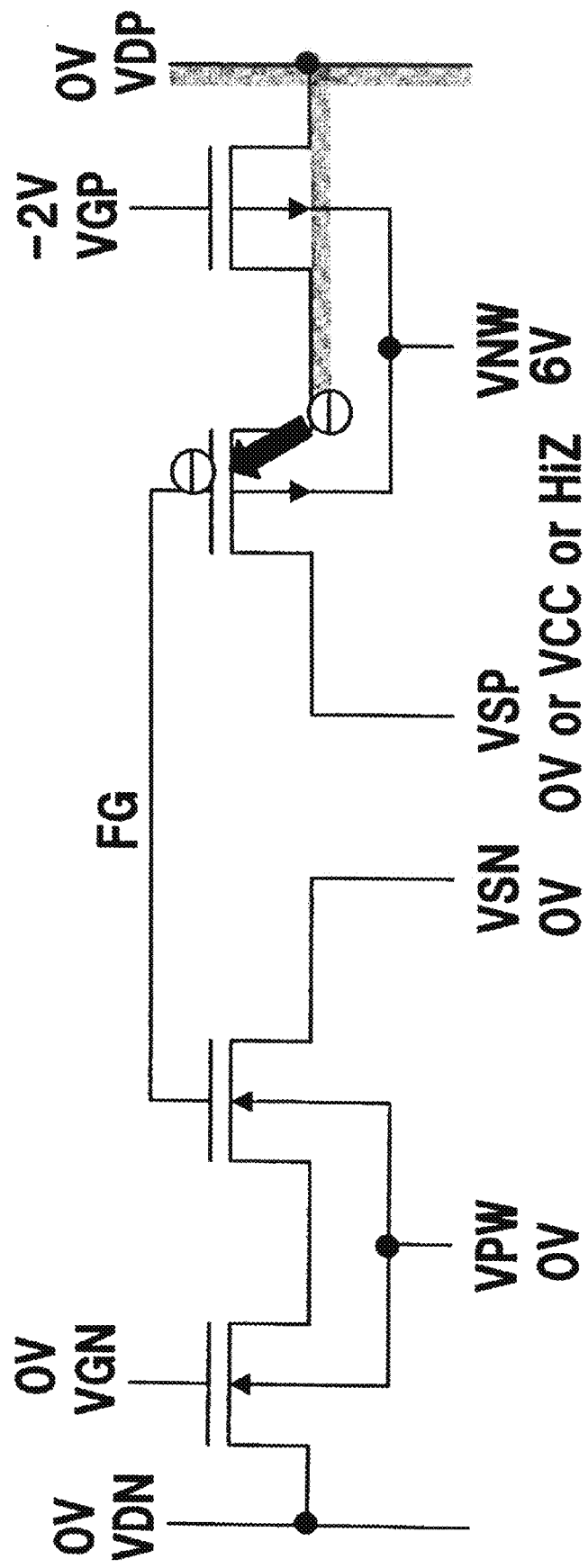
FIG. 6 is one example of a programming method of data to the memory cell of embodiment one.
Figure 7:
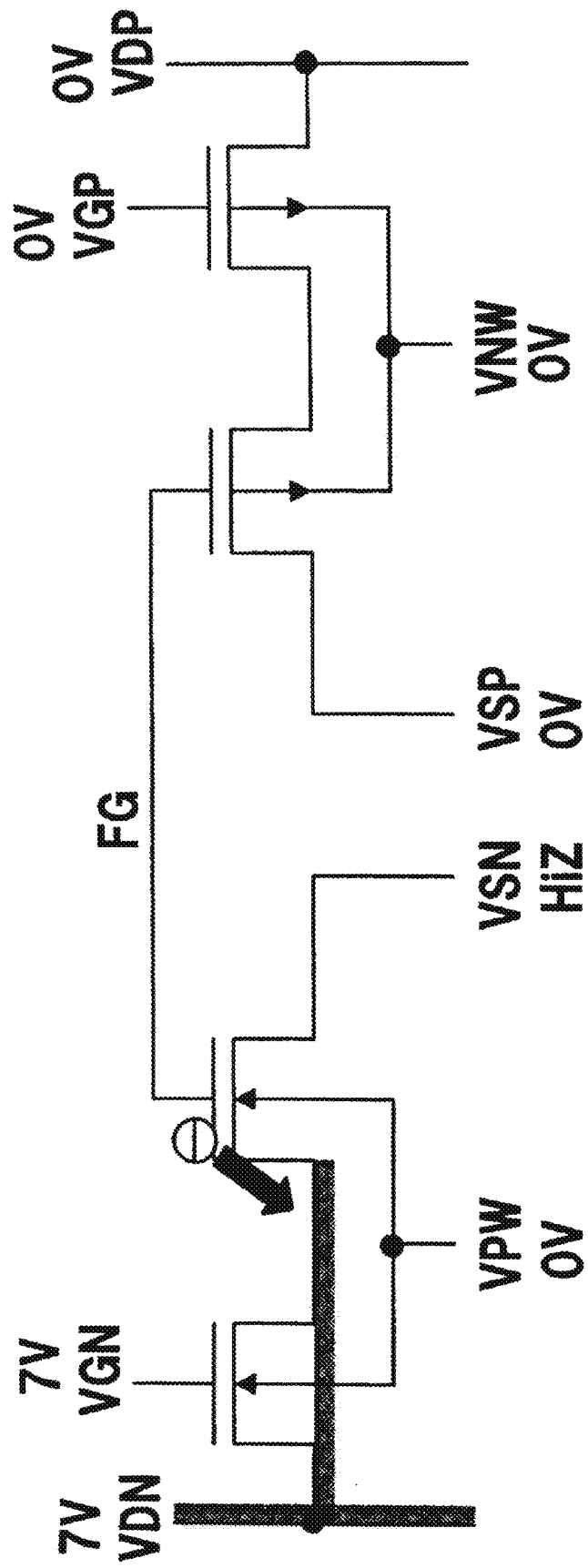
FIG. 7 is one example of a programming method of data to the memory cell of embodiment one.

A method of programming data to a memory cell of embodiment one is shown in FIG. 5 to FIG. 7.

FIG. 5 is an example of the voltages applied when a BTBT-HE injection operation is used. VDN, VGN, VPW and VSN are all 0V, VDP and VGP are both a negative voltages such as −7V for example, VNW is 0V and VSP is 0V or placed in a stated of high impedance. As a result, BTBT-HE (Hot Electrons) which are generated in the P+ diffusion/gate overlap region of FG-PMOS can be injected into the floating gate FG.

FIG. 6 is an example of the voltages applied when a Back Bias assisted BTBT-HE (B4-HE) injection operation is used. VDN, VGN, VPW and VSN are all 0V, VDP is 0V, VGP is a negative voltage such as −2V, VNW is 6V, VSP is 0V, VCC or placed in a state of high impedance. As a result, BTBT-HE (Hot Electrons) which are generated in the P+ diffusion/gate overlap region of FG-PMOS can be injected into the floating gate FG.

FIG. 7 is an example of the voltages applied when electrons are extracted from FG by an FN tunneling current. VDN and VGN are both 7V, VPW is 0V, VSN is a state of high impedance, VDP, VGP and VNW are 0V and VSP is 0V. As a result, electrons can be extracted from the floating gate FG in the N+ diffusion/gate overlap region of FG-NMOS by an FN tunneling mode.

FG-NMOS and FG-PMOS are commonly connected. However, the polysilicon which forms the gate of an NMOS transistor is generally doped with n type impurities (N+ poly), and the polysilicon which forms the gate of a PMOS transistor is generally doped with p type impurities (P+ poly). An example allocation of N+ poly and P+ poly is shown in FIG. 8 (a) to (c). FIG. 8 (a) is an example in which each area of N+ poly and P+ poly is made almost equal wherein the border of N+ poly and P+ poly comes to the border of the P well and N well. FIG. 8 (b) is an example in which the area of P+ poly is larger than N+ poly wherein the P+ poly part protrudes above the P well. FIG. 8 (c) is an example in which the area of N+ poly is larger than P+ poly wherein the N+ poly part protrudes above the N well. Because the retention characteristics of the memory cell are affected by the material of FG, in order to optimize a balance between the characteristics of FG-NMOS and FG-PMOS and improve retention characteristics it is preferable to divide each structure in FIG. 8 (a) to (c).

Figure 9A:
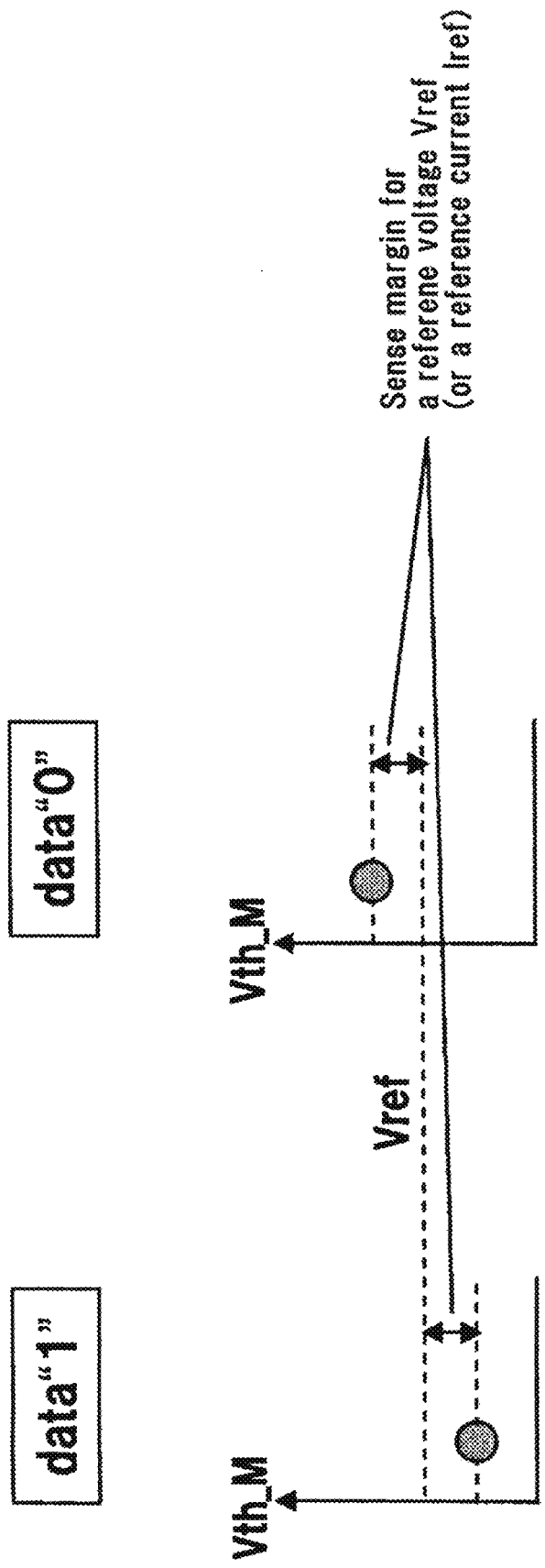
FIG. 9A is a diagram which shows a definition of data.

A definition of data of a memory cell in embodiment one is shown in FIG. 9A. When the threshold voltage Vth_M of FG-NMOS on the vertical axis is lower than a reference voltage Vref (or a reference current Iref), data is defined as "1" and when higher data is defined as "0".

A contrast with the voltage display in FIG. 9A when a sense operation is performed by a current value is shown in FIG. 9B.

Figure 10:
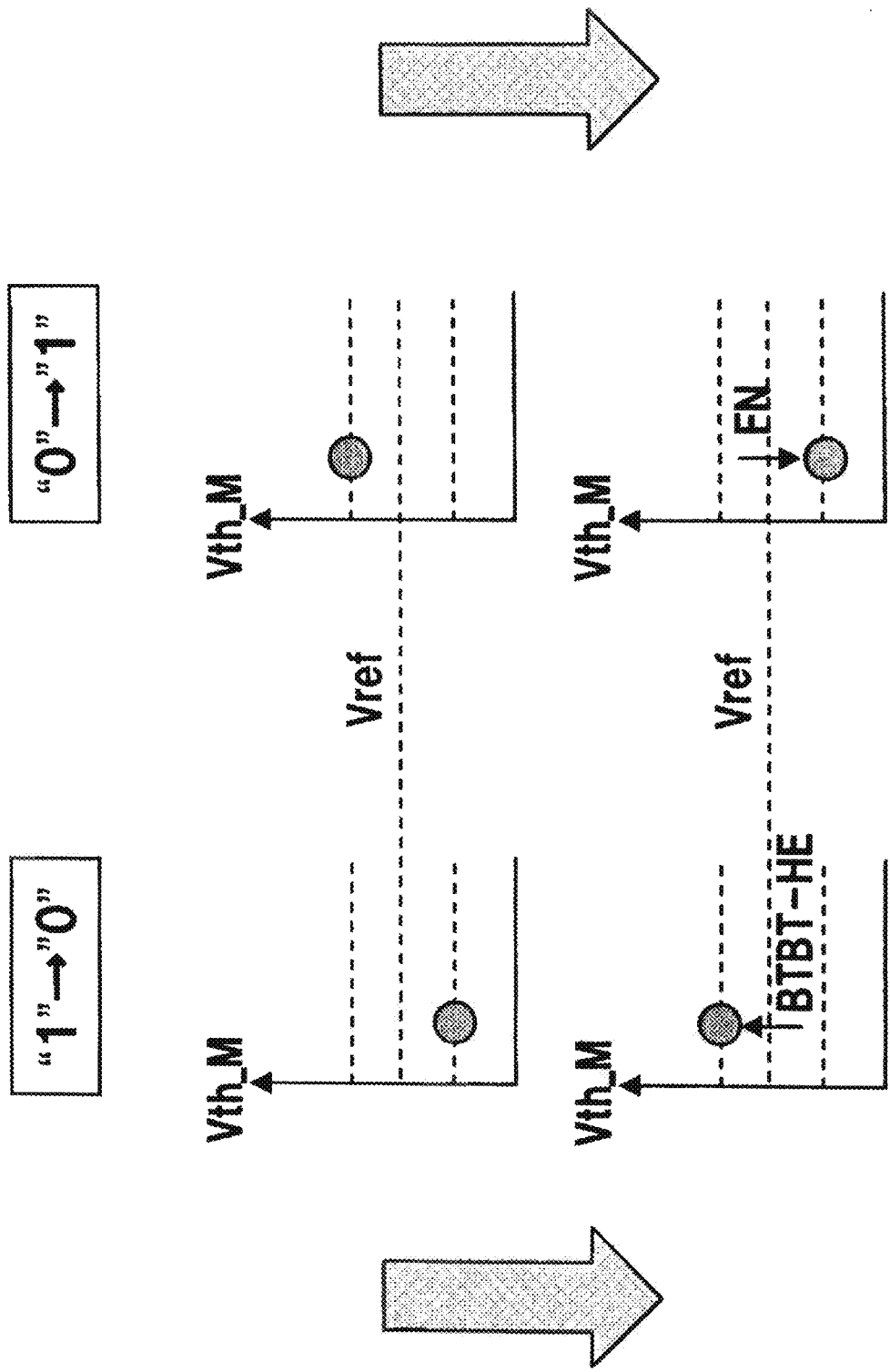
FIG. 10 is a diagram which shows a data reprogramming operation (programming operation).

FIG. 10 shows a data reprogram (program operation) operation. Reprogramming from data "1" to data "0" is performed by increasing the threshold voltage of FG-NMOS using BTBT-HE, and reprogramming from data "0" to data "1" is performed by decreasing the threshold voltage of FG-NMOS using FN tunneling. A stated above, data "0" is programmed by injecting electrons into a floating gate by a BTBT-HE mode which are generated in the P+ diffusion/gate overlap region of FG-PMOS, and data "1" is programmed by extracting electrons from the floating gate by an FN tunneling mode in the N+ diffusion/overlap region of FG-NMOS. In this way, an erase operation such as that in a flash memory is no longer necessary, programming of data "0" and data "1" can be realized for each bit and it is possible to realize what is called EEPROM specifications.

Figure 11:
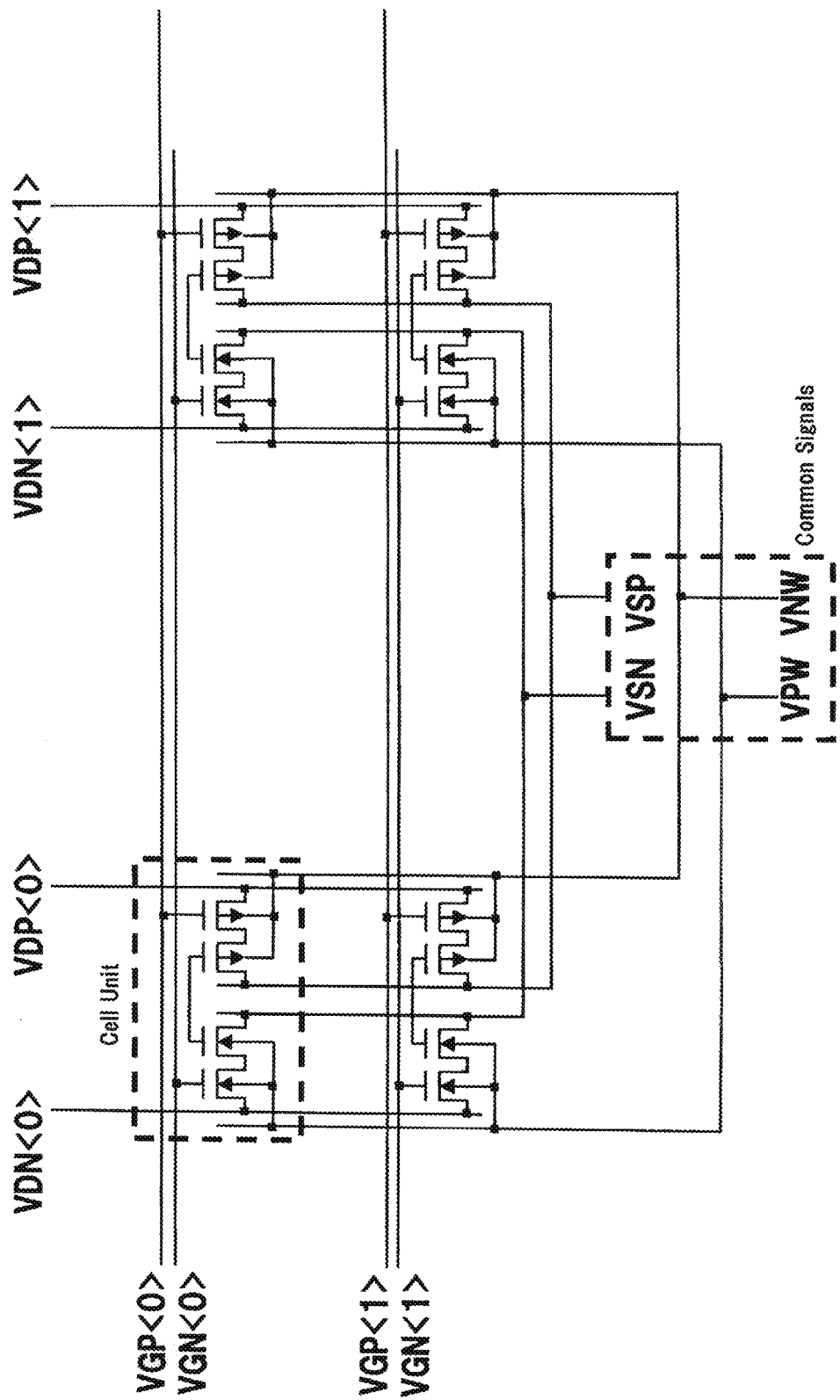
FIG. 11 is a diagram of an array structure of the memory cell of embodiment one.

An array structure of the memory cell in embodiment one is shown in FIG. 11. This memory cell array, a plurality of memory cells of embodiment one are arranged in a matrix as cell units and VGN of memory cells which belong to the same row are commonly connected respectively, VGP of memory cells which belong to the same row are commonly connected respectively, and VDN of memory cells which belong to the same column are commonly connected respectively. In addition, VDP of memory cells which belong to the same column are commonly connected respectively, VSN of memory cells which belong to a plurality of rows and columns are commonly connected respectively, VSP of memory cells which belong to a plurality of rows and columns are commonly connected respectively, VPW of memory cells which belong to a plurality of rows and columns are commonly connected respectively and VNW of memory cells which belong to a plurality of rows and columns are commonly connected and a memory cell array is formed. VSN, VSP, VPW and VNW are driven as common signals of memory cells which belong to a plurality of rows and columns.

A chart which shows each potential applied to each terminal in each operation mode of the nonvolatile semiconductor memory device of embodiment one is shown in FIG. 12A. In equations which express the relationships of each potential is shown in FIG. 12B. Here, an example where data "0" and data "1" are programmed simultaneously (a simultaneous programming mode shown in the fifth and sixth columns from the right of the chart), and an example where data "0" and data "1" are programmed in separate steps (separate step programming mode shown in the third and fourth columns from the right of the chart) are shown as a programming method. In addition, two read operation are also shown, READ (1) which senses from the NMOS side and READ (2) which senses from the PMOS side.

FIG. 13 is a specific example of each potential applied to each terminal in each operation mode of the nonvolatile semiconductor memory device of embodiment one. The power supply voltage VCC is shown as 1.8V. HiZ in the diagram shows a high impedance state.

Figure 14:
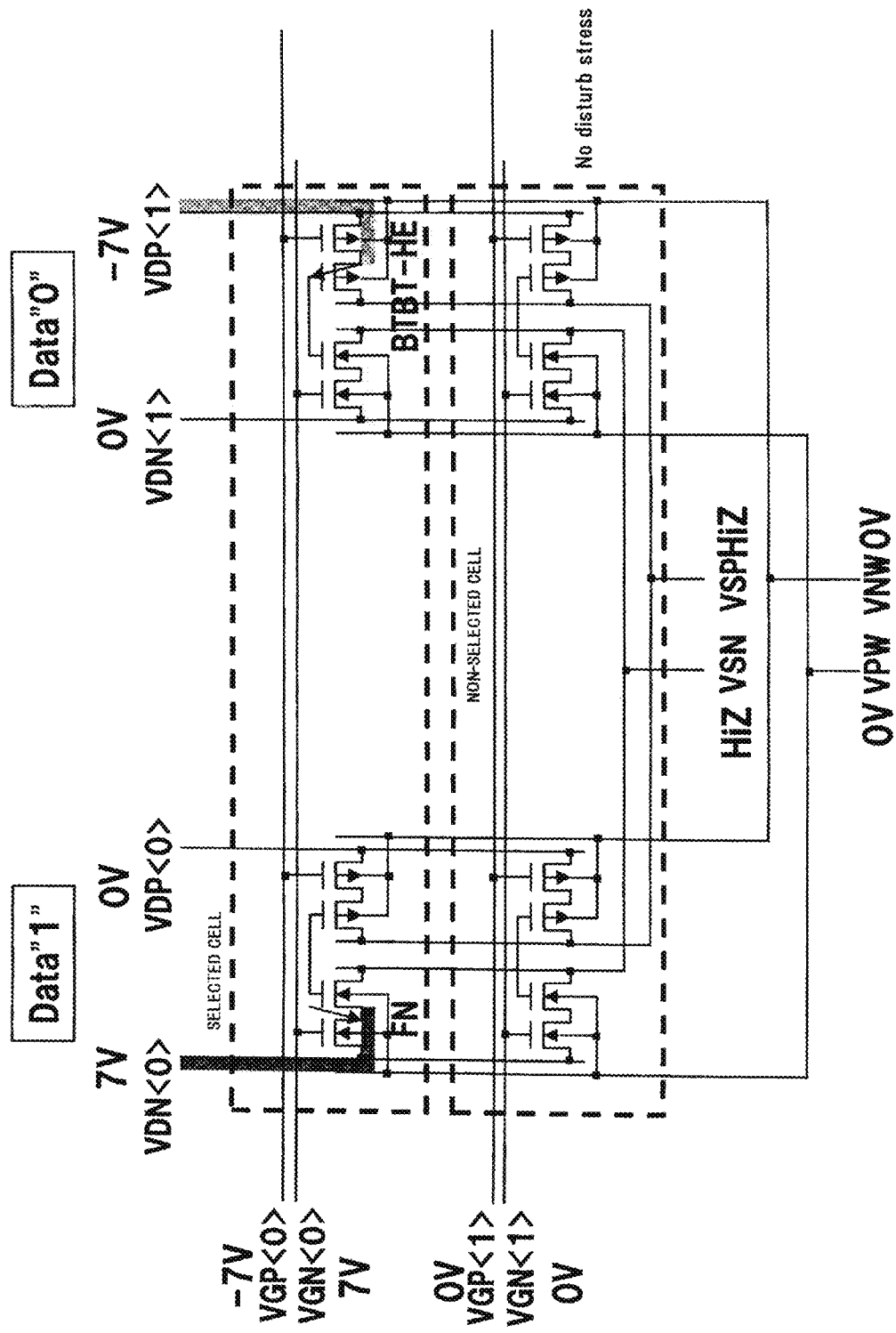
FIG. 14 is a diagram which shows an operation in the case where data "1" and data "0" are programmed simultaneously in embodiment one.

FIG. 14 shows the voltages which are applied to each terminal in a simultaneous programming mode and at this time shows a voltage which is simultaneously applied to a row other than a row of a selected memory cell among the memory cell array operations in embodiment one. 7V is applied to VGN and −7V is applied to VGP of the selected row, 0V is applied to VGN and VGP of all the other rows, and in the selected row 7V is applied to VDN and 0V is applied to VDP in the memory cells to be programmed with data "1", 0V is applied to VDN and −7V is applied to VDP in the memory cells to be programmed with data "0". VSN and VSP are commonly placed in HiZ and VPW and VNW are commonly applied with 0V. Data "1" is programmed by extracting electrons from the floating gate by FN tunneling mode in the N+ diffusion/overlap region of FG-NMOS. Data "0" is programmed by injecting electrons into the floating gate by BTBT-HE mode which are generated in the P+ diffusion/ overlap region of FG-PMOS. Here, disturb stress does not affect the selected memory cells. An erase operation such as that in a flash memory is no longer necessary, programming of data "0" and data "1" can be realized for each bit and it is possible to realize what is called EEPROM specifications. Furthermore, among the voltages which are used, two types of high positive voltage are simultaneously required and two charge pump circuits are required.

Figure 15:
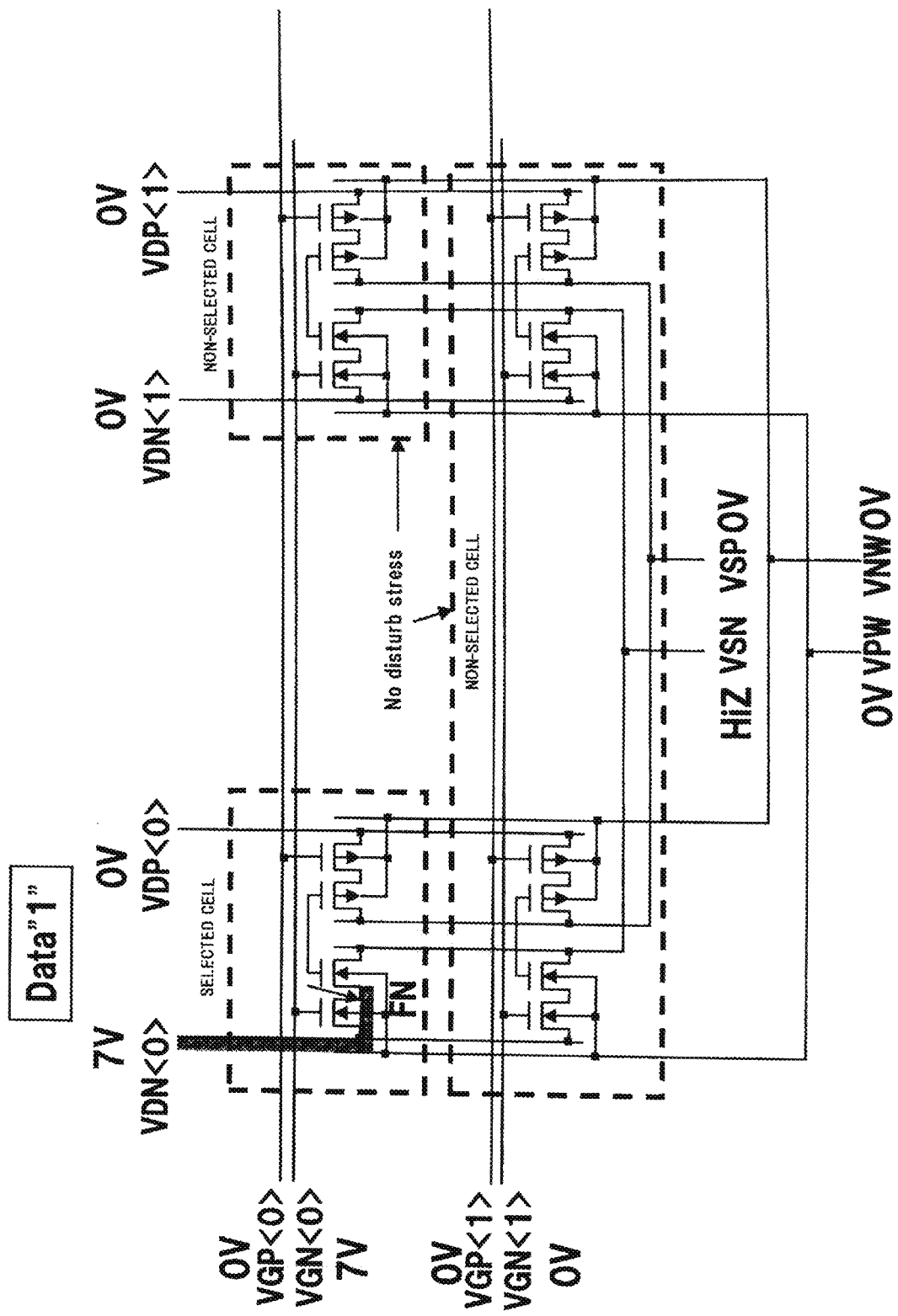
FIG. 15 is a diagram which shows an operation in the case where data "1" is programmed in embodiment one.
Figure 16:
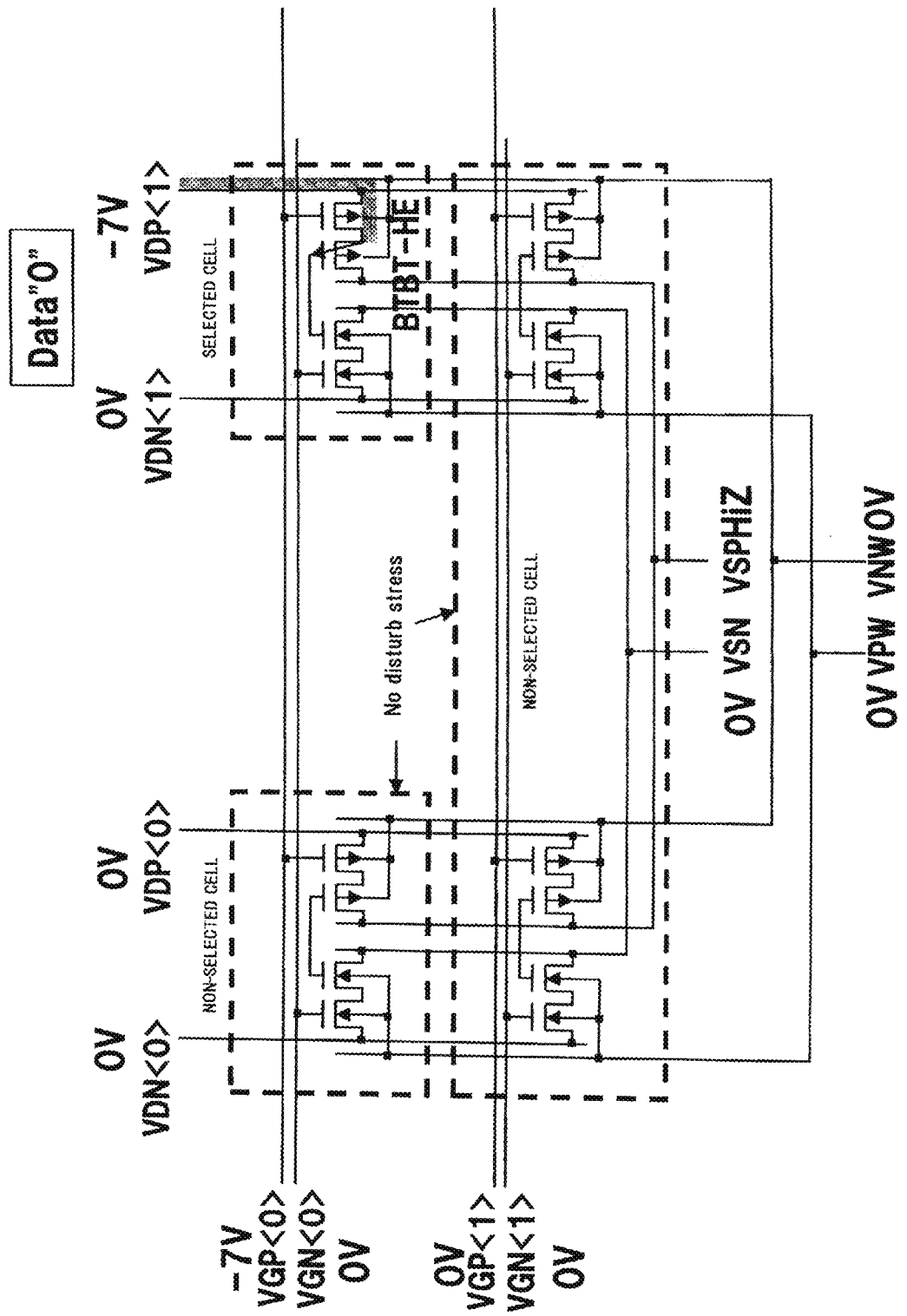
FIG. 16 is a diagram which shows an operation in the case where data "0" is programmed in embodiment one.

FIG. 15 and FIG. 16, show among the memory array operations in embodiment one, the voltages applied to each terminal in a separate step programming mode and at this time the voltages which are simultaneously applied to rows other than a row of the selected memory cell.

FIG. 15 shows the voltages which are simultaneously applied to a selected memory cell and memory cell other than the selected memory cell in a step for programming data "1". 7V is applied to VGN and 0V is applied VGP of the selected row and 0V is applied to VGN and VGP of all other rows, 7V is applied to VDN and 0V is applied to VDP in a column of the selected cell and 0V is applied to VDN and VDP of all the other columns. VSN is placed in HiZ and VSP, VPW and VNW are commonly applied with 0V. Data "1" is programmed by extracting electrons from the floating gate by FN tunneling mode in the N+ diffusion/overlap region of FG-NMOS. Here, disturb stress does not affect the non-selected memory cells at all.

FIG. 16 shows the voltages which are simultaneously applied to a selected memory cell and memory cell other than the selected memory cell in a step for programming data "0". 0V is applied to VGN and −7V is applied VGP of the selected row and 0V is applied to VGN and VGP of all other rows, 0V is applied to VDN and −7V is applied to VDP in a column of the selected cell and 0V is applied to VDN and VDP of all the other columns. VSP is placed in HiZ and VSN, VPW and VNW are commonly applied with 0V. Data "0" is programmed by injecting electrons into the floating gate by BTBT-HE mode which are generated in the P+ diffusion/ overlap region of FG-PMOS. Here, disturb stress does not affect the non-selected memory cells at all.

Even in the separate step programming mode such as above, an erase operation such as that in a flash memory is no longer necessary, programming of data "0" and data "1" can be realized for each bit and it is possible to realize what is called EEPROM specifications. Furthermore, in FIG. 15 only one type of high positive voltage is used and in FIG. 16 only one type of high negative voltage is used.

Figure 17:
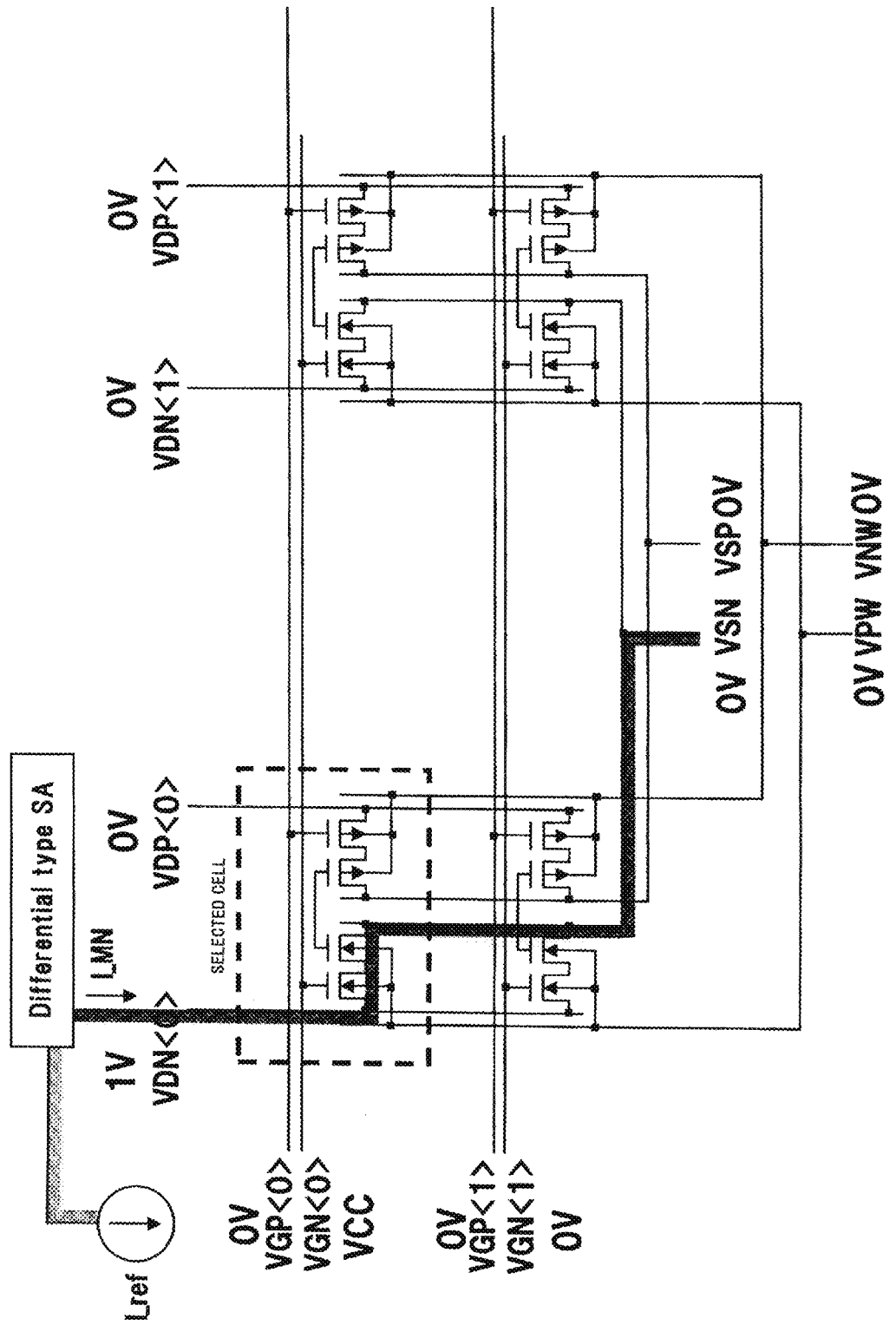
FIG. 17 is a diagram which shows an operation when reading using a current which flows to an NMOS.

FIG. 17 is a diagram which shows an operation when reading (READ (1)) from the NMOS side. A differential type sense amplifier (differential type SA) is attached and the current I_MN which flows to the NMOS part is compared with a reference current Iref and read separately by this differential type SA. A voltage of about 1V is applied to VDN.

Figure 18:
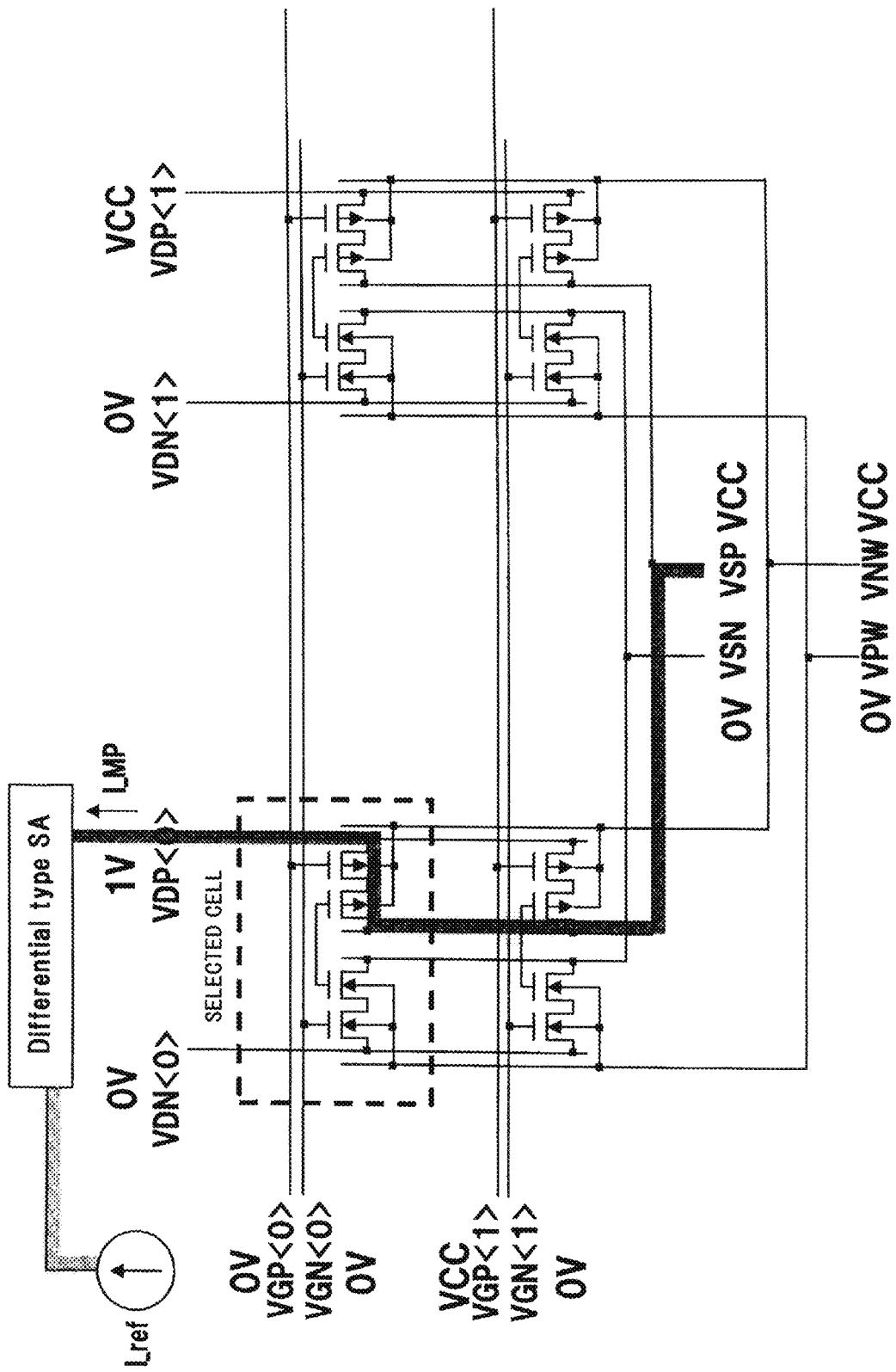
FIG. 18 is a diagram which shows an operation when reading using a current which flows to a PMOS.

FIG. 18 is a diagram which shows an operation when reading (READ (2)) from the PMOS side. A differential type sense amplifier (differential type SA) is attached and the current I_MP which flows to the PMOS part is compared with a reference current Iref and read separately by this differential type SA. A voltage of about 1V is applied to VDN.

Figure 19:
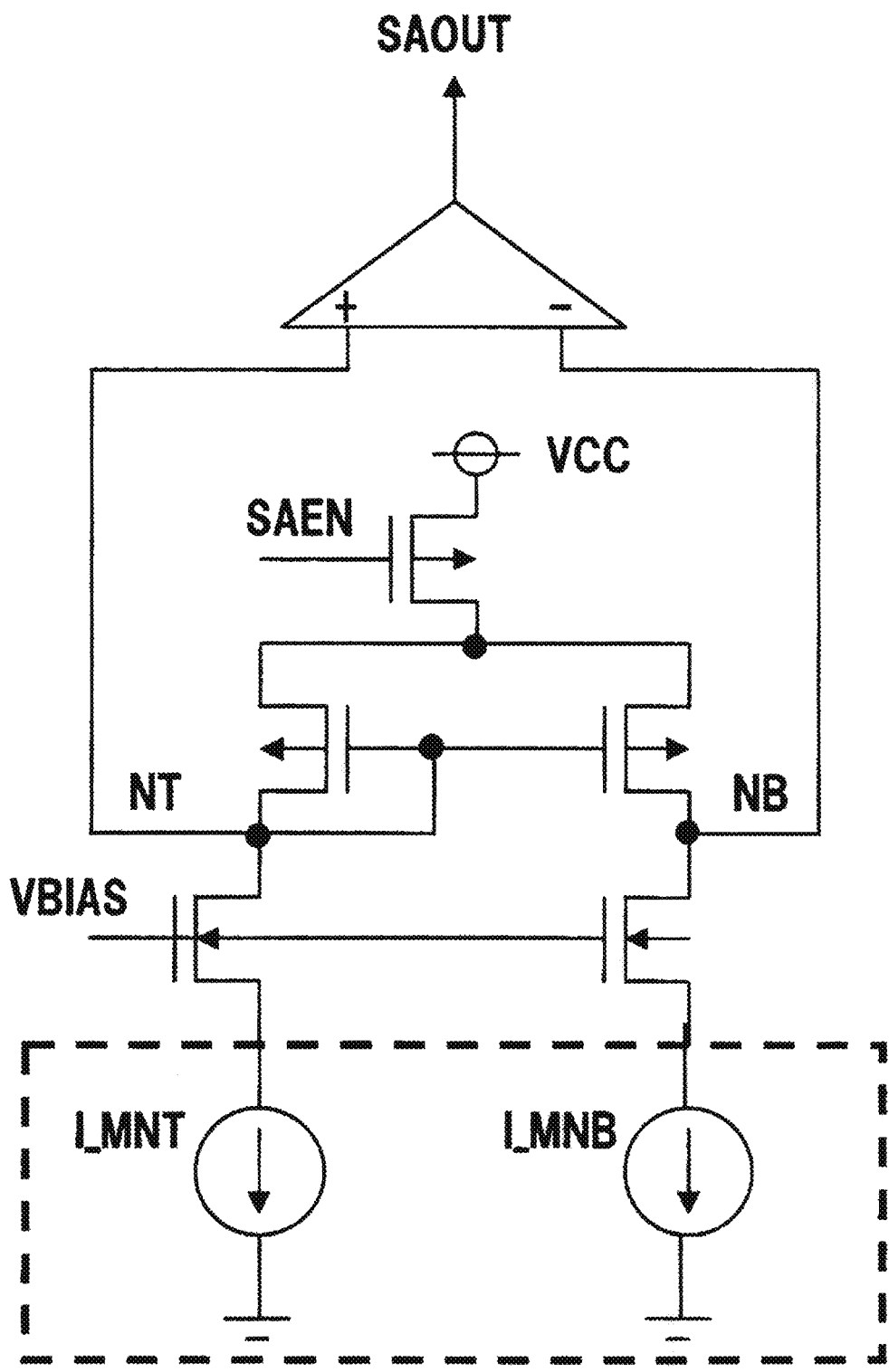
FIG. 19 is a diagram which shows one example of a structure of a differential type sense amplifier in the case where a distinction is made using a current which flows to an NMOS.
Figure 20:
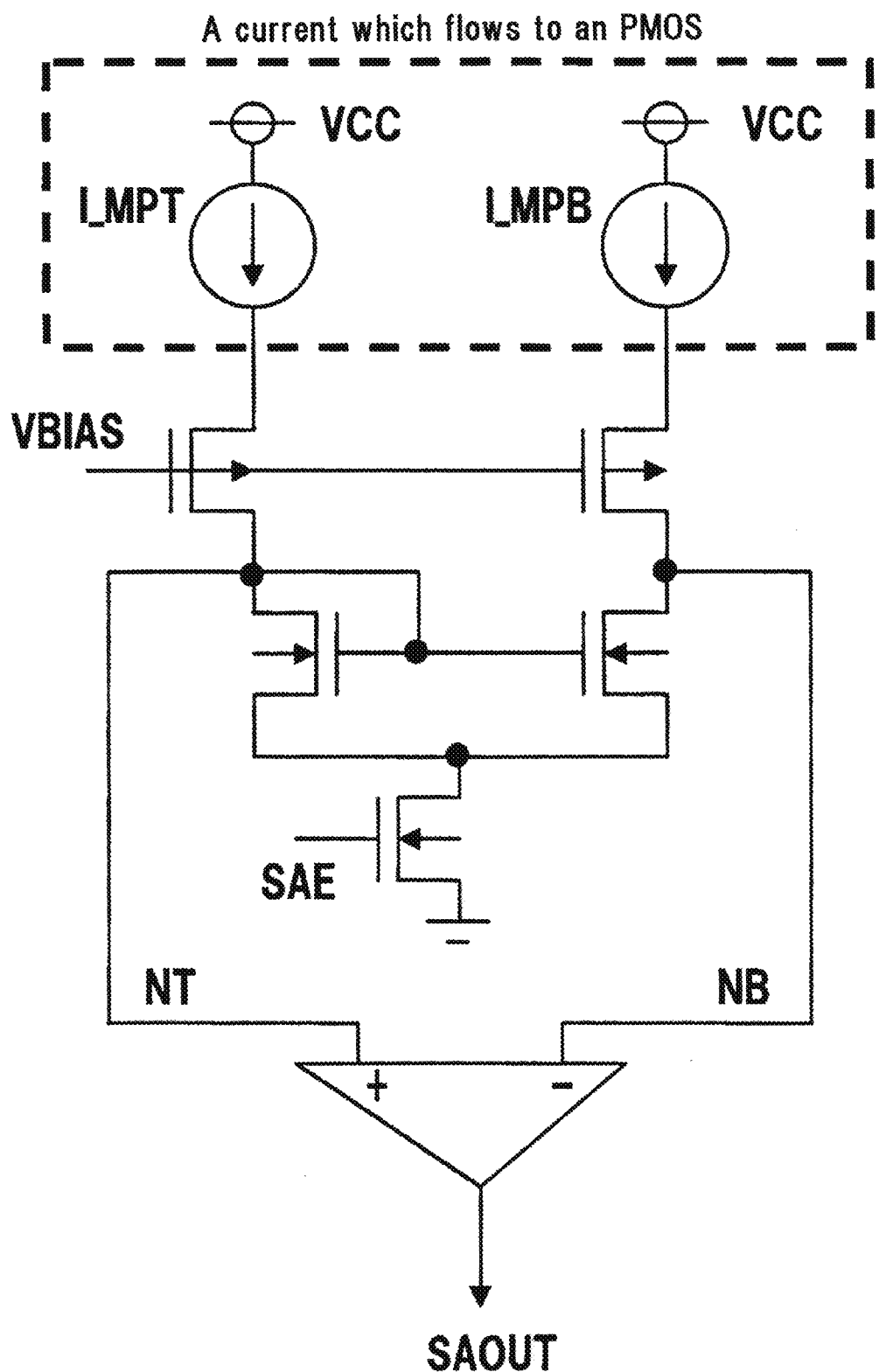
FIG. 20 is a diagram which shows one example of a structure of a differential type sense amplifier in the case where a distinction is made using a current which flows to a PMOS.

FIG. 19 is a diagram which shows one example of a structure of the differential type sense amplifier shown in FIG. 17 and FIG. 20 is a diagram which shows one example of a structure of the differential type sense amplifier shown in FIG. 18 (here, I_MNT corresponds to I_MN and I_MNB corresponds to I_ref. In addition, I_MPT corresponds to I_MP and I_MPB corresponds to I_ref). In each, the structure includes a current mirror circuit and a biased transistor and the outputs NT and NB are amplified by the differential amplifier and the output SAOUT is obtained.

Figure 21:
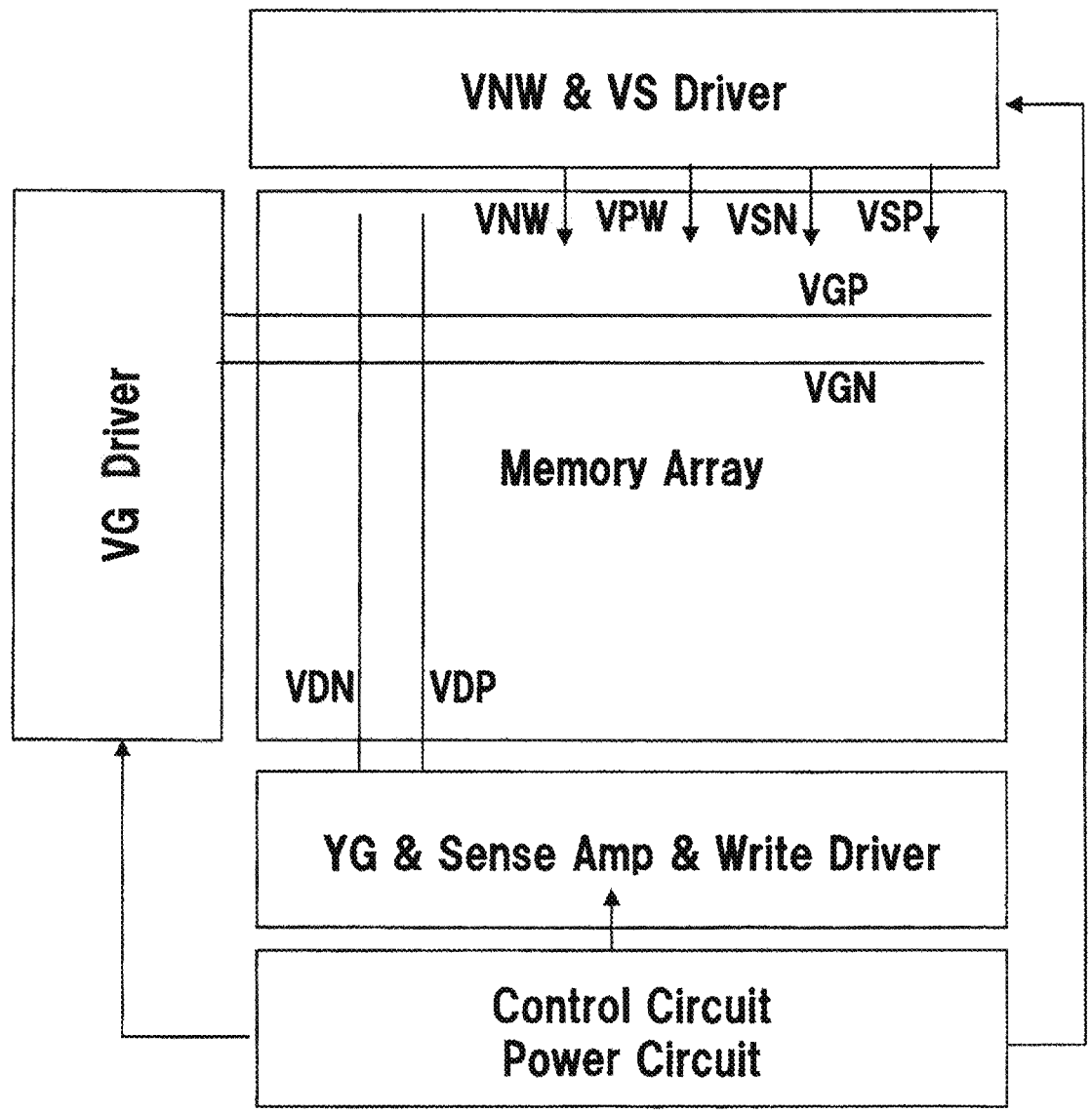
FIG. 21 is a diagram which shows the entire structure of a nonvolatile semiconductor memory device macro which uses the memory cell of embodiment one.

FIG. 21 shows an entire circuit structure of the nonvolatile semiconductor memory device which uses a memory cell of embodiment one and in the case where this is used in consolidation with other logic core (DSP, CPU and each type of driver and controller logic etc) which are formed using a standard CMOS, the nonvolatile semiconductor memory device is proposed as a nonvolatile semiconductor memory device macro.

This nonvolatile semiconductor memory device (macro) is comprised of a memory cell array which is comprised of the array shown in FIG. 11, a VG driver circuit which drives VGP and VGN, a VNW, VS driver circuit which drives VNW, VPW, VSN and VSP, a column select gate (YG) connected to VDN and VDP, the sense amplifier shown in FIG. 19 or FIG. 20, and a program driver which applied a voltage to VDN and VDP when programming. Furthermore, the nonvolatile semiconductor memory device (macro) is also comprised of a control circuit which controls these various circuits and a power circuit which includes a charge pump circuit for supplying a positive high voltage. The power circuit does not have to be included in the nonvolatile semiconductor memory device (macro) and may be shared with other logic core etc.

Embodiment Two

Next, embodiment two of the present invention will be explained while referring to FIG. 22 to FIG. 29. In embodiment two, two of the memory cells explained in embodiment one are made a pair forming a memory cell pair and one (first memory cell) is complementarily programmed with data as a T side element and the other (second memory cell) is complementarily programmed with data as a B side element.

Figure 22:
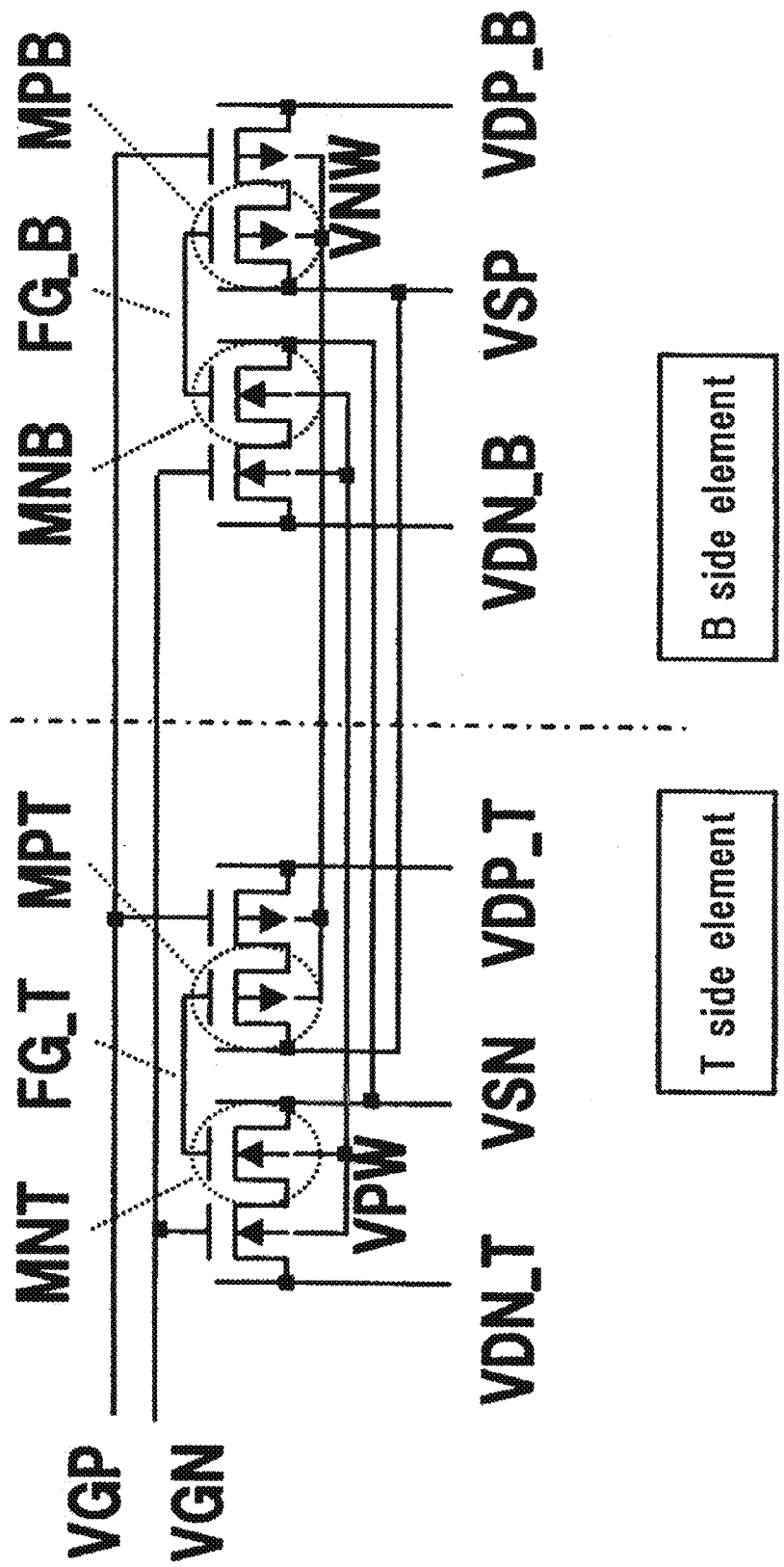
FIG. 22 is an equivalent circuit diagram of a memory cell of embodiment two.

An equivalent circuit view of a memory cell in embodiment two is shown in FIG. 22. VDN_T and VDP_T of the T side element are terminals connected to a sense amplifier or a programming driver, and VDN_B and VDP_B of the B side element are also terminals connected to a sense amplifier or programming driver, and VSN and VSP are terminals connected to a common source line. An MNT transistor and an MNB transistor of the T side element share a floating gate FG_T. An MNB transistor and an MPB transistor of the B side element share a floating gate FG_B. An N type select transistor and the MNT transistor of the T side element and an N type select transistor and the MNB transistor of the B side element share a well and its terminal is VPW. A P type select transistor and the MPT transistor of the T side element and a P type select transistor and the MPB transistor of the B side element share a well and its terminal is VNW.

Figure 23:
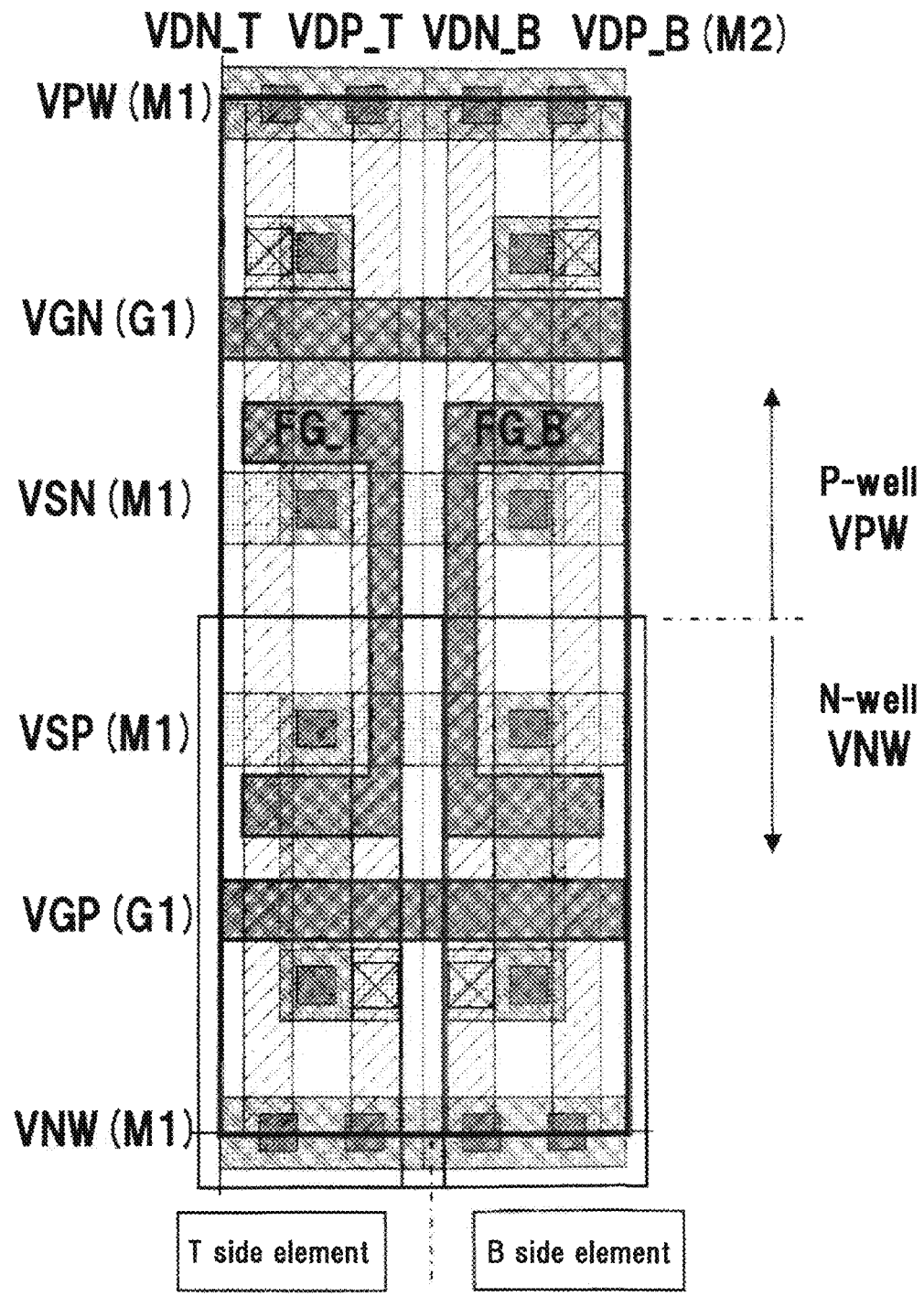
FIG. 23 is a layout view of the memory cell of embodiment two.

A layout view of a memory cell of embodiment two is shown in FIG. 23. VGN, VGP and FG_T and FG_B are all formed on the first polysilicon layer (G1), and VPW, VSN, VSP and VNW are all formed on the first metal layer (Ml). VDN_T, VDP_T, VDN_B and VDP_B which intersect VPW, VSN, VSP and VNW, are formed on the second metal layer. The layout shown in FIG. 23 is compact and as well as making high integration possible it is also possible to realize a polysilicon layer by a one layer standard CMOS process.

Above, two nonvolatile semiconductor memory elements (T side element, B side element) form a memory cell in which VSN, VSP, VPW and VNW are connected as a common wire and data is read using a sense amplifier circuit by the current difference of the N type MOS transistors MNT and MNB or the current difference of the P type MOS transistors MPT and MPB which occurs due to the difference between the FG_T potential of the T side element and the FG_B potential of the B side element.

In this way, by adopting a pair element structure, sense margins are expanded leading to increased reliability.

Figure 24A:
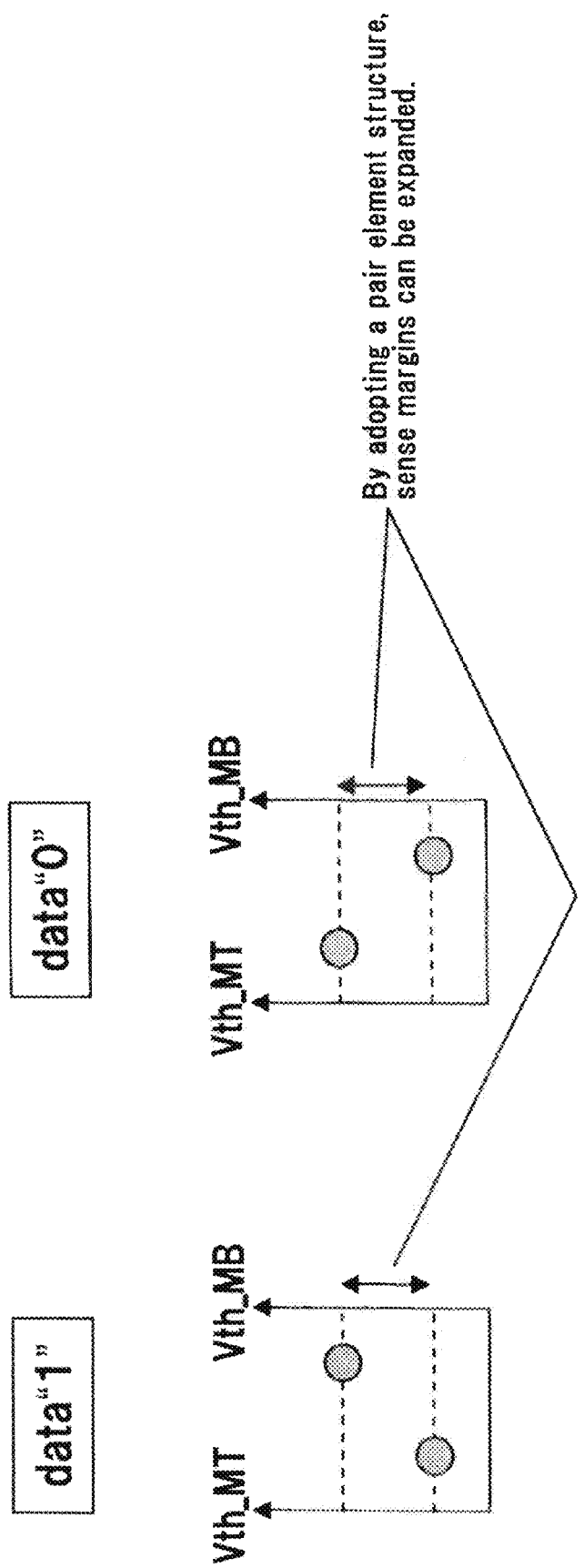
FIG. 24A is a diagram which shows a definition of data in the structure of a pair element.

A definition of data of the memory cell in embodiment one is shown in FIG. 24A. In the threshold voltage Vth_M of FG-NMOS on the vertical axis, when the threshold of MNT is lower than the threshold of MNB, data is defined as "1" and when higher data is defined as "0".

A contrast with the voltage display in FIG. 24A when a sense operation is performed by a current value is shown in FIG. 24B.

Figure 25:
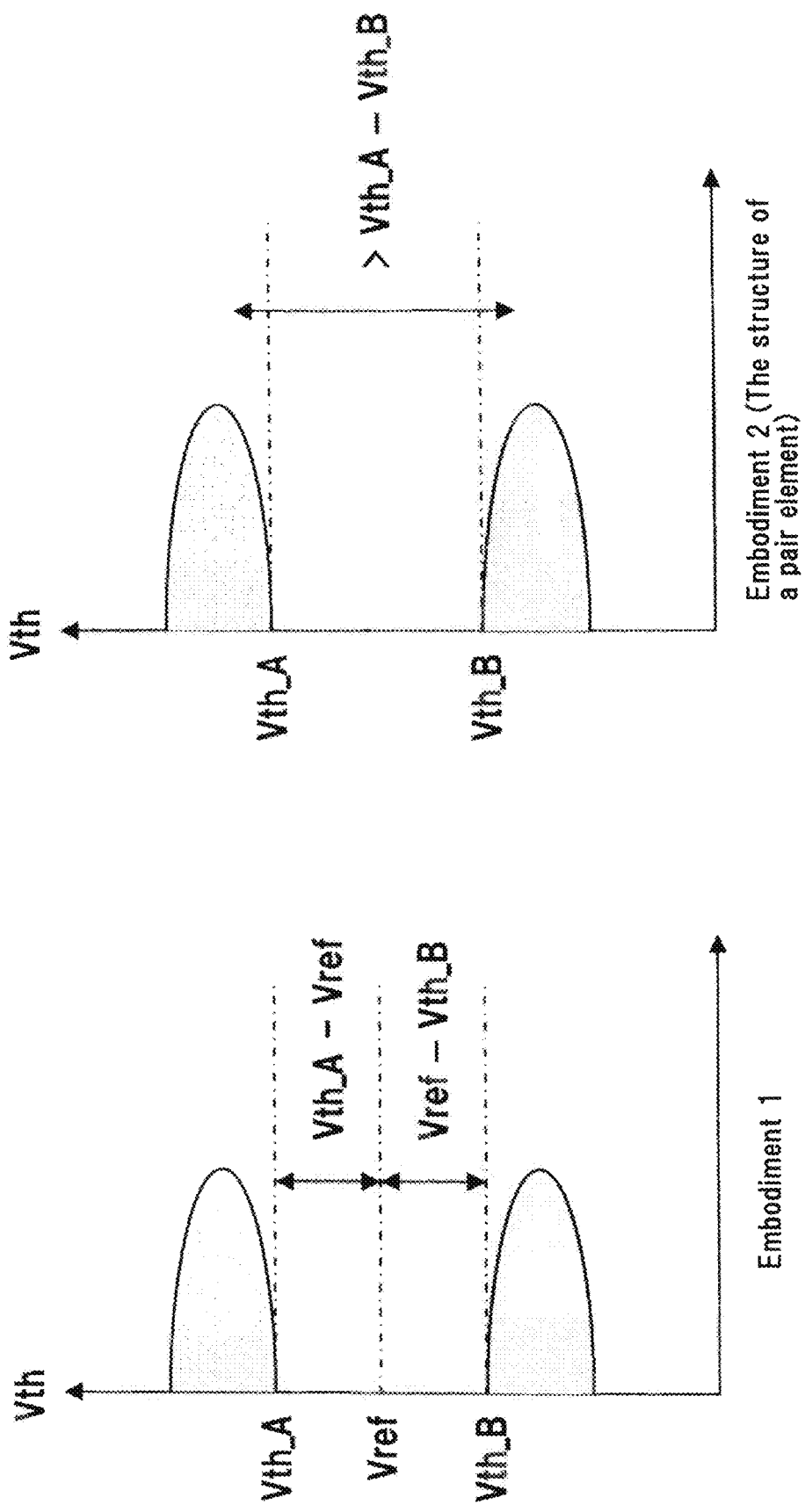
FIG. 25 is a diagram which compares a sense margin in embodiment one and embodiment two.

FIG. 25 shows an expansion of the sense margin of embodiment two compared with embodiment one. There is a variation (variation between process lots, between wafers, between chips and within the chips) in the programming characteristics of a memory cell. The variations between process lots, wafers and chips can be corrected by tuning the programming voltages for each chip, however, variation within the chips still remains. Due to this variation, Vth of a programming state has a certain distribution width and a sense margin is determined by the worst bit of each distribution. The sense margin of embodiment one was Vth_A-Vref or Vref-Vth_B, however, the sense margin of embodiment two becomes larger than Vth_A-Vth_B. Here, because pair elements are physically located in places close to each other, the possibility that Vth of a pair element will become the worst bit of the variation within each chip is extremely unlikely. Therefore, the sense margin of embodiment two becomes larger than Vth_A-Vth_B.

Figure 26:
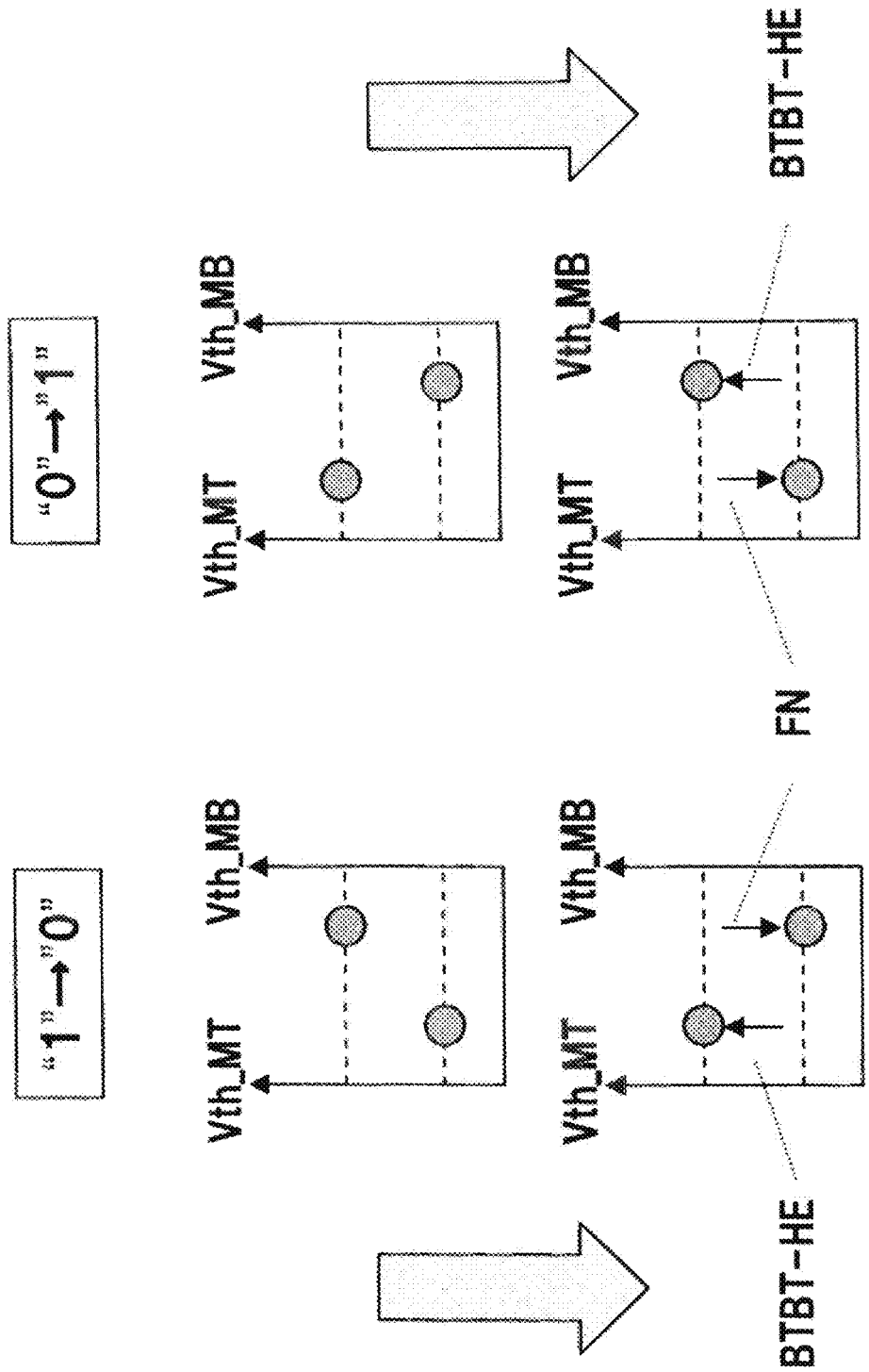
FIG. 26 is a diagram which shows a definition of reprogramming data.

A reprogramming operation (programming operation) of data is shown in FIG. 26. Reprogramming from data "1" to data "0" is performed by increasing the threshold level of MNT using BTBT-HE and the same time reducing the threshold level of MNB using FN tunneling. Reprogramming from data "0" to data "1" is performed by reducing the threshold level of MNT using FN tunneling and at the same time increasing the threshold level of MNB using BTBT-HE. In this way, an erase operation such as that in a flash memory is no longer necessary, programming of data "0" and data "1" can be realized for each bit and it is possible to realize what is called EEPROM specifications.

Figure 27:
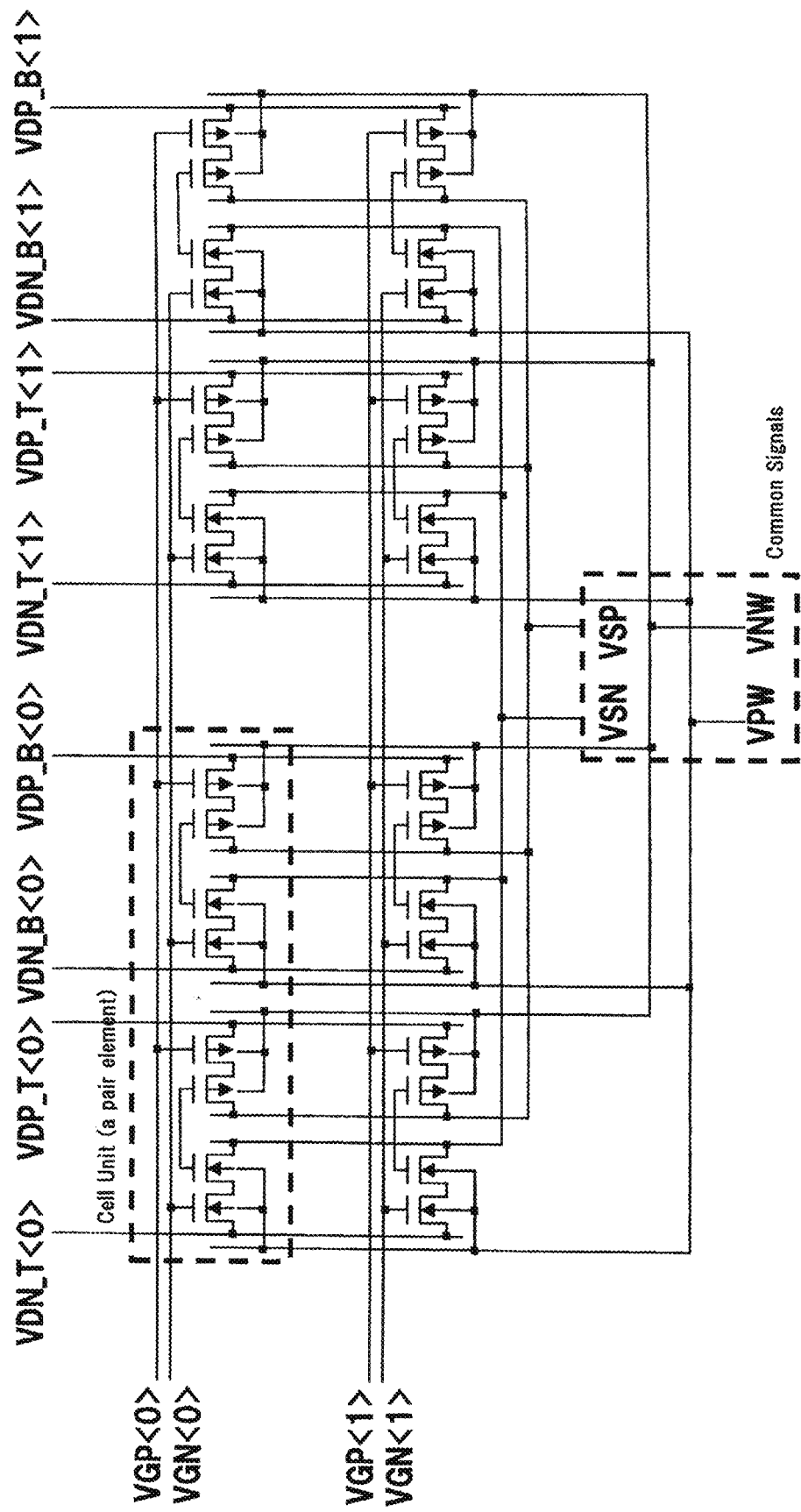
FIG. 27 is diagram of an array structure of the memory cell of embodiment two.

An array structure of a memory cell of embodiment two is shown in FIG. 27. This memory cell array has a plurality of memory cell pairs arranged in a matrix as cell units, VGN of a pair of memory cells which belong to the same row are commonly connected respectively, VGP of a pair of memory cells which belong to the same row are commonly connected respectively, and VDN_T and VDN_B of a pair of memory cells which belong to the same column are commonly connected respectively. In addition, VDP_T and VDP_B of a pair of memory cells which belong to the same column are commonly connected respectively, VSN of memory cells which belong to a plurality of rows and columns are commonly connected, VSP of memory cells which belong to a plurality of rows and columns are commonly connected, VPW of memory cells which belong to a plurality of rows and columns are commonly connected, VNW of memory cells which belong to a plurality of rows and columns are commonly connected and a memory cell array is formed. VSN, VSP, VPW and VNW are driven as common signals of memory cells which belong to a plurality of rows and columns.

A chart which shows each potential applied to each terminal in each operation mode of the nonvolatile semiconductor memory device of embodiment two is shown in FIG. 28A. In equations which express the relationships of each potential is shown in FIG. 28B. Here, an example where data "0" and data "1" are programmed simultaneously (a simultaneous programming mode shown in the seventh and eighth columns from the right of the chart), and an example where data "0" and data "1" are programmed in separate steps (separate step programming mode shown in the third and sixth columns from the right of the chart) are shown as a programming method. In addition, two read operation are also shown, READ (1) which senses from the NMOS side and READ (2) which senses from the PMOS side.

FIG. 29 is a specific example of each potential applied to each terminal in each operation mode of the nonvolatile semiconductor memory device of embodiment two. The power supply voltage is shown in the case where it is 1.8V. HiZ in the diagram shows a state of high impedance.

Figure 30:
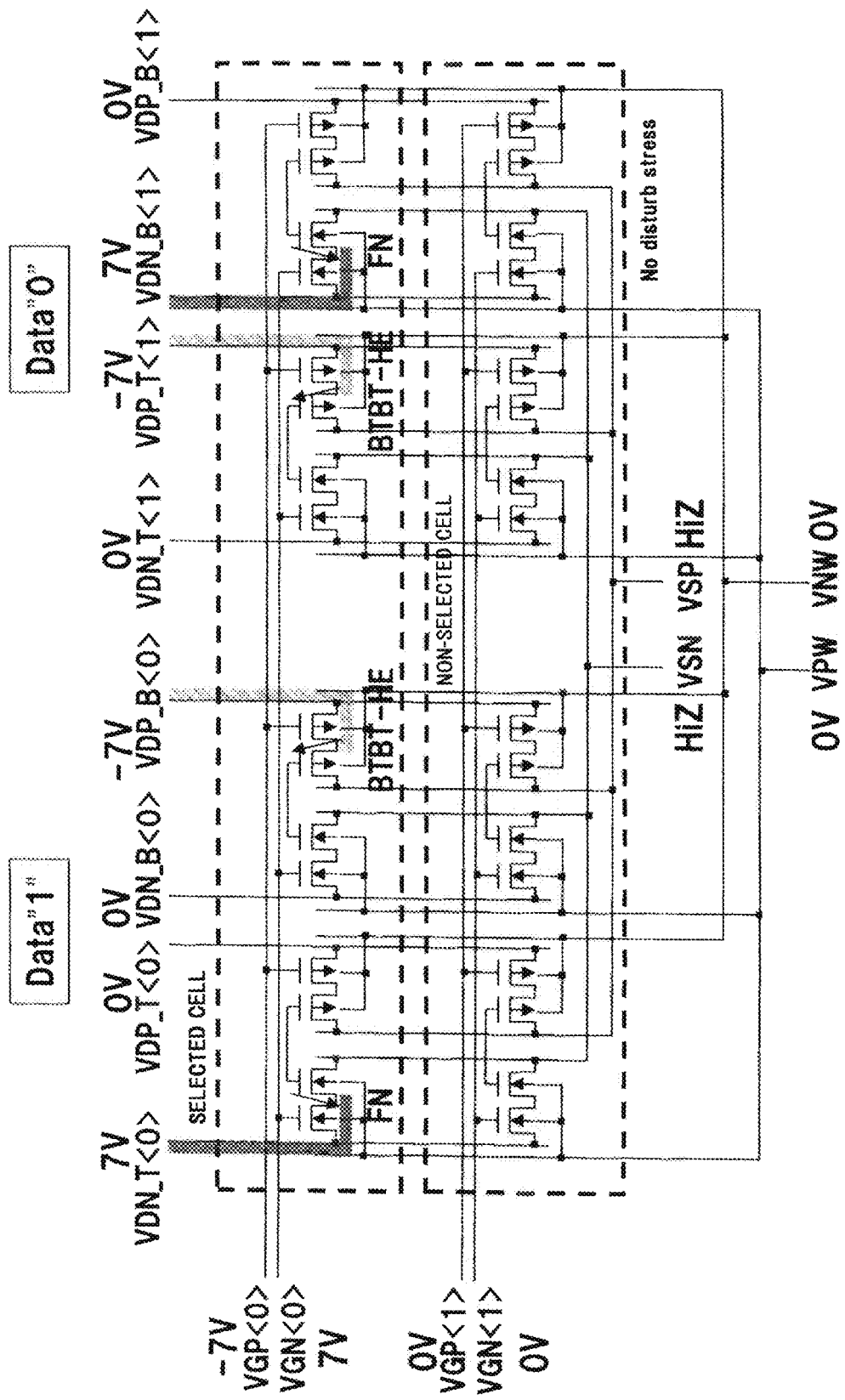
FIG. 30 is a diagram which shows an operation in the case where data "1" and data "0" are programmed simultaneously in embodiment two.

Among the memory cell operations in embodiment two, FIG. 30 shows the voltages which are applied to each terminal in a simultaneous programming mode and the voltages which are simultaneously applied to cells other than the selected cell at this time. Here, disturb stress does not affect non-selected memory cells at all. An erase operation such as that in a flash memory is no longer required, programming of data "0" and data "1" for each bit can be realized and it is possible to realize EEPROM specifications. Furthermore, two types of positive high voltage are simultaneously required and two charge pump circuits are also required.

Figure 31:
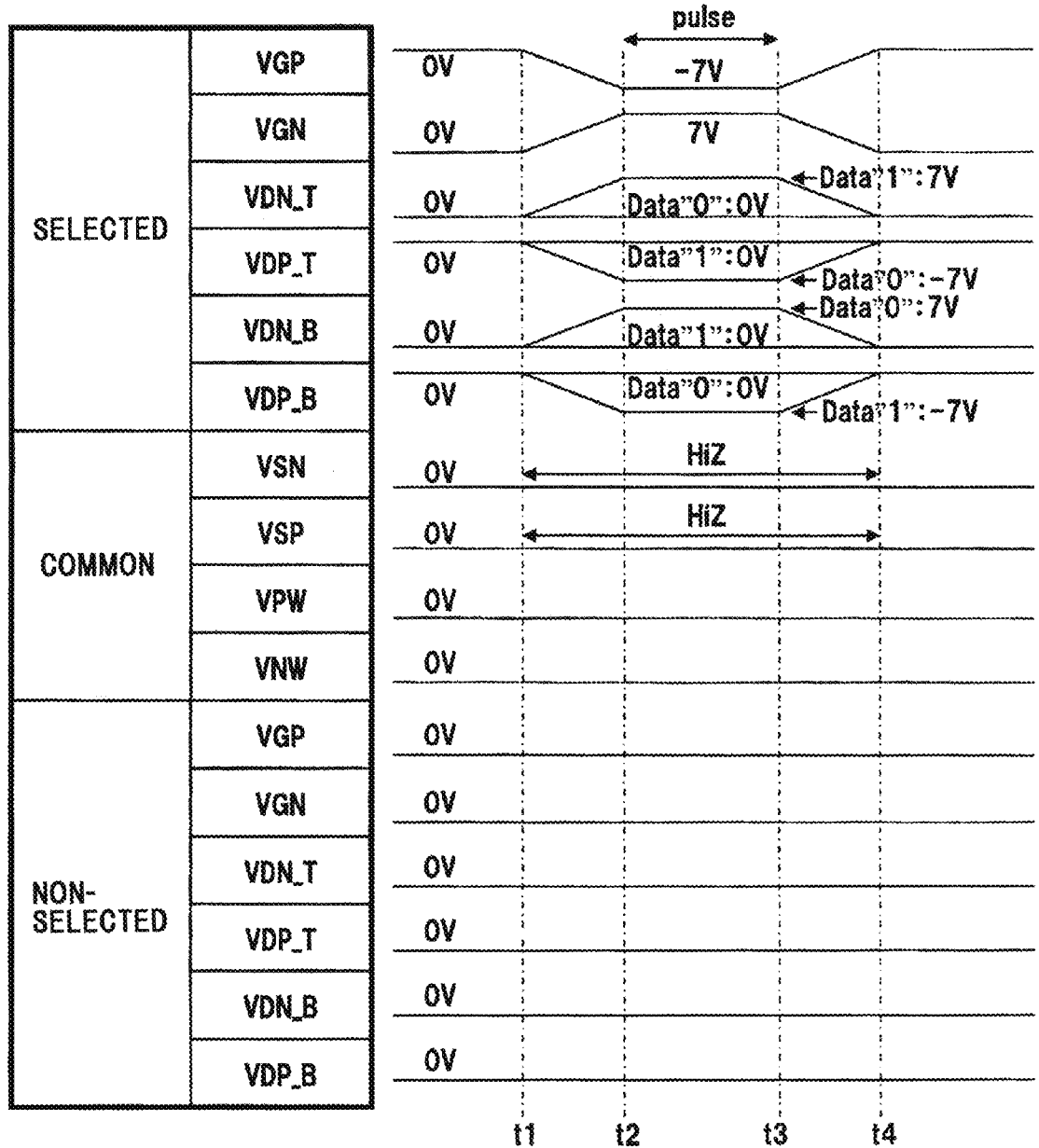
FIG. 31 is a time chart in the case where data "1" and data "0" are programmed simultaneously in embodiment two.

FIG. 31 shows a time chart of the programming operation shown in FIG. 30.

Figure 32:
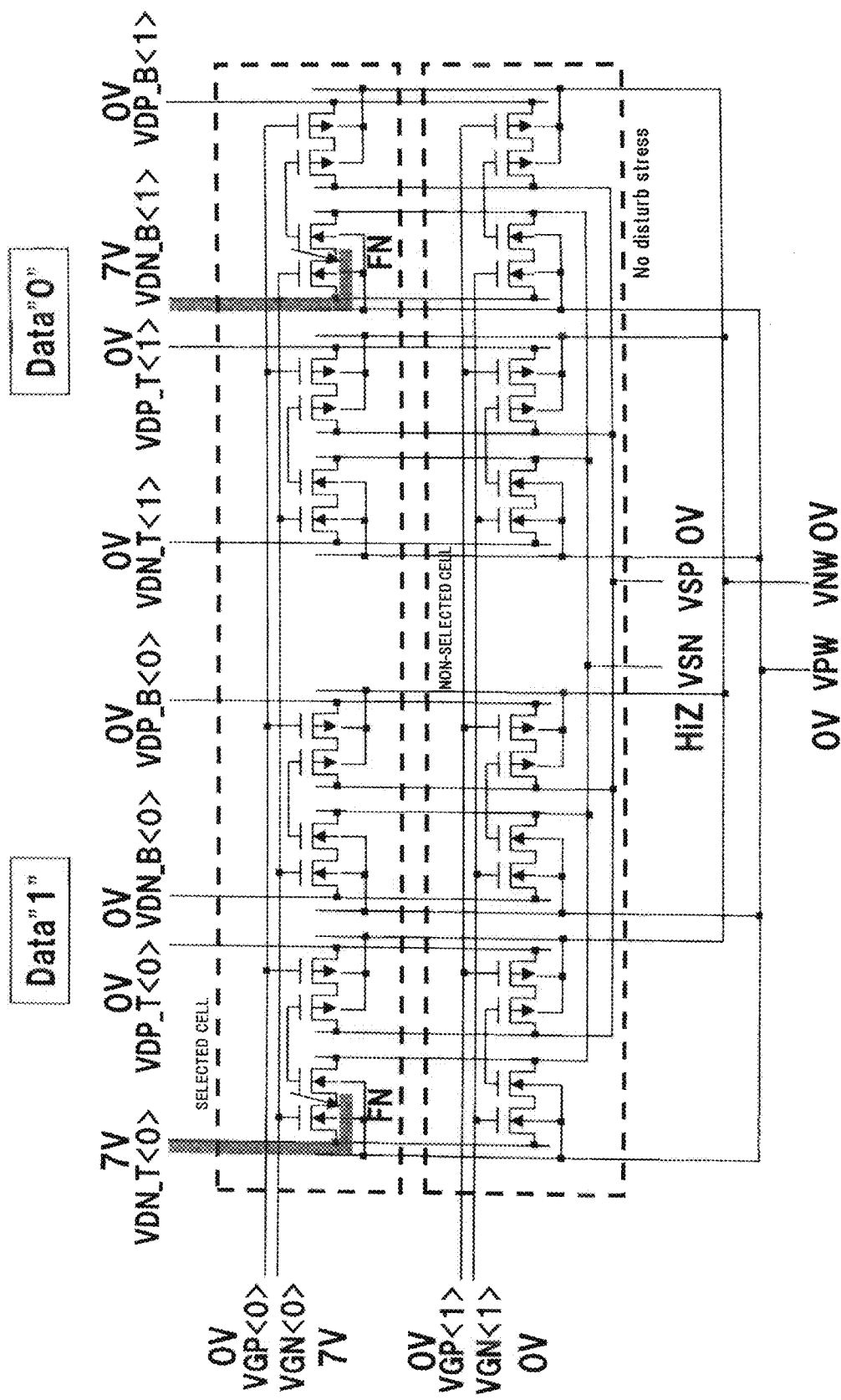
FIG. 32 is a diagram which shows a programming operation by FN tunneling in embodiment two.
Figure 33:
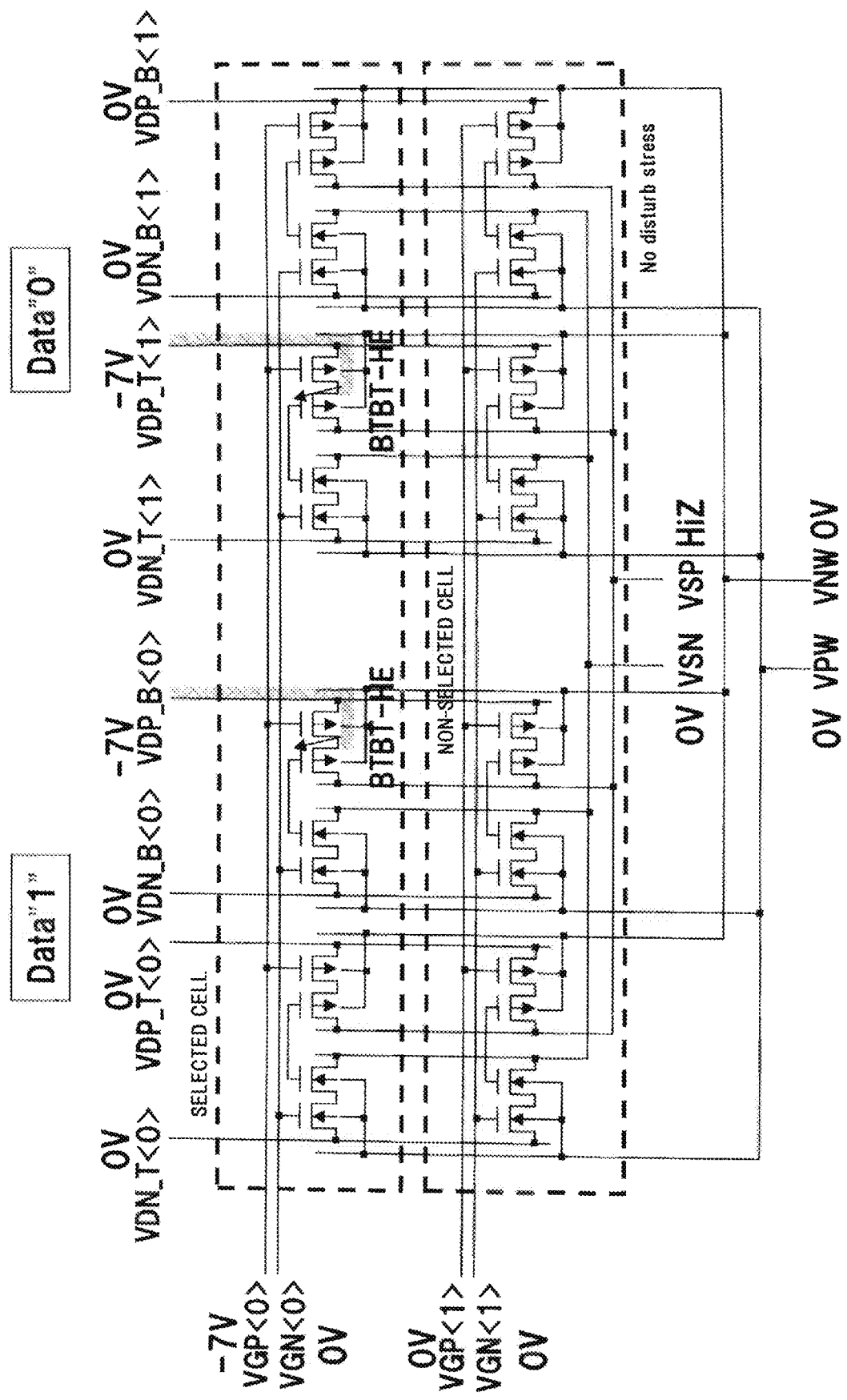
FIG. 33 is a diagram which shows a programming operation by BTBT-HE in embodiment two.
Figure 34:
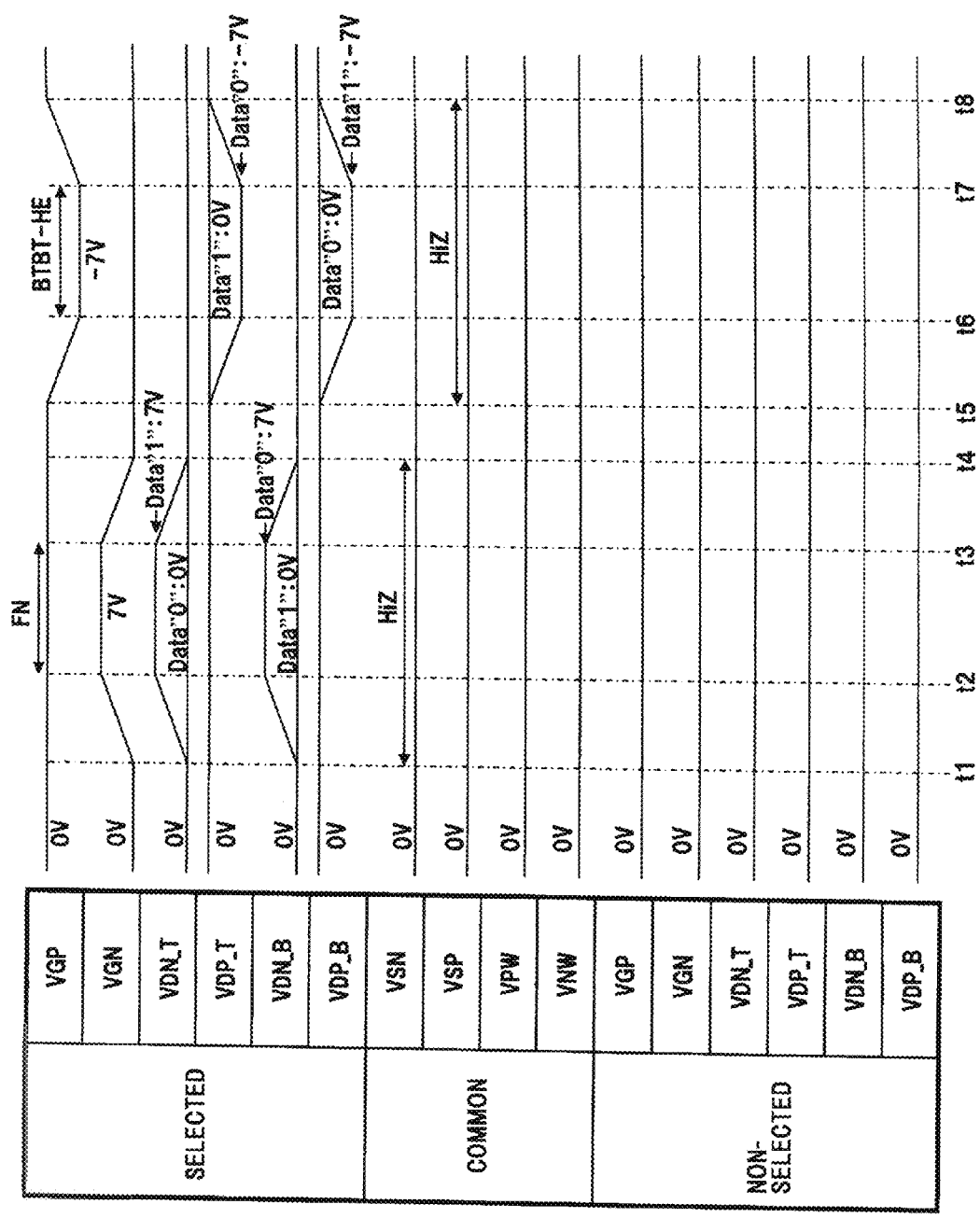
FIG. 34 is a time chart in the case where an FN tunneling operation and a BTBT-HE operation are performed separately in a programming operation in embodiment two.

Among the memory cell operations in embodiment two, FIG. 32 and FIG. 33 show the voltages which are applied to each terminal in the separate steps programming mode and the voltages which are simultaneously applied to cells other than the selected cell at this time. FIG. 34 shows a time chart of this programming operation.

FIG. 32 shows the voltages which are simultaneously applied to a selected memory cell and memory cells other than the selected memory cell in a first programming step. Here, disturb stress does not affect the non-selected memory cells at all. FIG. 33 shows the voltages which are simultaneously applied to a selected memory cell and memory cells other than the selected memory cell in a second programming step. Here too, disturb stress does not affect the non-selected memory cells at all.

In the separate steps programming mode as above, an erase operation such as that in a flash memory is no longer required, programming of data "0" and data "1" for each bit can be realized and it is possible to realize EEPROM specifications. Furthermore, only one type of positive high voltage is required and in FIG. 33 only one type of negative high voltage is shown.

Figure 35:
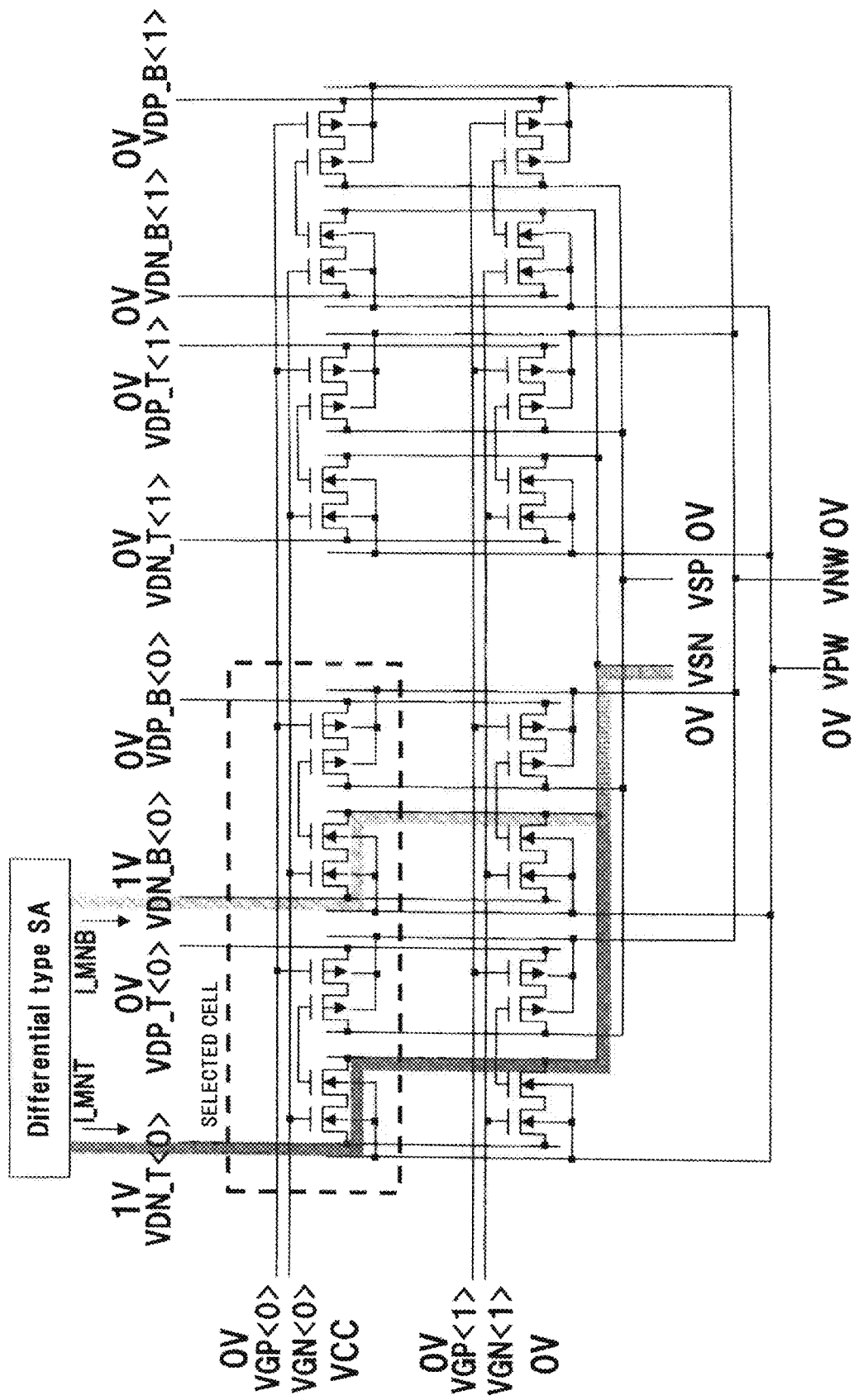
FIG. 35 is a diagram which shows an operation when reading using a current difference which flows to an NMOS.
Figure 36:
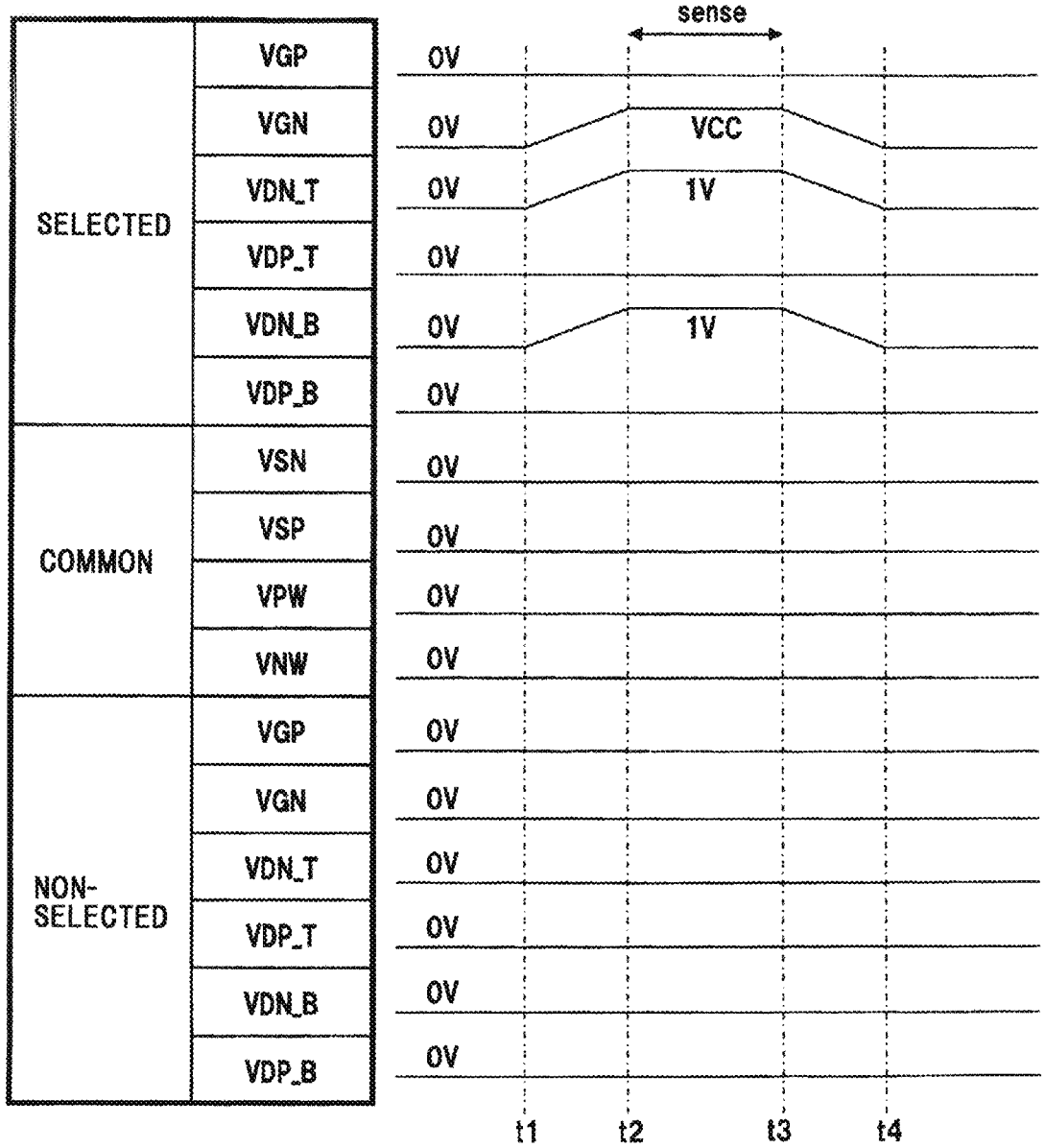
FIG. 36 is a time chart when reading using a current difference which flows to an NMOS.

FIG. 35 is a diagram which shows an operation when reading (READ (1)) from the NMOS side. A differential type sense amplifier (differential type SA) is attached and the currents I_MNT and I_MNB which flow to each NPMOS part of a memory cell pair are compared and read separately by this differential type SA. A voltage of about 1V is applied to VDN. A time chart of this time is shown in FIG. 36.

Figure 37:
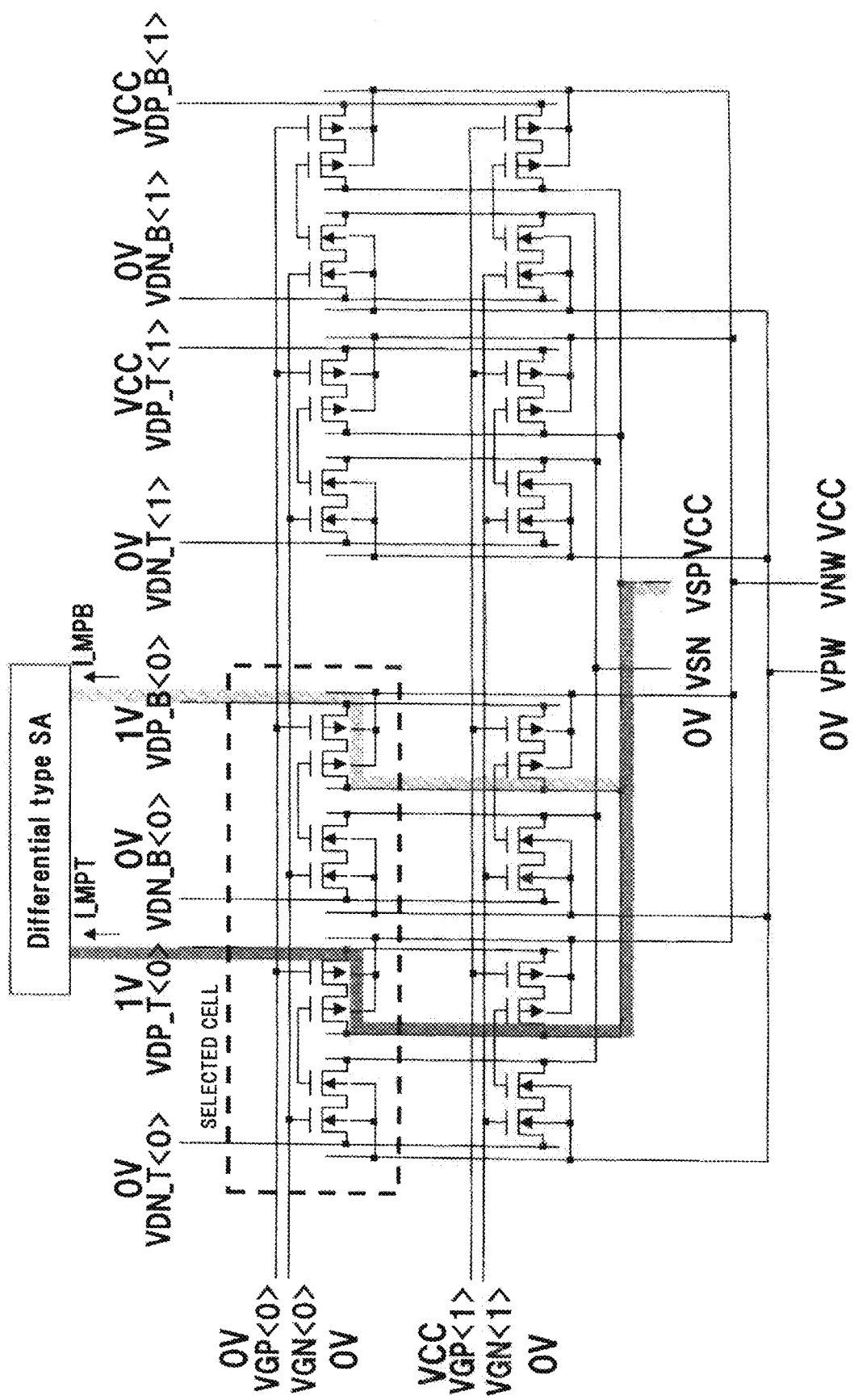
FIG. 37 is a diagram which shows an operation when reading using a current difference which flows to a PMOS.
Figure 38:
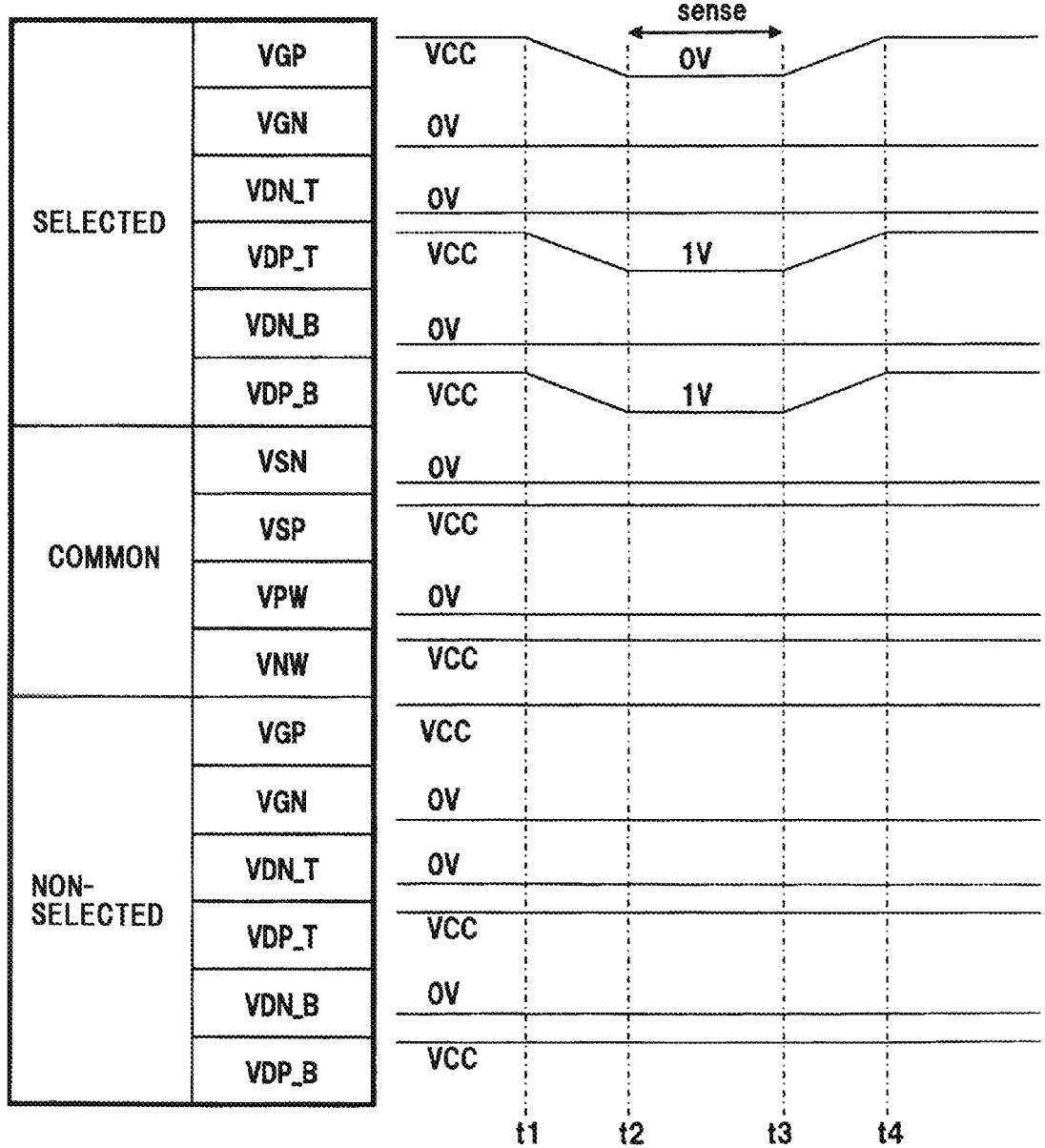
FIG. 38 is a time chart when reading using a current difference which flows to a PMOS.

FIG. 37 is a diagram which shows an operation when reading (READ (2)) from the PMOS side. A differential type sensor (differential type SA) is attached and the currents I_MPT and I_MPB which flow to each PMOS part of a memory cell pair are compared and read separately by this differential type SA. A voltage of about 1V is applied to VDP. A time chart of this time is shown in FIG. 38.

The differential type sense amplifier uses the elements as shown in FIG. 19 or FIG. 20.

Figure 39:
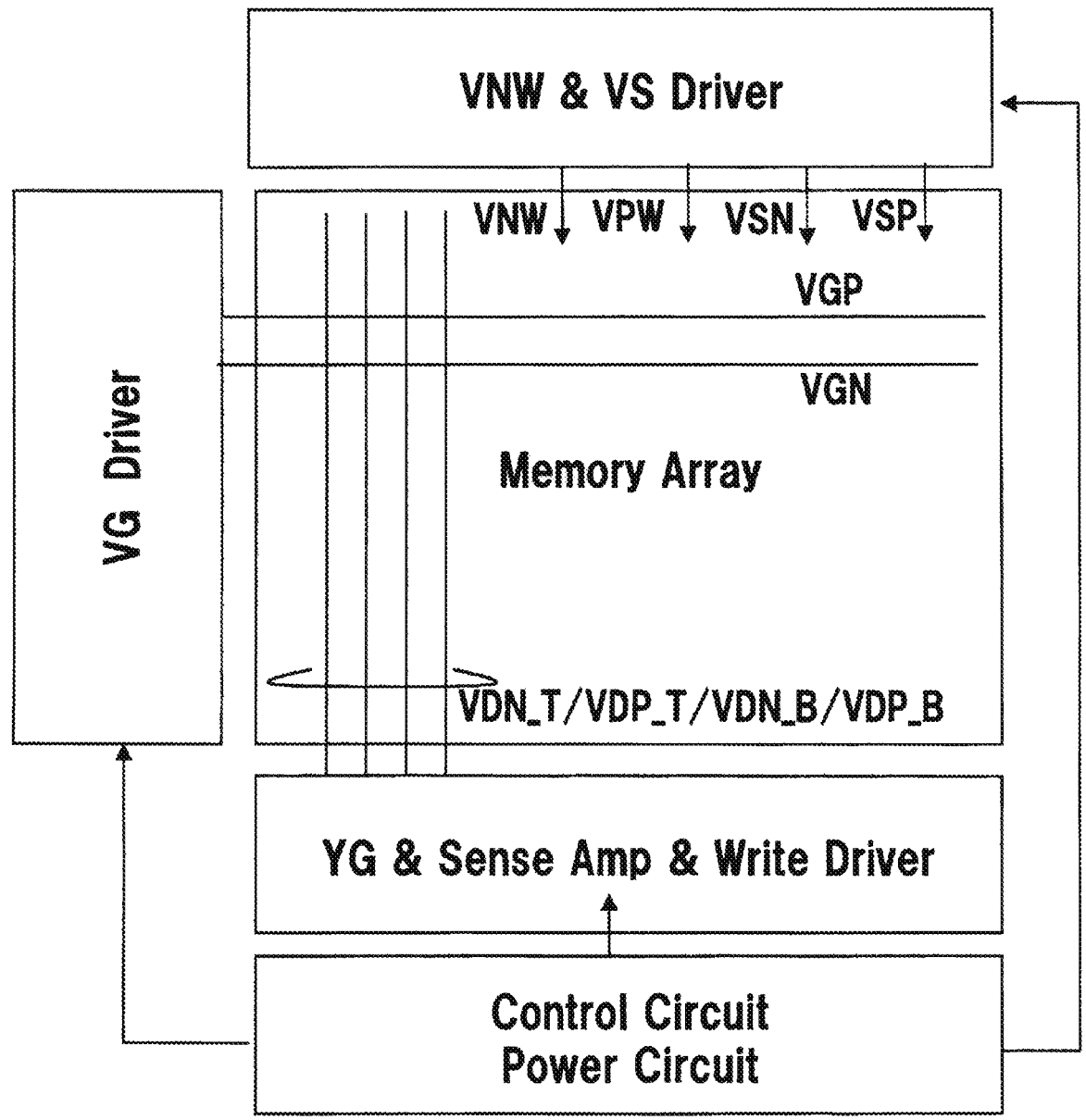
FIG. 39 is a diagram which shows the entire structure of a nonvolatile semiconductor memory device macro which uses the memory cell of embodiment two.

FIG. 39 shows an entire circuit structure of the nonvolatile semiconductor memory device which uses a memory cell of embodiment two and in the case where this is used in consolidation with other logic core (DSP, CPU and each type of driver and controller logic etc) which are formed using a standard CMOS, the nonvolatile semiconductor memory device is proposed as a nonvolatile semiconductor memory device macro. The differences between that of FIG. 21 are that a column select gate (YG), sense amplifier and a program driver for applying a voltage when programming are connected to VDN_T, VDP_T, VDN_B and VDP_B.

Embodiment Three

Next, embodiment three of the present invention will be explained while referring to FIG. 40 to FIG. 50. In the explanations below, the elements which are not particularly shown in the diagrams are the same as embodiment one and two.

Figure 40:
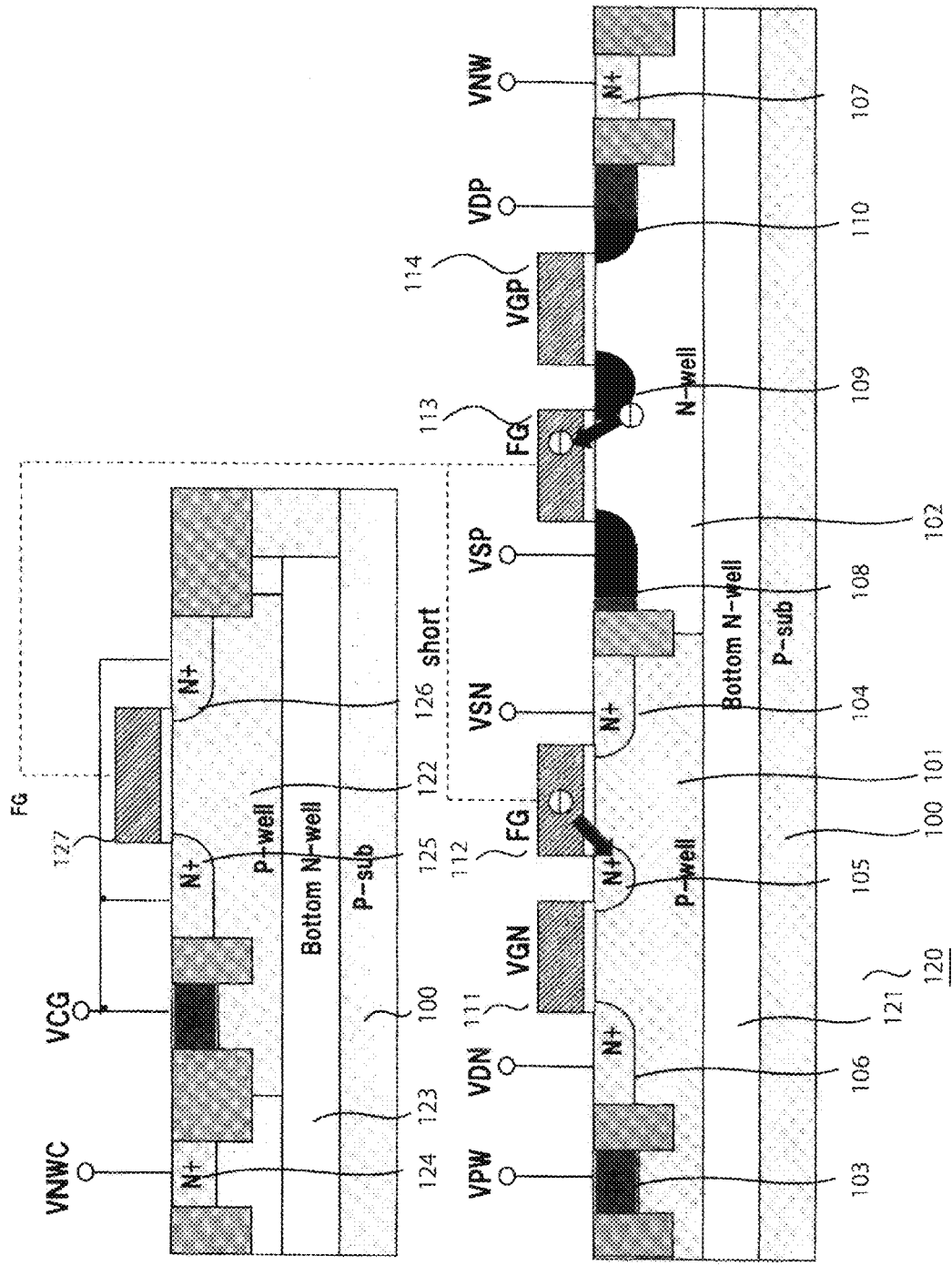
FIG. 40 is a cross sectional diagram of a memory cell of embodiment three.

As is shown in FIG. 40, the memory cell 120 of the nonvolatile semiconductor memory device related to the embodiment three of the present invention is formed from a semiconductor substrate 100, an n type well (Bottom N-well) 121 formed on the semiconductor substrate 100, a p type well (P-well) 101 formed on the well 121 and connected to VPW via a P+ diffusion layer 103, and an n type well (N-well) 102 formed on the well 121 and connected to VNW via an N+ diffusion layer 107. That is, the memory cell 120 of embodiment three is formed within a triple well. This point is common with one part of the structure shown in FIG. 2 as a transformation example of embodiment one.

Furthermore, as is shown in FIG. 40, the memory cell 120 also includes an n type well (Bottom N-well) 123 formed on the p type semiconductor substrate 100 and connected to VNWC via an N+ diffusion layer 124 and a p type well (P-well) 122 formed on the well 123 and connected to VCG via a P+ diffusion layer. An NMOS transistor 127 comprised of a gate formed via an insulation film above a channel region between N+ diffusion layers 125 and 126, is formed on this well 122. The gate of this NMOS transistor 127 is commonly connected (short) with the gate of an NMOS transistor 112 and the gate of a PMOS transistor 113, and functions as a floating gate FG which is in a floating state. Data is stored according to the accumulation state of electrons in this floating gate FG. The source and drain of the NMOS transistor 127 are commonly connected to VCG. As a result, the NMOS transistor 127 operated as a MOS capacitor (capacitance element).

In this way, an NMOS capacitor is added for controlling the potential of the floating gate. Because the VCG voltage becomes both positive and negative, it is necessary to form the NMOS capacitor in a triple well. Although cell area size increases, because it is possible to arbitrarily set a floating gate potential, it becomes easier to increase programming speed. By not using a control gate, the potential of the floating gate is changed by about 2V± and because it is necessary only to strengthen the electric field which is applied to the floating gate/drain overlap region, it is possible to reduce the size of the NMOS capacitor compared to the MOS capacitor for coupling that is required in the conventional example 1.

Figure 41:
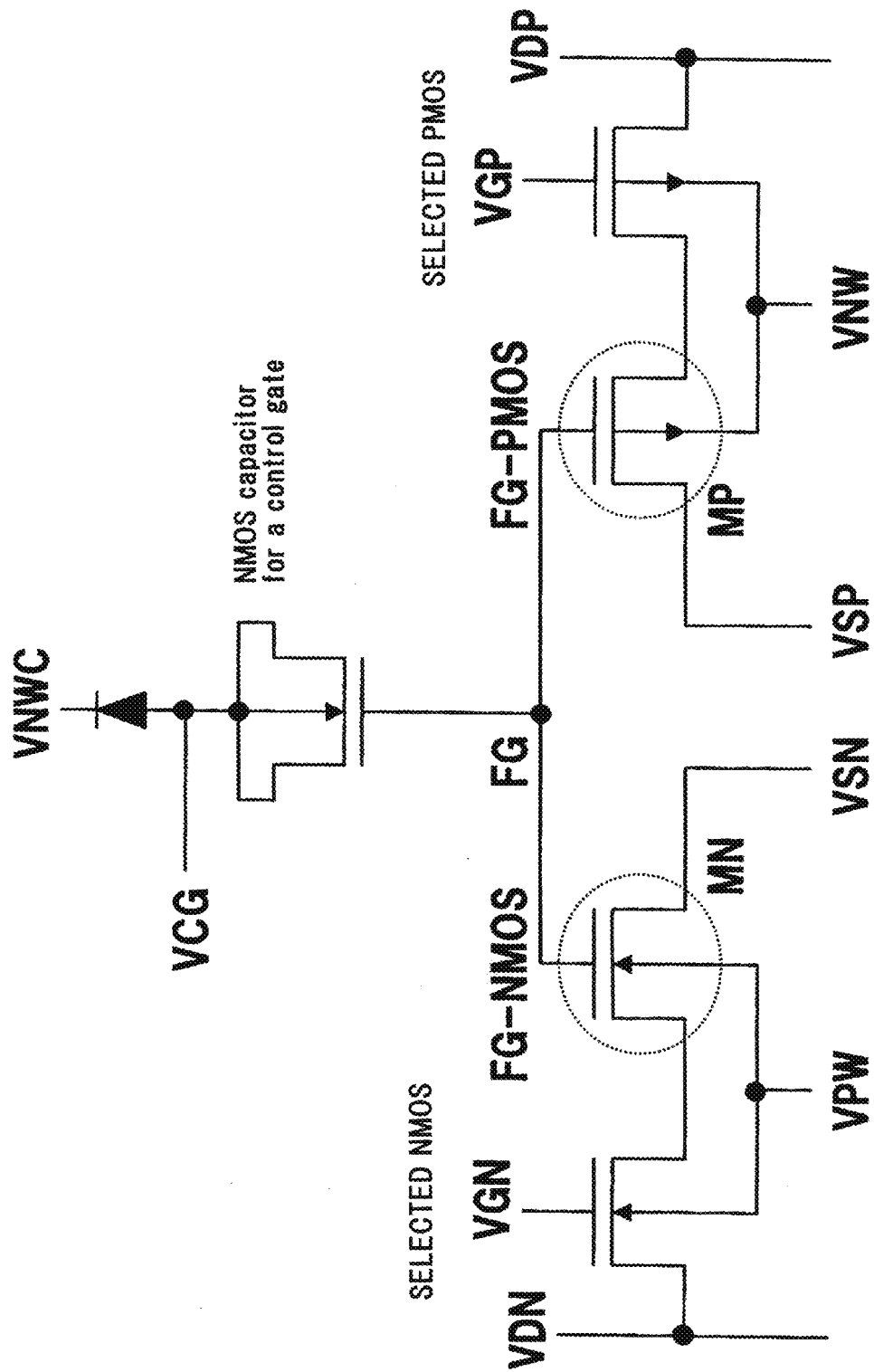
FIG. 41 is an equivalent circuit diagram of the memory cell of embodiment three.

An equivalent circuit view of the memory cell of embodiment three is shown in FIG. 41. VDN and VDP are terminals connected to a sense amplifier or a programming driver, VSN and VSP are terminals connected to a source line and are the same as in embodiment one. A select NMOS transistor (NMOS transistor 111 in FIG. 40) in which the gate is connected to VGN, and a FG-NMOS transistor (NMOS transistor 112 in FIG. 40) are connected in series between VDN and VSN. A select NMOS transistor and FG-NMOS transistor are connected to a common well and its terminal is VPW. A select PMOS transistor (PMOS transistor 114 in FIG. 40) in which the gate is connected to VGP, and a FG-PMOS transistor (PMOS transistor 113 in FIG. 40) are connected in series between VDP and VSP. A select PMOS transistor and FG-PMOS transistor are connected to a common well and its terminal is VNW. Furthermore, an NMOS capacitor (NMOS transistor 127 in FIG. 40) for a control gate is attached and one end is connected to VCG and the other end is connected to FG.

Figure 42:
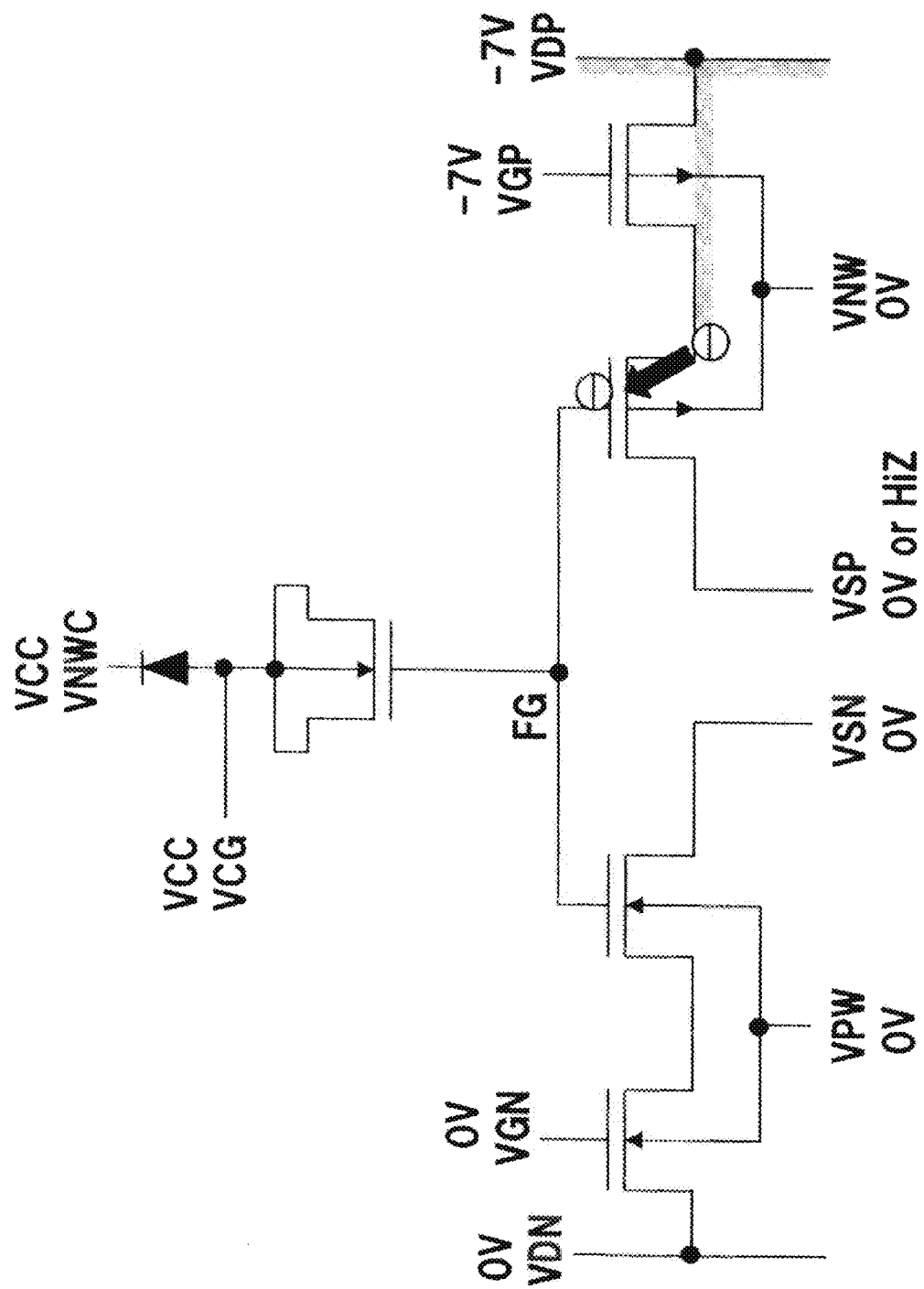
FIG. 42 is one example of a programming operation by BTBT-HE in embodiment three.
Figure 43:
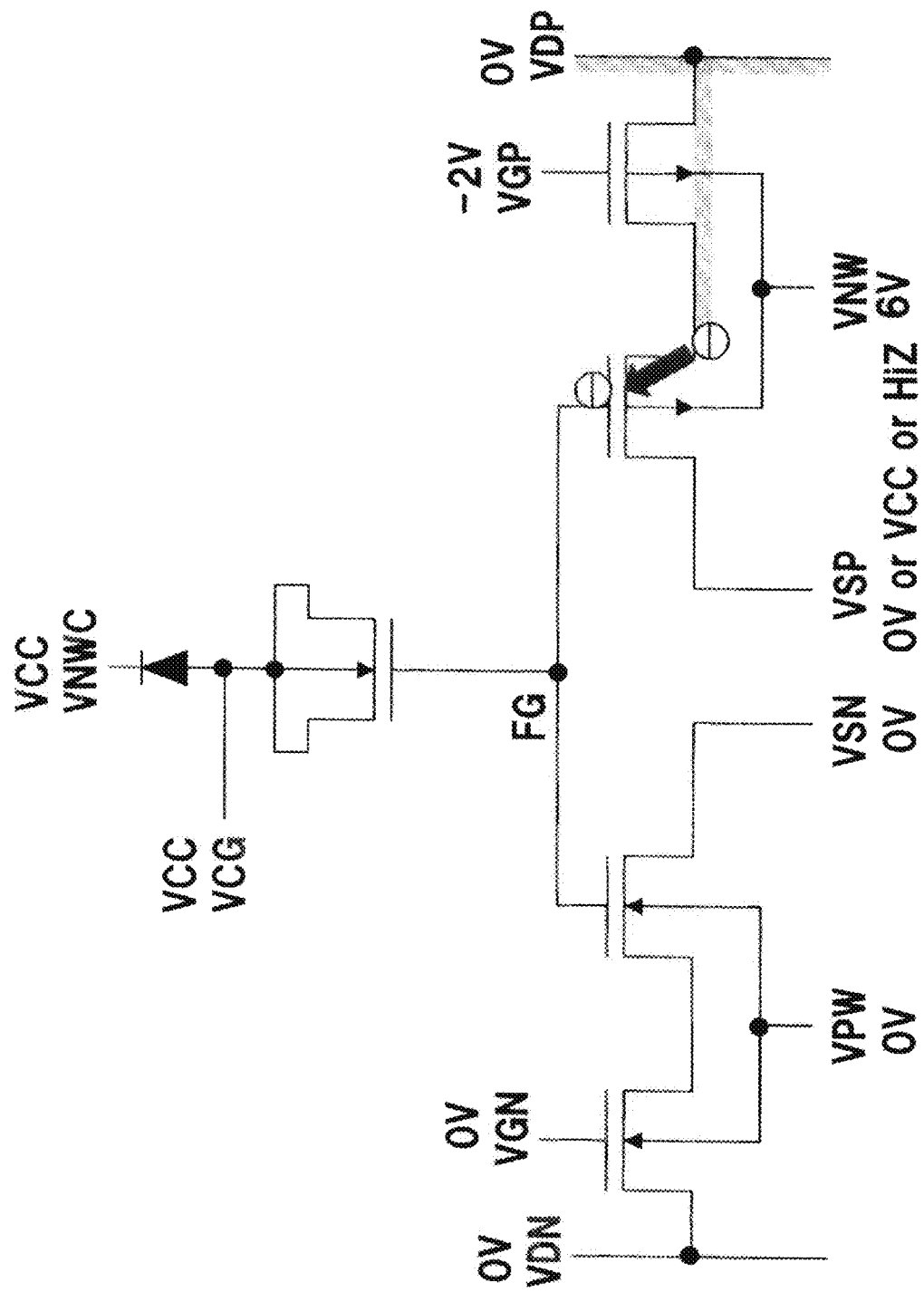
FIG. 43 is one example of a programming operation by BTBT-HE in embodiment three.
Figure 44:
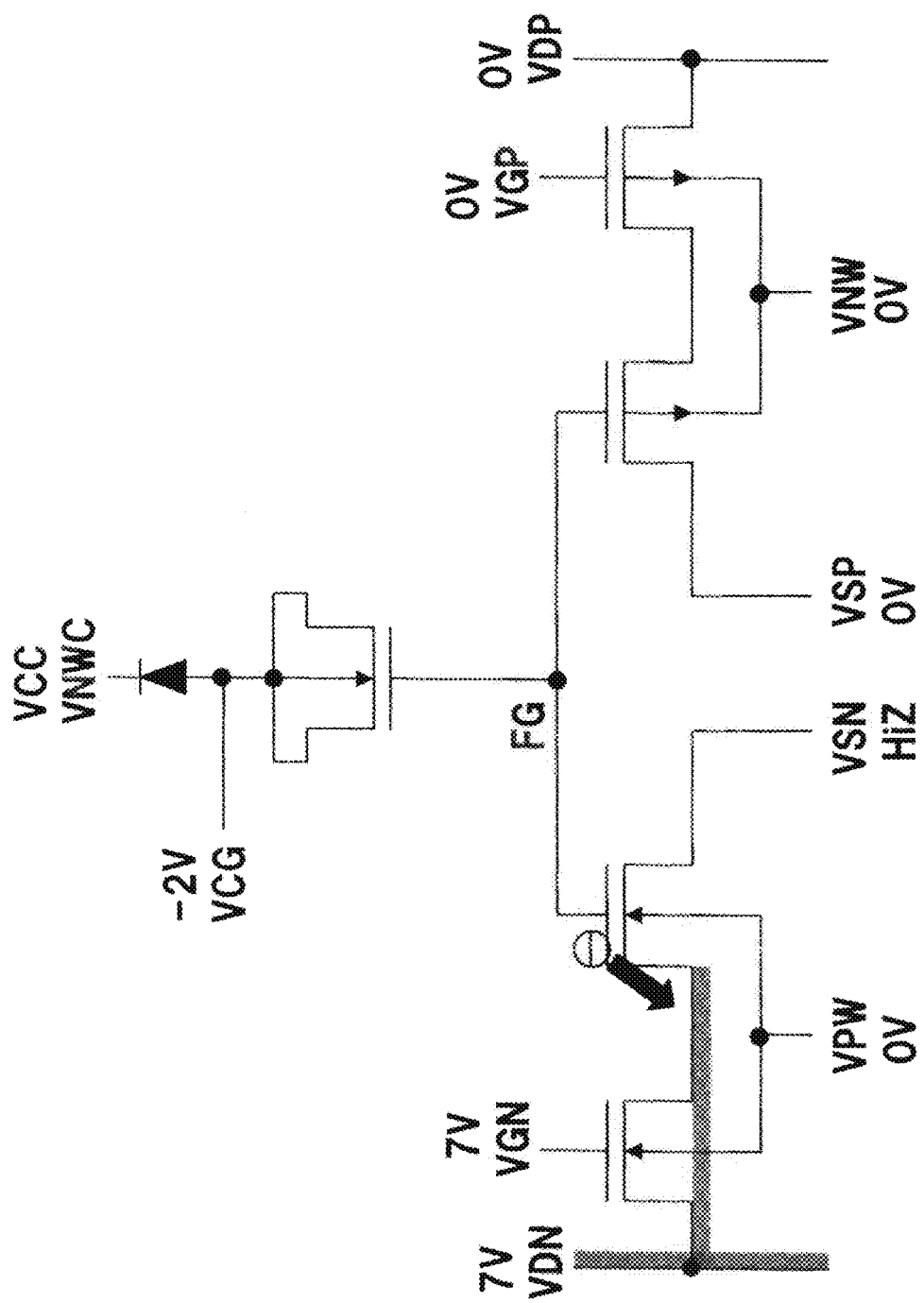
FIG. 44 is one example of a programming operation by FN tunneling in embodiment three.

A programming method of data to a memory cell of embodiment three of the present invention is shown in FIG. 42 to FIG. 44.

FIG. 42 is an example of the application of voltages when using a BTBT-HE injection operation. VDN, VGN, VPW and VSN are all applied with 0V, VDP and VGP are applied with −7V, VNW is applied with 0V and VSP is applied with 0V or placed in a state of high impedance. VNWC and VCG are applied with VCC. As a result, BTBT-HE (Hot Electrons) which are generated in the P+ diffusion/gate overlap region of the FG-PMOS can be injected into the floating gate FG.

FIG. 43 is an example of the application of voltages when using a Back Bias assisted BTBT-HE (B4-HE) injection operation. VDN, VGN, VPW and VSN are applied with 0V, VDP is applied with 0V, VGP is applied with a negative voltage of −2V for example, VNW is applied with 6V, and VSP is applied with 0V, VCC or is placed in a state of high impedance. VNWC and VCG applied with VCC. As a result, BTBT-HE (Hot Electrons) which are generated in the P+ diffusion/gate overlap region of the FG-PMOS can be injected into the floating gate FG.

FIG. 44 is an example of the application of voltages when extracting electrons from FG using an FN tunneling current. VDN and VGN are both applied with 7V, VPW is applied with 0V, VSN is placed in a state of high impedance, VDP, VGP and VNW are applied with 0V and VSP is applied with 0V or is placed in a state of high impedance. VNWC is applied with VCC and VCG is applied with −2V. As a result, electrons can be extracted from the floating gate FG by an FN tunneling mode in the N+ diffusion/gate overlap region of the FG-NMOS.

Figure 45:
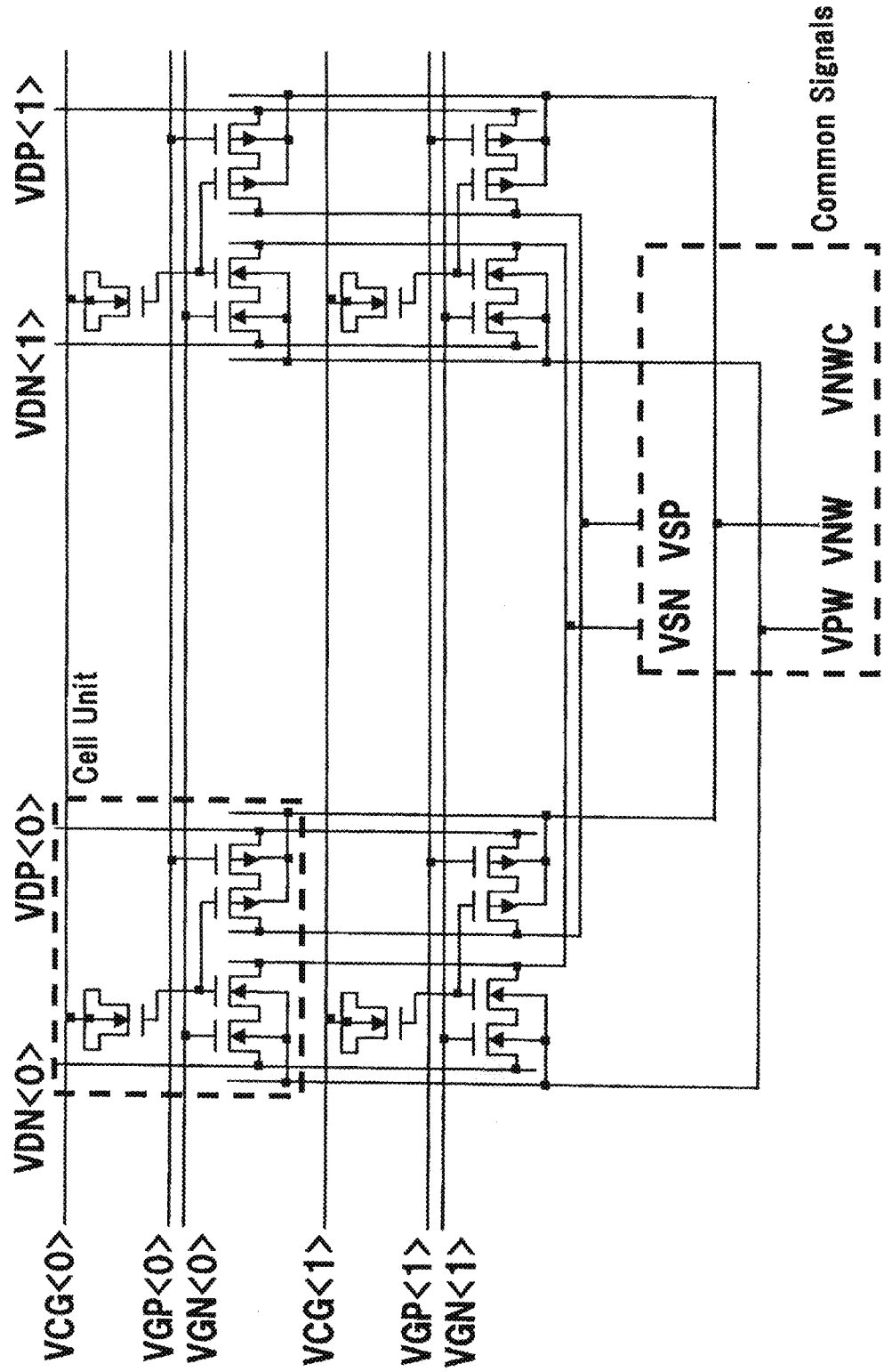
FIG. 45 is an array structure of a memory cell of embodiment three.

An array structure of a memory cell of embodiment three is shown in FIG. 45. This memory cell array has a plurality of memory cell pairs arranged in a matrix as cell units, VGN of memory cells which belong to the same row are commonly connected respectively, VGP of memory cells which belong to the same row are commonly connected respectively, and VDN of memory cells which belong to the same column are commonly connected respectively. In addition, VDP of memory cells which belong to the same column are commonly connected respectively, VSN of memory cells which belong to a plurality of rows and columns are commonly connected, VSP of memory cells which belong to a plurality of rows and columns are commonly connected, VPW of memory cells which belong to a plurality of rows and columns are commonly connected, VNW of memory cells which belong to a plurality of rows and columns are commonly connected and a memory cell array is formed. Furthermore, VCG of memory cells which belong to the same row are commonly connected respectively. VNWC, VSN, VSP, VPW and VNW are driven as common signals of memory cells which belong to a plurality of rows and columns.

Each potential which is applied to each terminal in each operation mode of a nonvolatile semiconductor memory device of embodiment three is shown in FIG. 46A. In equations which express the relationships of each potential is shown in FIG. 46B. Reading is performed in two read columns, READ (1) which senses from the NMOS side and READ (2) which senses from the PMOS side.

FIG. 47 is a specific example of each potential applied to each terminal in each operation mode of the nonvolatile semiconductor memory device of embodiment three. The power supply voltage VCC is shown as 1.8V. HiZ in the diagram shows a high impedance state.

Figure 48:
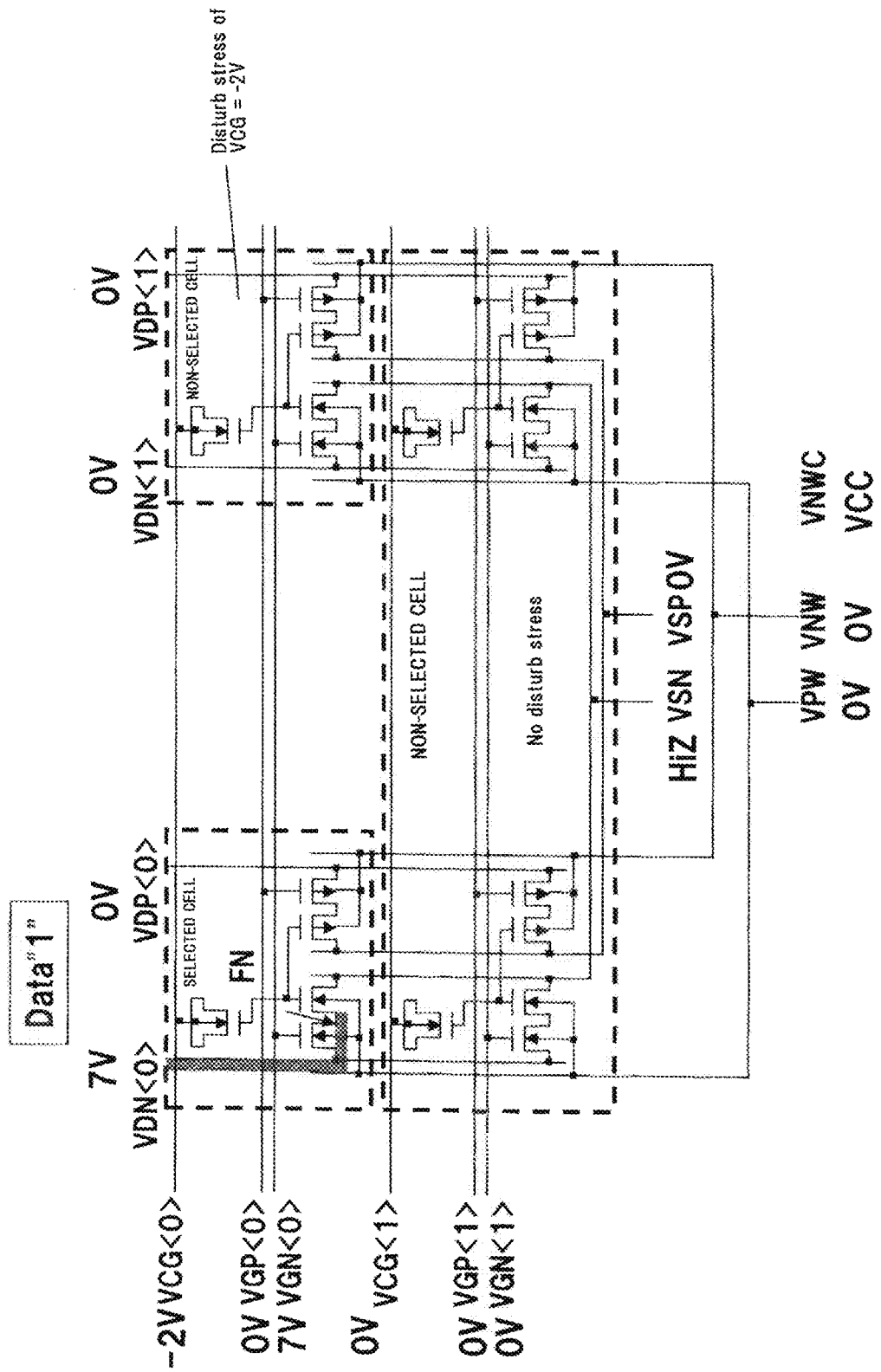
FIG. 48 is a diagram which shows an operation in the case where data "1" is programmed in embodiment three.

FIG. 48 shows the voltages which are simultaneously applied to a selected memory cell and memory cells other than the selected memory cell in a programming step of data "1". 7V is applied to VGN, 0V is applied to VGP, −2V is applied to VCG of a selected row, and 0V is applied to VGN, VGP and VCG of all other rows. 7V is applied to VDN and 0V is applied to VDP in a column of a selected cell and 0V is applied to VDN and VDP of all other columns. VSN is placed in HiZ and 0V is applied commonly to VSP, VPW and VNW. Data "1" is programmed by extracting electrons from a floating gate by an FN tunneling mode in the N+ diffusion/gate overlap region of a FG-NMOS. Here, among the non-selected cells, disturb stress does not affect cells which belong to other rows. Furthermore, among non-selected memory cells which belong to the same row as a selected memory cell, disturb stress of VCG=−2V is applied to cells which belong to a different column.

In this way, an erase operation such as that in a flash memory is no longer required, programming of data "1" can be realized for each bit and it is possible to realize EEPROM specifications. In order to increase the speed of extraction of electrons from a floating gate by FN tunneling, a select VCG voltage is set at a negative voltage (for example, −2V).

Figure 49:
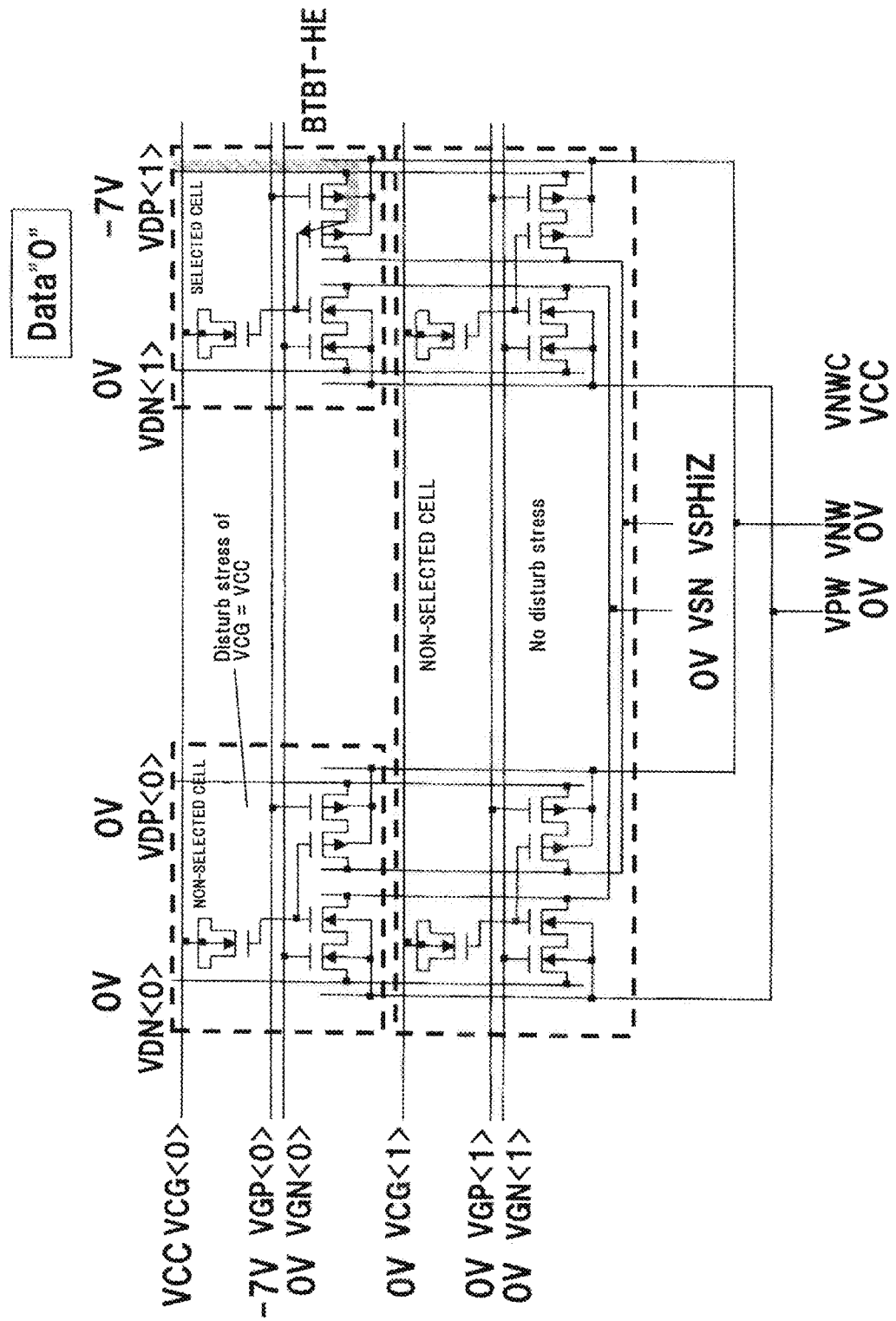
FIG. 49 is a diagram which shows an operation in the case where data "0" is programmed in embodiment three.

FIG. 49 shows the voltages which are simultaneously applied to a selected memory cell and memory cells other than the selected memory cell in a programming step of data "0. 0V is applied to VGN, −7V is applied to VGP, VCC is applied to VCG of a selected row, and 0V is applied to VGN and VGP of all other rows, and 0V is applied to VDN and −7V is applied to VDP in a column of a selected cell and 0V is applied to VDN and VDP of all other columns. VSP is placed in HiZ and 0V is applied commonly to VNWC, VSN, VPW and VNW. Data "0" is programmed by injecting electrons which are generated by a BTBT-HE mode into a floating gate in the P+ diffusion/gate overlap region of a FG-PMOS. Here, disturb stress does not affect non-selected cells which belong to other rows other than the row of the selected cell, however, among non-selected memory cells which belong to the same row as a selected memory cell, disturb stress of VCG=VCC is applied to cells which belong to a different column.

In this way, an erase operation such as that in a flash memory is no longer required, programming of data "0" can be realized for each bit and it is possible to realize EEPROM specifications. In order to increase the speed of injection of electrons into a floating gate by BTBT-HE, a select VCG voltage is set at a positive voltage (for example, VCC).

Figure 50:
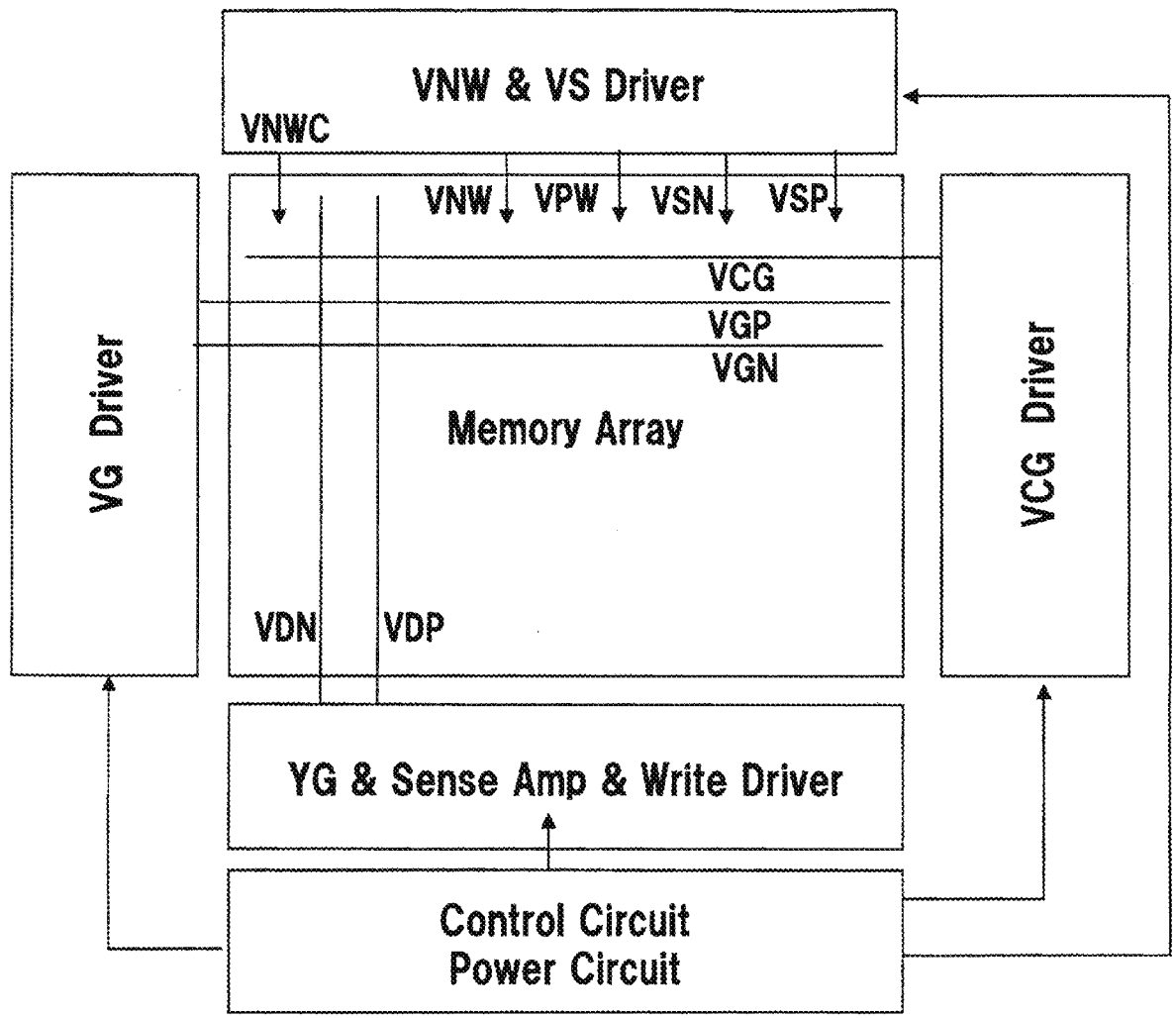
FIG. 50 is a diagram which shows the entire structure of a nonvolatile semiconductor memory device macro which uses the memory cell of embodiment three.

FIG. 50 shows an entire circuit structure of a nonvolatile semiconductor memory device which uses the memory cell of embodiment three, and compared to the device shown in FIG. 21, a VNW driver for VNWC and VCG driver are added.

Embodiment Four

Next, embodiment four of the present invention will be explained while referring to FIG. 51 to FIG. 57. In embodiment four, two memory cells are made a pair forming a memory cell pair and one (first memory cell) is complementarily programmed with data as a T side element and the other (second memory cell) is complementarily programmed with data as a B side element. In the explanation below, elements which are not particularly shown in the diagrams are the same as in embodiments one, two and three.

Figure 51:
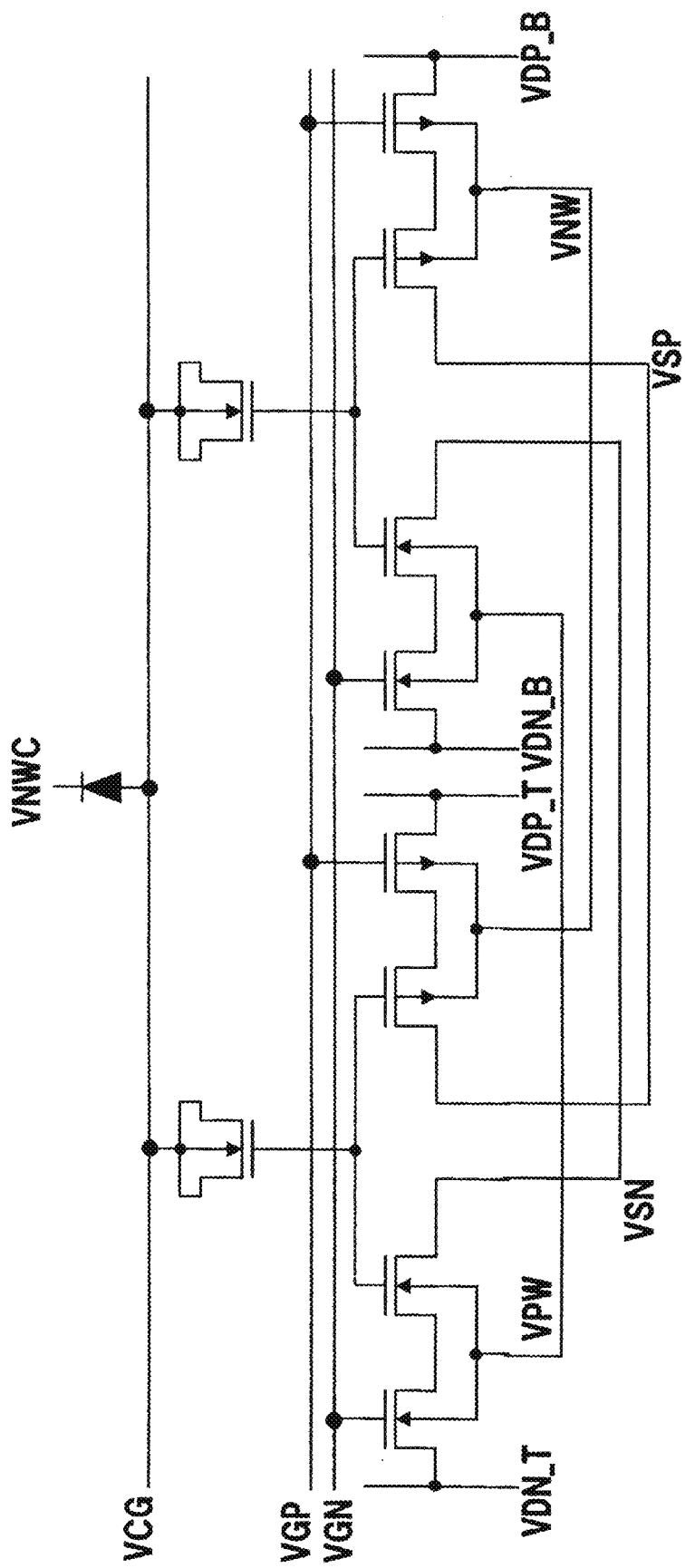
FIG. 51 is an equivalent circuit diagram of the memory cell of embodiment four.

An equivalent circuit view of a memory cell in embodiment four is shown in FIG. 51. VDN_T and VDP_T of the T side element are terminals connected to a sense amplifier or a programming driver, and VDN_B and VDP_B of the B side element are also terminals connected to a sense amplifier or programming driver, and VSN and VSP are terminals connected to a common source line. An MNT transistor and an MPT transistor of the T side element share a floating gate FG_T. An MNB transistor and an MPB transistor of the B side element share a floating gate FG_B. An N type select transistor and the MNT transistor of the T side element and an N type select transistor and the MNB transistor of the B side element share a well and its terminal is VPW. A P type select transistor and the MPT transistor of the T side element and a P type select transistor and the MPB transistor of the B side element share a well and its terminal is VNW. Furthermore, the other end of both T side and B side capacitor elements are commonly connected to VCG.

Above, two nonvolatile semiconductor memory elements (T side element, B side element) form a memory cell in which VSN, VSP, VPW and VNW are connected as a common wire and data is read using a sense amplifier circuit by the current difference of the N type MOS transistors MNT and MNB or the current difference of the P type MOS transistors MPT and MPB which occurs due to the difference between the FG_T potential of the T side element and the FG_B potential of the B side element.

In this way, by adopting a pair element structure, a sense margin is expanded leading to an increase in reliability.

Figure 52:
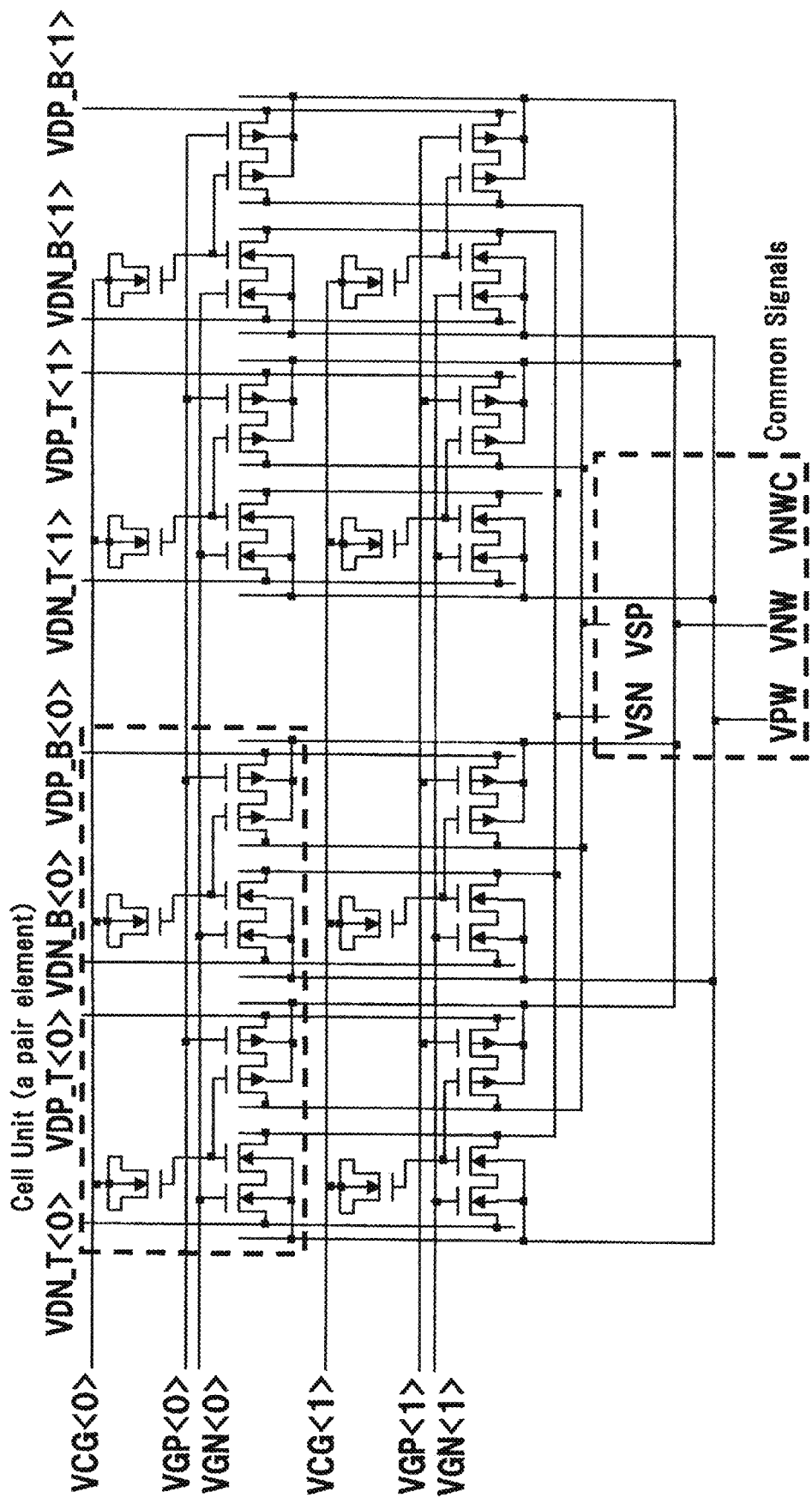
FIG. 52 is an array structure of the memory cell of embodiment four.

An array structure of the memory cell of embodiment four is shown in FIG. 52. This memory cell array includes a plurality of memory cell pairs as cell units arranged in a matrix, VGN of a pair of memory cells which belong to the same row are commonly connected respectively, and VGP of a pair of memory cells which belong to the same row are commonly connected respectively. VCG's which belong to the same row are commonly connected respectively. VDN_T and VDN_B of a pair of memory cells which belong to the same column are commonly connected respectively. VDP_T and VDP_B of a pair of memory cells which belong to the same column are commonly connected respectively, VSN of memory cells which belong to a plurality of rows and columns are commonly connected respectively, VSP of memory cells which belong to a plurality of rows and columns are commonly connected respectively, VPW of memory cells which belong to a plurality of row and columns are commonly connected respectively, VNW of memory cells which belong to a plurality of rows and columns are commonly connected respectively and a memory cell array is formed. VNWC, VSN, VSP, VPW and VNW are driven by signal common to memory cells which belong to a plurality of rows and columns.

A chart which shows each potential applied to each terminal in each operation mode of the nonvolatile semiconductor device of embodiment four is shown in FIG. 53A. In equations which express the relationships of each potential is shown in FIG. 53B. Here, Reading is performed in two read ways, READ (1) which senses from the NMOS side and READ (2) which senses from the PMOS side.

FIG. 54 is a specific example of each potential applied to each terminal in each operation mode of the nonvolatile semiconductor memory device of embodiment four. The power supply voltage VCC is shown as 1.8V. HiZ in the diagram shows a high impedance state.

Figure 55:
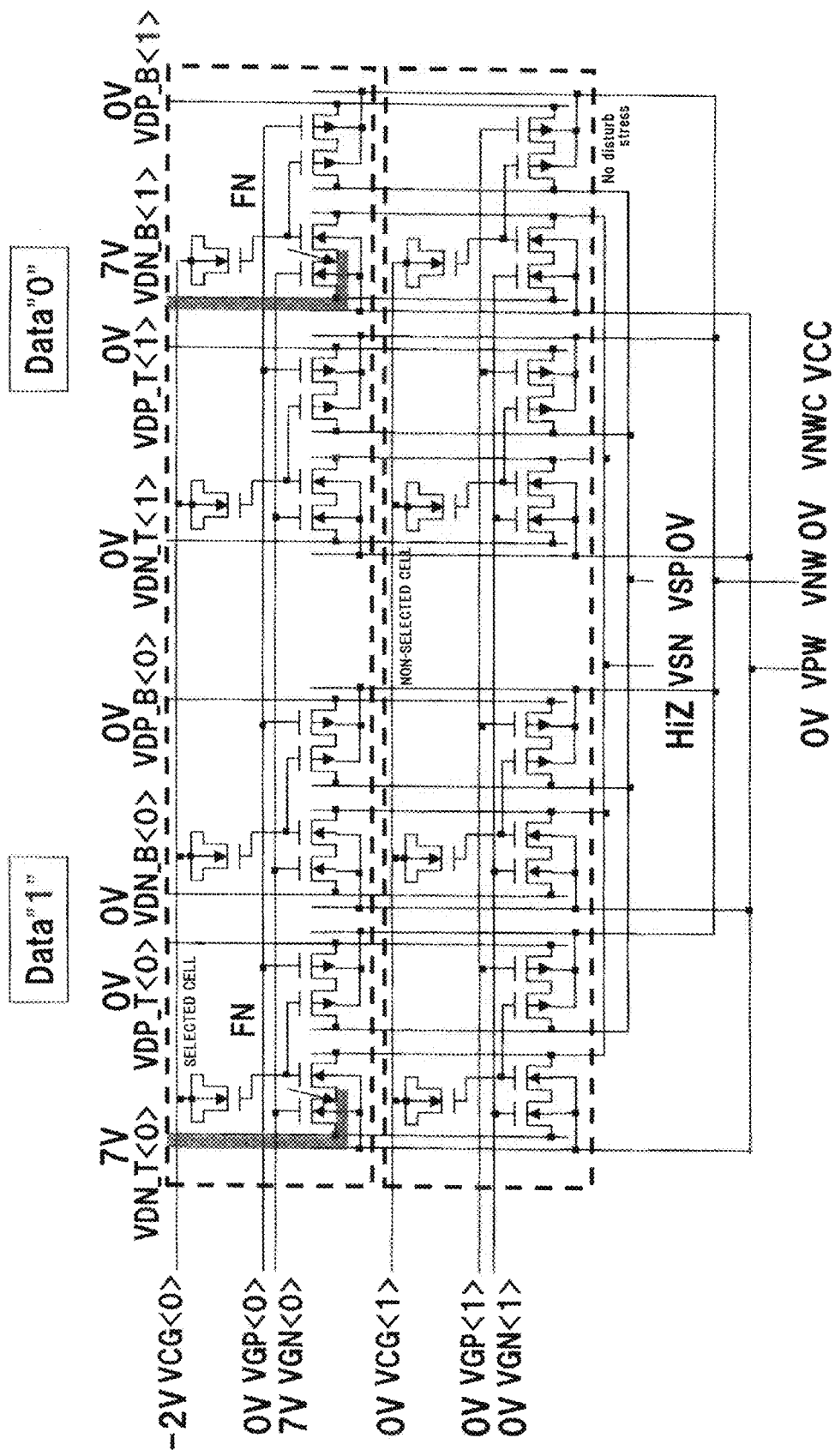
FIG. 55 is a diagram which shows a programming operation by FN tunneling in embodiment four.

FIG. 55 shows the voltages which are simultaneously applied to a selected memory cell and memory cells other than the selected memory cell in a first programming step. In step one of a two step method only an FN operation is performed. In order to increase the speed of extraction of electrons from a floating gate by FN tunneling, a select VCG voltage is set as a negative voltage (for example −2V). Here, disturb stress does not affect non-selected memory cells which belong to rows different to the selected cell.

Figure 56:
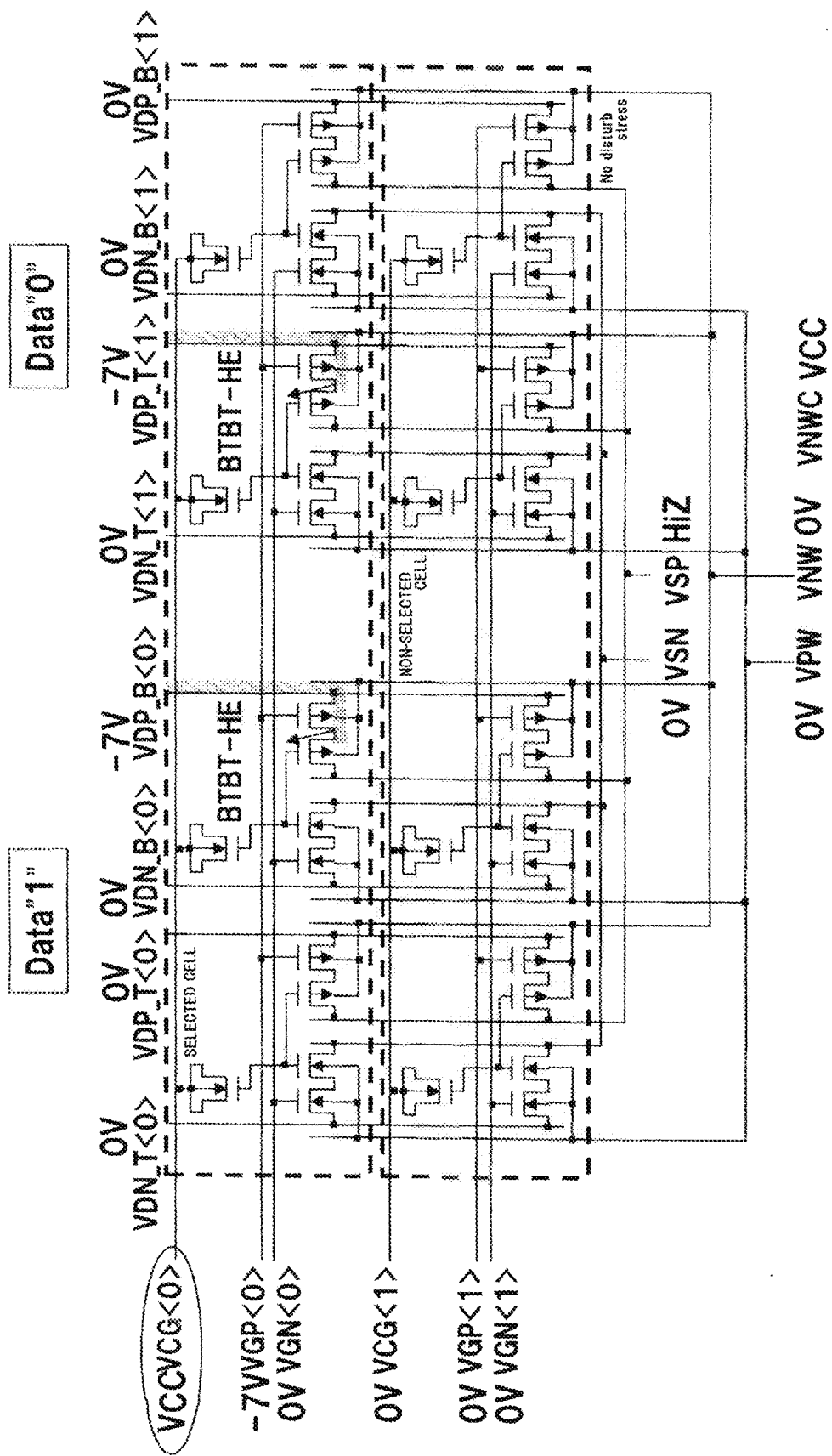
FIG. 56 is a diagram which shows a programming operation by BTBT-HE in embodiment four.

FIG. 56 shows the voltages which are simultaneously applied to a selected memory cell and memory cells other than the selected memory cell in a second programming step. In step two of a two step method only a BTBT-HE operation is performed. In order to increase the speed of injection of electrons into a floating gate by BTBT-HE, a select VCG voltage is set as a positive voltage (for example VCC). Here, disturb stress does not affect non-selected memory cells which belong to rows different to the selected cell.

Even in the programming method described above, an erase operation such as that in a flash memory is no longer required, programming of data "1" and data "0" can be realized for each bit and it is possible to realize EEPROM specifications. Furthermore, in FIG. 55 only one type of high positive voltage is used and in FIG. 56 only one type of high negative voltage is used. Therefore, it is also possible for charge pumps to be shared.

Figure 57:
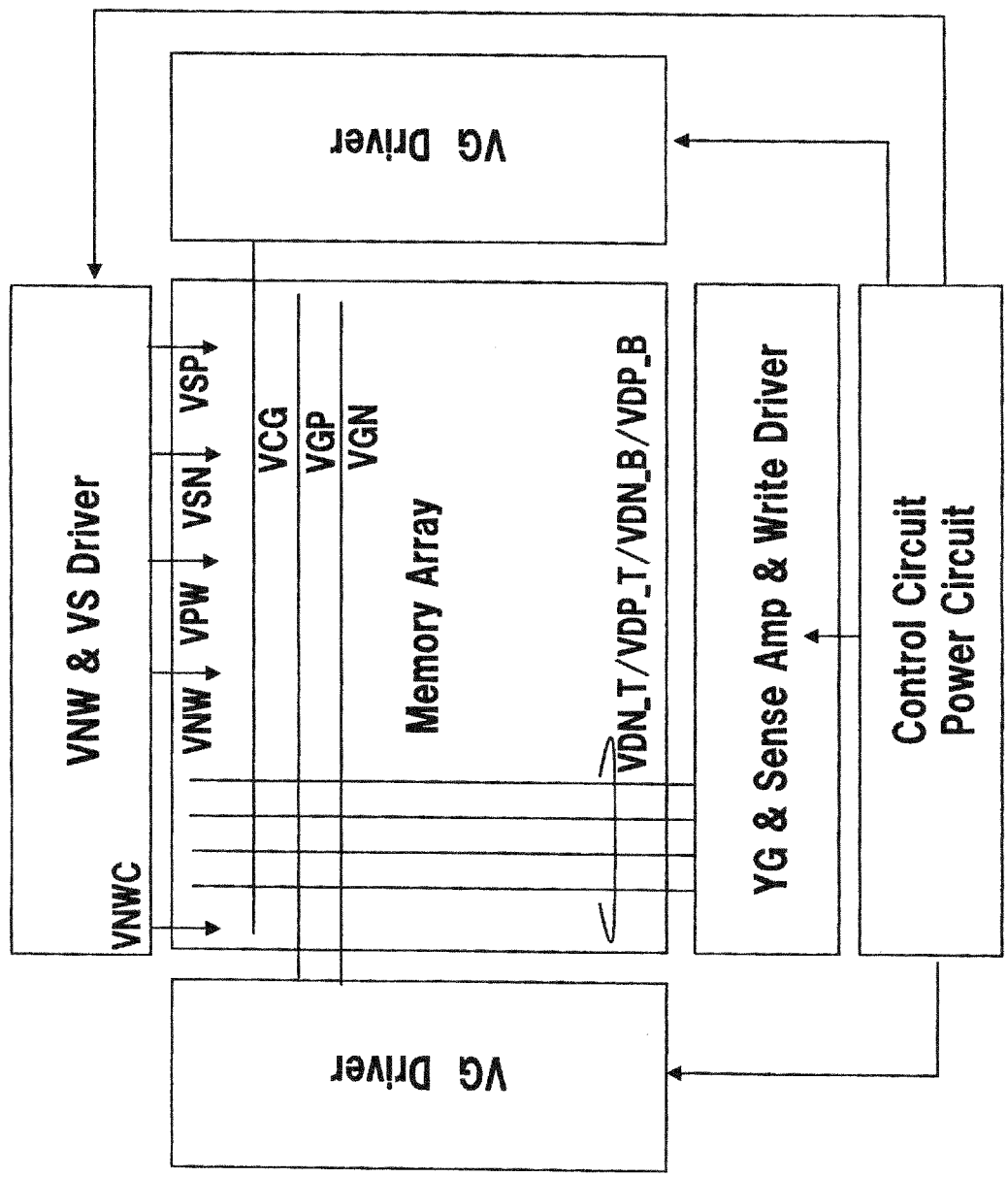
FIG. 57 is a diagram which shows the entire structure of a nonvolatile semiconductor memory device macro which uses the memory cell of embodiment four.

FIG. 57 shows an entire circuit structure of the nonvolatile semiconductor memory device which uses a memory cell of embodiment four and in the case where this is used in consolidation with other logic core (DSP, CPU and each type of driver and controller logic etc) which are formed using a standard CMOS, the nonvolatile semiconductor memory device is proposed as a nonvolatile semiconductor memory device macro. The differences between that of FIG. 52 are that a column select gate (YG), sense amplifier and a program driver for applying a voltage when programming are connected to VDN_T, VDP_T, VDN_B and VDP_B.

In this way, the characteristics of the present invention are that it is possible to realize a structure as an array operation in which disturb stress is not present. Moreover, because BTBT-HE injection and FN tunneling electron extraction can be realized simultaneously in the present invention, it is possible to program "Data 1" and "Data 0". This means that an EEPROM in which byte unit data can be reprogrammed can be realized by a standard CMOS process. Because an operation current in both the BTBT-HE mode and FN tunneling mode is small, a suitable structure can be realized for systems in which low power consumption is requested.

In the present invention, while reducing cell area size, it is possible to improve programming disturb characteristics and by adopting an array structure it is also possible to expand a sense margin and improve reliability.

Furthermore, the other embodiments of the present invention will be explained below while referring to the diagrams.

Figure 58:
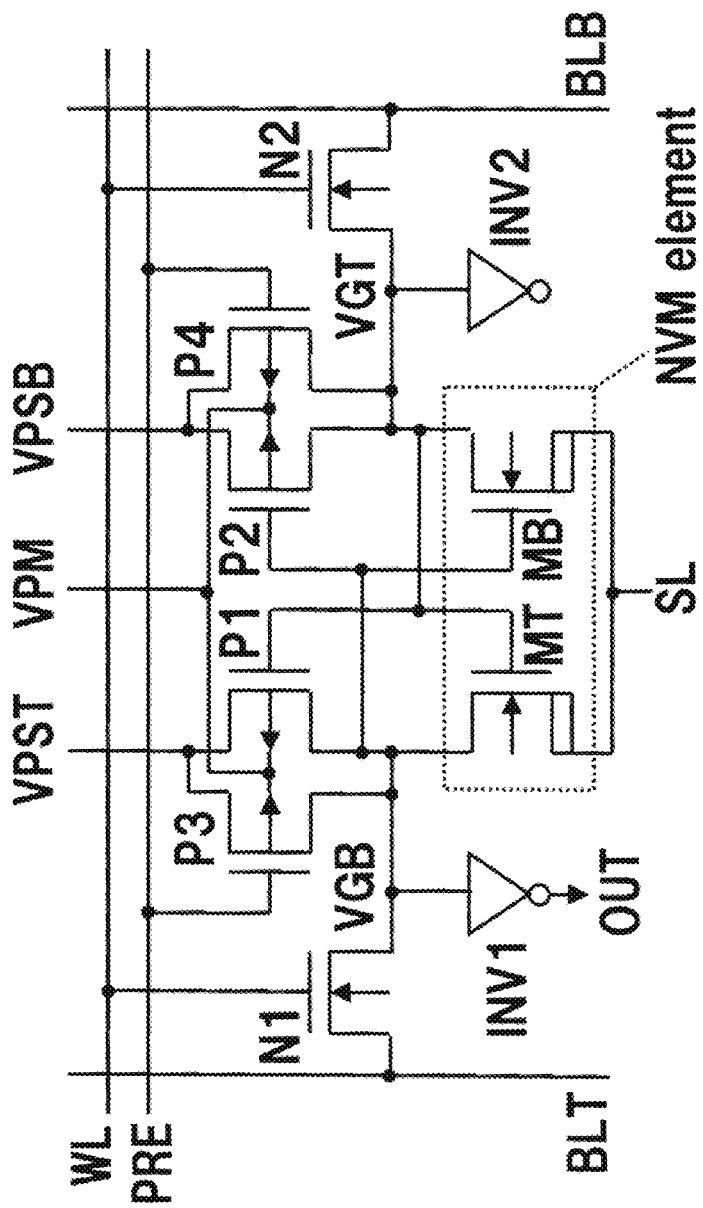
FIG. 58 is an example of a memory cell structure applied to a high voltage driver circuit of the present invention.

An example of the side spacer type memory cell is shown in FIG. 58 as another embodiment of the present invention. The NMOS transistors MT, MB perform the role of storing nonvolatile data within a memory cell. The threshold voltage is changed by accumulating a charge in the SL side side-spacer part of each MT, MB. MT and MB have a complementary type structure and data is determined based on the difference between their respective threshold voltages. The determined data is stored in a latch which is comprised of MT, MB and PMOS transistors MP1, MP2, and externally output by an inverter INV1.

Each operation condition is summarized in FIG. 59. A CHE-injection phenomenon is used in a programming operation. Depending on the programming data, the threshold voltage is increased by accumulating a charge by CHE-injection in the SL side side-spacer part of one of either MT or MB. For example, when data "0" is programmed, the threshold voltage of the MT side is increased more than the MB side and in the case of data "1", the reverse is true. The programming voltage VPP_P is above 6V and this high voltage is applied to the signals SL, VPM, VPST, VPSB and PRE of the memory cell.

However, an AHH-injection phenomenon is used in an erasure operation. Holes are accumulated by AHH-injection in the SL side side-spacer part of both MT and MB and the threshold voltage is reduced by neutralizing the electrons injected by a programming operation. The erasure voltage VPP_E is about 9V and this high voltage is applied to the SL signal of a memory cell. A restore operation is an operation which stores information decided according to the threshold voltage difference between MT and MB in the latch comprised by the four transistors MT, MB, MP1 and MP2.

Figure 60:
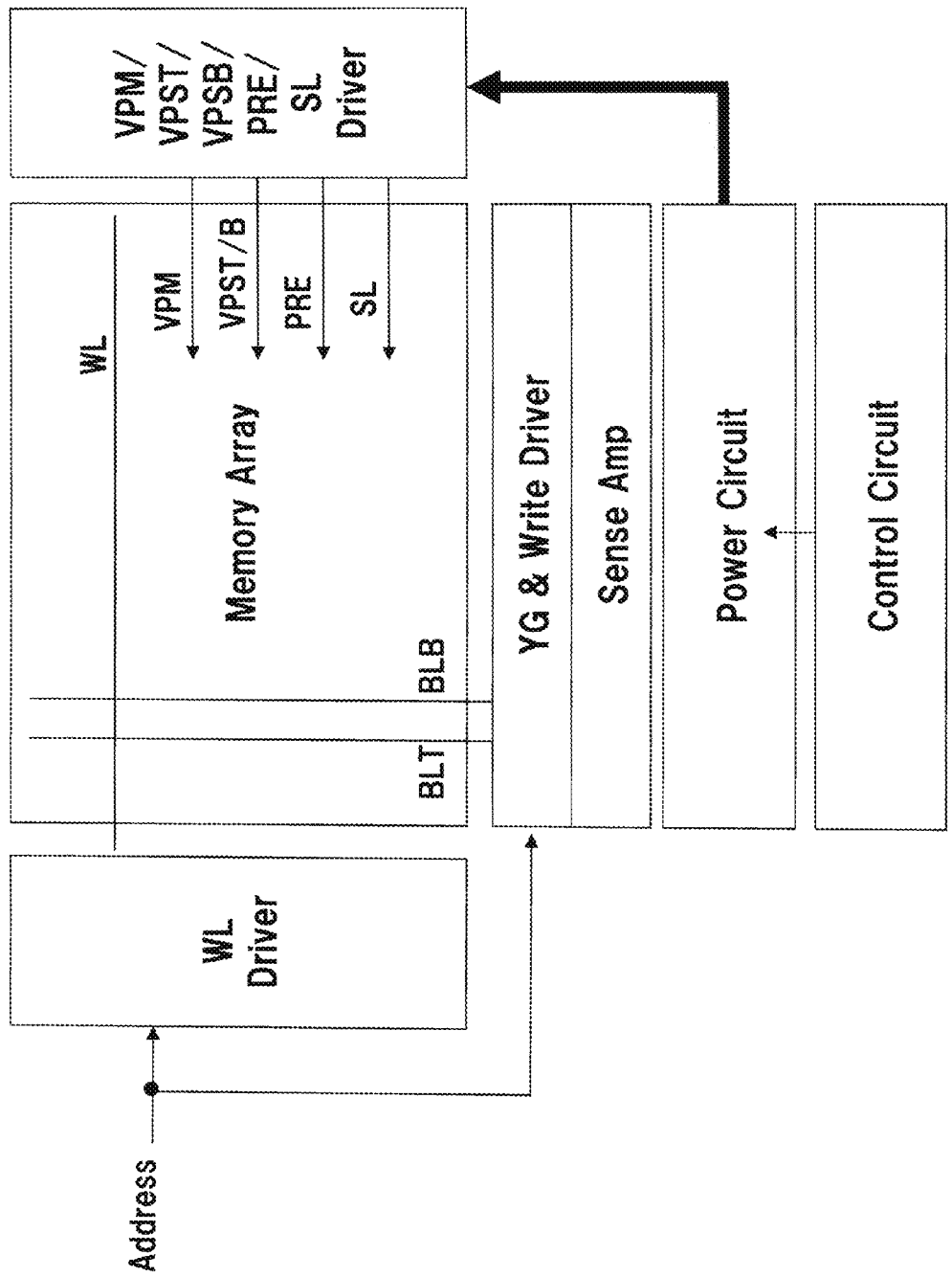
FIG. 60 is an example of a structure of nonvolatile semiconductor memory device which includes a high voltage driver circuit of the present invention.

FIG. 60 shows a block construction of the above stated memory cells and also includes periphery circuits for controlling memory cells which are arranged in a matrix. In this memory cell construction, because a word line driver for controlling a word line WL, a column control driver for controlling a bit line BLT and BLB and a program driver can be controlled by a logic signal level, it is possible to be formed by a logic transistor in a standard CMOS process.

However, because the signals VPM, VPST, VPSB, PRE and SL require a voltage higher than a power supply voltage at the time of programming and erasure, a procedure for generating this high voltage and a procedure for handling the generated high voltage to the memory array is required. A voltage of about 6V is required for the signals VPM, VPST, VPSB and PRE at the time of programming, however, if the voltage is within this high voltage range handling is possible by an I/O transistor (gate oxide film thickness: about 7 nm) used in a standard CMOS process. However, because the SL signal requires about 9V at the time of erasure, circuitry adjustments are required.

Figure 61:
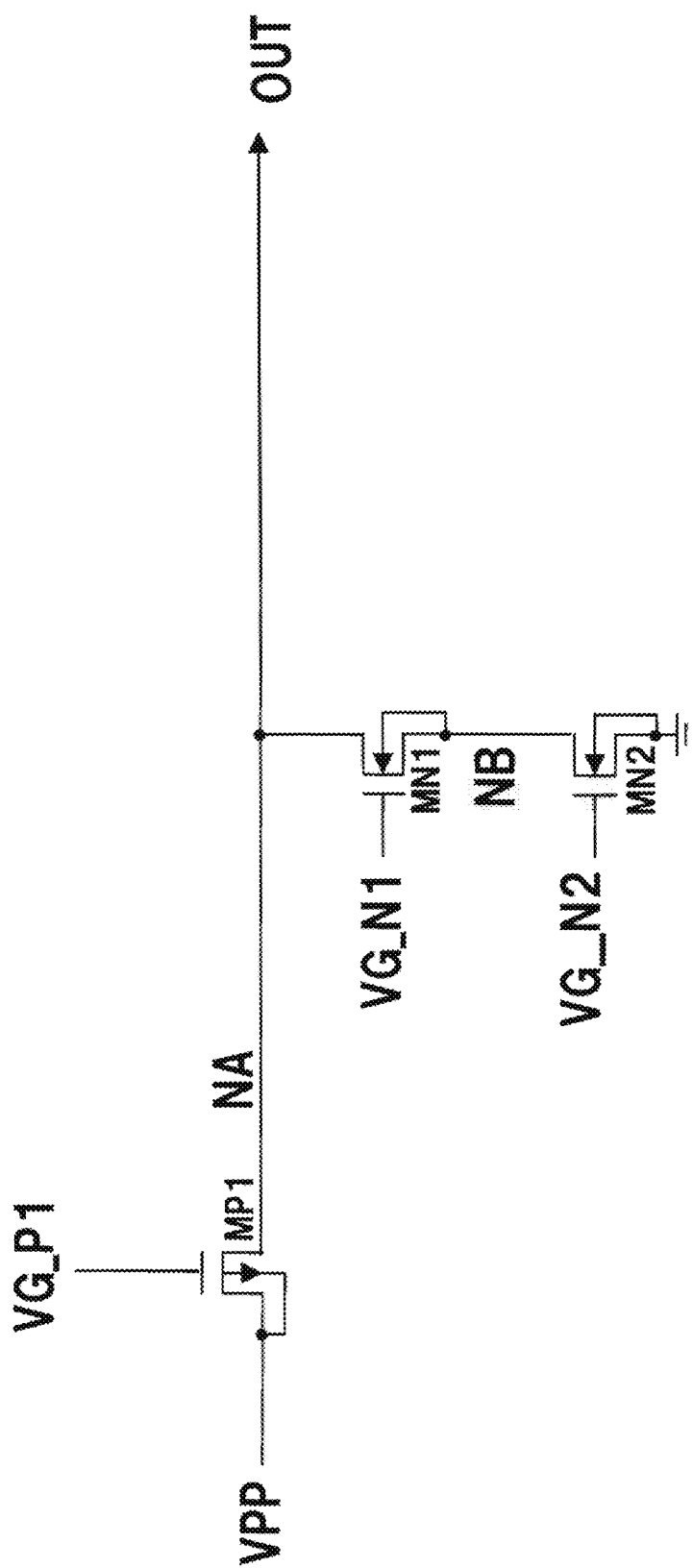
FIG. 61 is an example of a high voltage driver circuit which is used in the nonvolatile semiconductor memory device of the present invention (designed by the process of the present invention).

FIG. 61 shows a high voltage driver circuit of a NOEMI construction which was designed when the inventor arrived at the present invention while referring to Patent Document 3. There is a path for outputting VPP via the PMOS transistor MP1 and a path for resetting to a GND level via the NMOS transistors MN1 and MN2 which are mutually connected in series. Here, MN1 performs the role of NOEMI. The gate potential VG_P1 of MP1 is controlled by a level conversion circuit and by converting a 0V/VCC logic signal level to 0V/VPP, ON and OFF of MP1 is controlled.

Figure 62A:
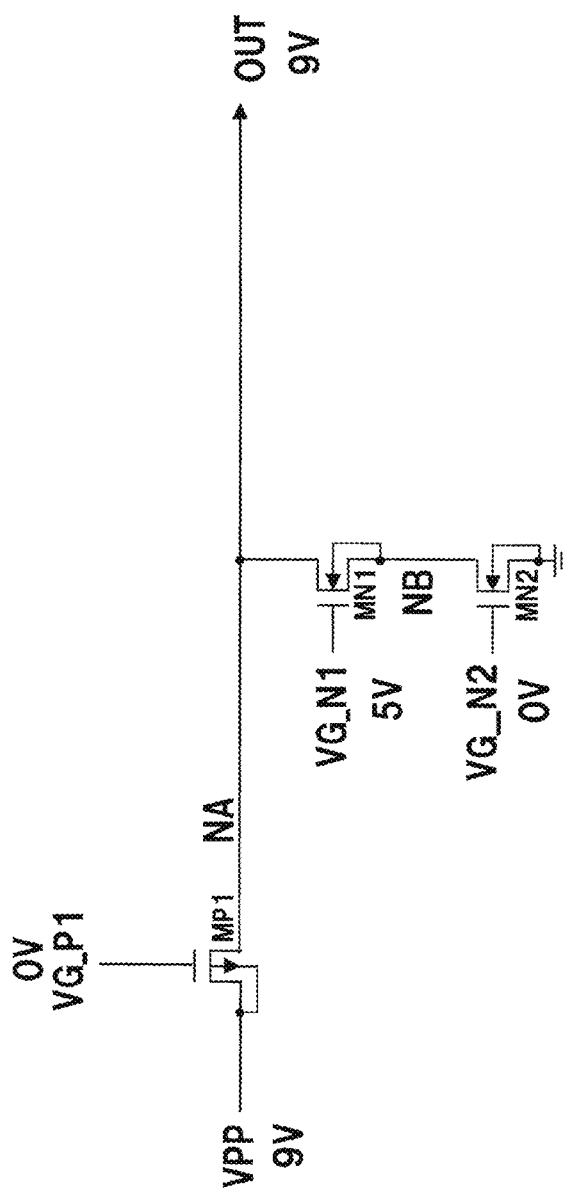
FIG. 62A is an example of the voltage application conditions (when erase is selected) of the high voltage driver of FIG. 67.
Figure 62B:
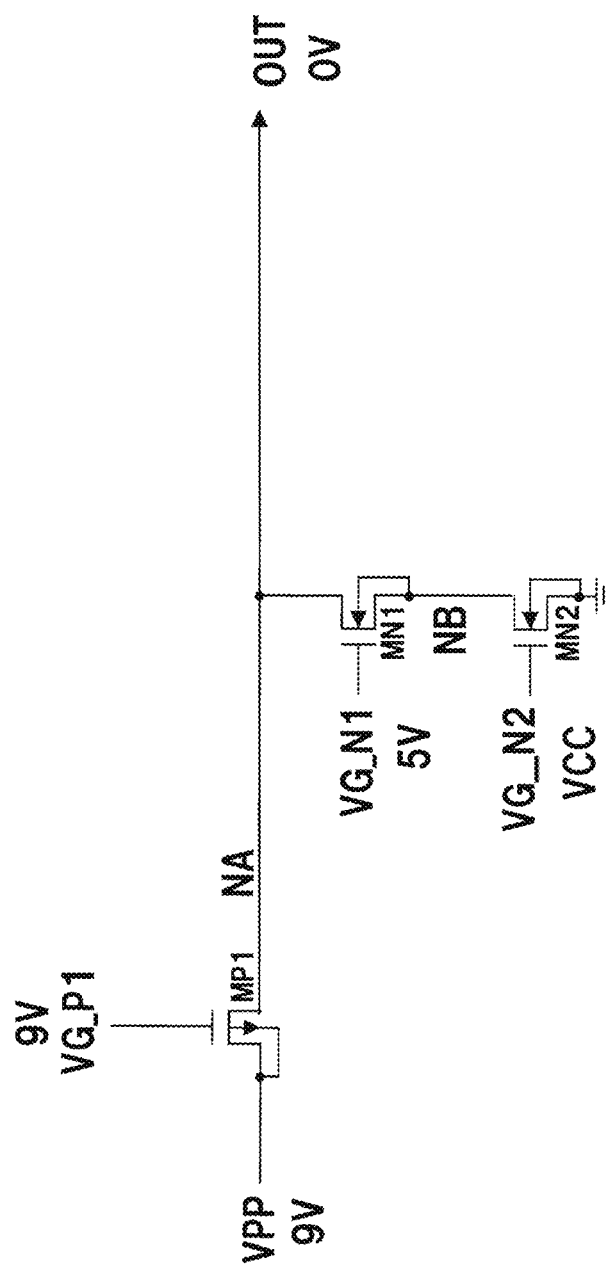
FIG. 62B is an example of the voltage application conditions (when erase is non-selected) of the high voltage driver of FIG. 67.

FIG. 62A and FIG. 62B shows the voltage conditions at the time of erasure in a high voltage driver. FIG. 62A shows the case where 9V is applied to the selection SL. The gate potential VG_N1 of MN1 is set at 5V and the gate potential VG_N2 of M2 is set at 0V. MN2 is switched OFF and a potential of a central node NB of MN1 and MN2 which are connected in series is decided at about 4V by a source follower of MN1. However, in this state, MN1 is in a high impedance state and in the case where the node NB has a noise which becomes higher than 4V, MN1 is switched OFF and there is a danger that an electrical field stress is applied between the source and drain and between the gate and drain of M2. However, when VPP (9V) is output via MP1, the gate voltage VG_P1 of MP1 is set at 0V and in this voltage conditions, a gate electrical field stress of 9V is applied to MP1.

FIG. 62B shows the case where 0V is applied to the non-selection SL. By setting the gate potential VG_N1 of MN1 at 5V and the gate potential VG_N2 of MN2 at VCC, MN1 and MN2 are switched ON and 0V is output. At this time, the gate potential VG_P1 is set at VPP (9V) and MP1 is switched OFF. In this voltage condition, an electrical field stress of 9V is applied between the source and drain of MP1.

As is shown in FIG. 62A and FIG. 62B, in a NOEMI construction, there is a problem in that when 9V is handled, a gate electric field stress and a source drain electrical field stress of 9V is applied to the PMOS transistor. In addition, concern remains for electrical field stress in the case where the central node of NMOS transistors connected in series in a NOEMI construction become floating. This type of electrical field stress is a voltage range which exceeds the specifications of the I/O transistor used in a standard CMOS logic process and is not desired in circuit operations.

The present invention aims to propose a high voltage driver circuit and a level conversion circuit which solves the electrical field stress problem stated above and a preferred nonvolatile semiconductor memory device which uses these.

In order to solve the above stated problem, a level conversion circuit is proposed in the present invention comprised of a first conversion circuit which is connected between a first terminal which is applied with a first predetermined voltage and a second terminal which is applied with a second predetermined voltage and which converts a first input signal to either the first predetermined or the second predetermined potential and outputs, and a second conversion circuit which is connected between a third terminal which is applied with a third predetermined potential and a fourth terminal which is applied with a fourth predetermined potential and which converts a second input signal to either the third predetermined potential or the fourth predetermined potential and outputs according to the output of the first conversion circuit.

The level conversion circuit of the present invention may further include an inversion circuit which inverts and outputs the output of the first conversion circuit which is connected between the first terminal and the fourth terminal may also as a second input signal.

In the level conversion circuit of the present invention, the output if the first conversion circuit is a complementary output and the inversion circuit may also include at least two inverter circuits which invert each of the complementary outputs.

In the level conversion circuit of the present invention, the inversion circuit may include a first inversion circuit which inverts and outputs an output of the first conversion circuit and a second inversion circuit inverts and outputs an output of the first inversion circuit, and the output of the first inversion circuit and the output of the second inversion circuit may be supplied to the second conversion circuit as a second output signal.

The level conversion circuit of the present invention may further include a third conversion circuit which is connected between the first terminal and the fourth terminal and which converts an output of the first conversion circuit to a first predetermined potential or a fourth predetermined potential and outputs as a second input signal.

The level conversion circuit of the present invention may further include a third conversion circuit which is connected between a fifth terminal which is applied with a fifth predetermined potential and a sixth terminal which is applied with a sixth predetermined potential and which converts an output of the first conversion circuit to the fifth predetermined potential or the sixth predetermined potential and outputs as a second input terminal.

In the level conversion circuit of the present invention, it is preferred that the fifth predetermined potential is higher than the first predetermined potential and lower than the third predetermined potential, and the sixth predetermined potential is higher than the second predetermined potential and lower than the fourth predetermined potential.

In the level conversion circuit of the present invention, it is preferred that the first input signal takes a first input signal potential and a second input signal potential, and either the first input signal potential or the second input signal potential is lower than the first predetermined potential and the second predetermined potential.

In the level conversion circuit of the present invention, it is preferred that either the first predetermined potential or the second predetermined potential is lower than the third predetermined potential and the fourth predetermined potential.

Furthermore, in order to achieve the above stated aims, the present invention proposes a high voltage driver circuit which includes a first PMOS transistor which is connected between a first power supply terminal and a central node and which is driven by an output of the second conversion circuit of the level conversion circuit of the present invention stated above, and a second PMOS transistor which is connected between a central node and an output terminal.

The high voltage driver circuit may further include a first NMOS transistor which is connected between a second power supply voltage terminal and a central node.

Furthermore, in order to achieve the above stated aims, the present invention proposes a nonvolatile semiconductor memory device which includes a nonvolatile memory transistor connected to a source line and in which the source line is driven by the high voltage driver circuit of the present invention stated above.

In the nonvolatile semiconductor memory device of the present invention, a nonvolatile memory transistor may store data by changing a threshold voltage by accumulating a charge in a side-spacer of an NMOS transistor.

Figure 63:
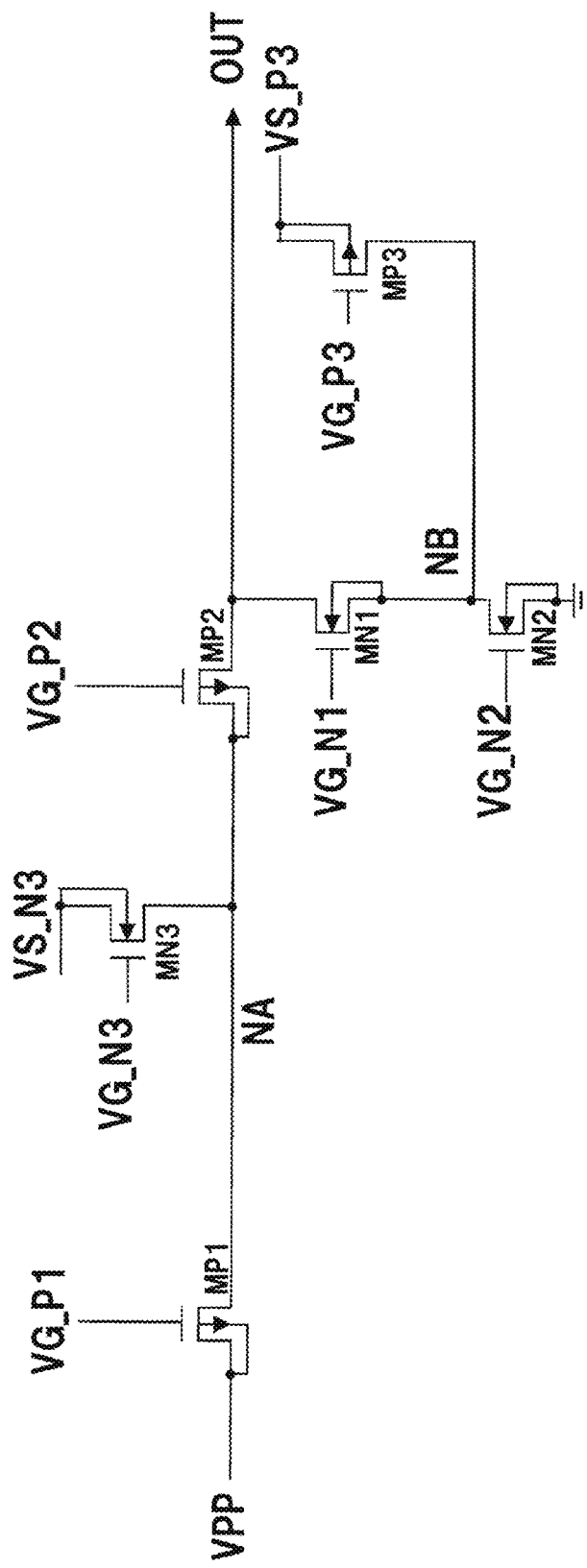
FIG. 63 is circuit diagram which shows one embodiment of the high voltage driver of the present invention.

A representative structure of the above stated invention is as shown in FIG. 63. That is, a NOEMI structure is also adopted for the PMOS side which becomes the path for outputting VPP. Among the PMOS transistors MP1 and MP2 which are connected in series, MP2 performs the role of NOEMI. By applying a higher voltage than 0V as the gate potential VG_P2 of MP2, the electrical field stress of MP2 is relieved. By applying VP (>0V)/VPP and not 0V/VPP as the gate potential VG_P1 of MP1, the electrical field stress of MP1 is relieved. In order to prevent the central node NA of MP1, MP2 which are connected in series from becoming a floating state, a NMOS transistor MN3 for supplying a potential to the node NA is added. In addition, in order to prevent the central node NB of MN1, MN2 which are connected in series from becoming a floating state, a PMOS transistor MP3 for supplying a potential to the node NB is added.

There is a need for the level conversion circuit for controlling the gate potential VG_P1 of MP1 to convert a 0V/VCC logic signal level to VP (>0)/Vpp. While a level can be converted in a usual one stage construction CVSL circuit electrical field stress cannot be relieved. Thus, in the present invention, as is cited in FIG. 65, FIG. 66, FIG. 67, FIG. 70 and FIG. 73, by adopting a structure in which a plurality of level conversion circuits are connected a voltage is gradually changed and electrical field stress to a transistor is relieved.

The representative effects of the present invention in a transistor which is formed by a standard CMOS logic process are that it is possible to handle a voltage higher than the specifications of usual electrical field stress and it is possible to realize a nonvolatile memory of a standard CMOS process.

A high voltage driver circuit in the present invention is shown in FIG. 63. There is a path for outputting VPP via PMOS transistors MP1 and MP2 which are mutually connected in series, and a path for resetting to GND level via NMOS transistors MN1 and MN2. The NMOS transistor MN3 performs the role of a switch which supplies VS_N3 (>0V) to the central node NA of MP1 and MP2. The PMOS transistor MP3 performs the role of a switch for supplying VS_P3 (>0V) to the central node NB of MN1 and MN2.

Figure 64A:
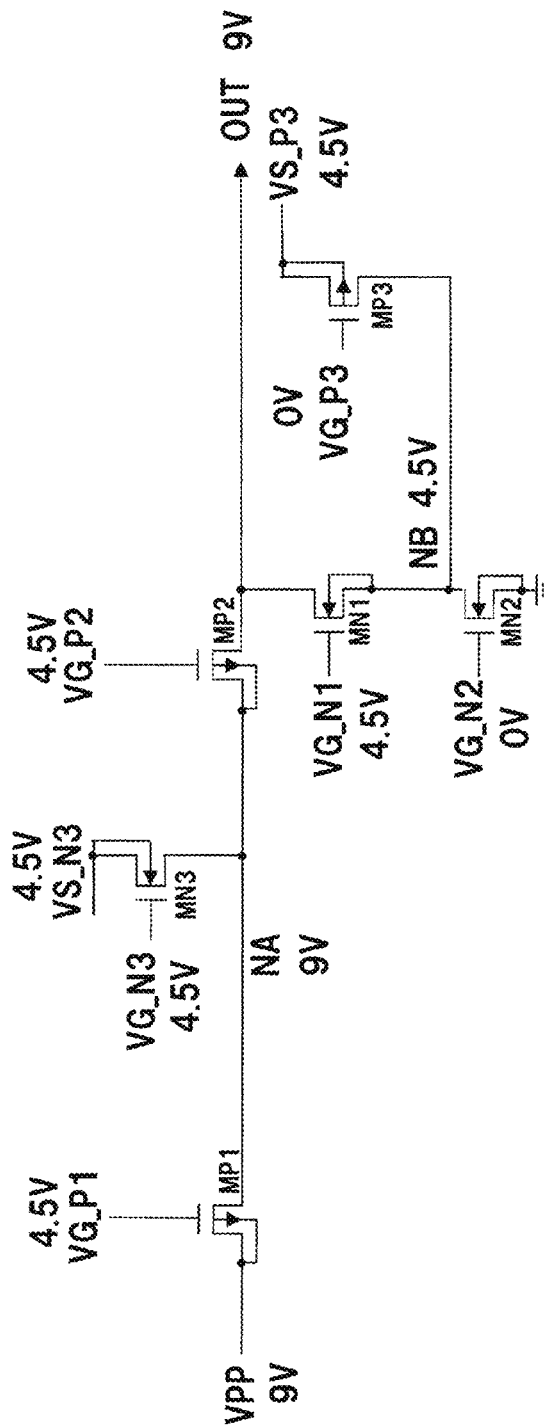
FIG. 64A is an example of the voltage application conditions (when erase is selected) of the high voltage driver of the present invention.
Figure 64B:
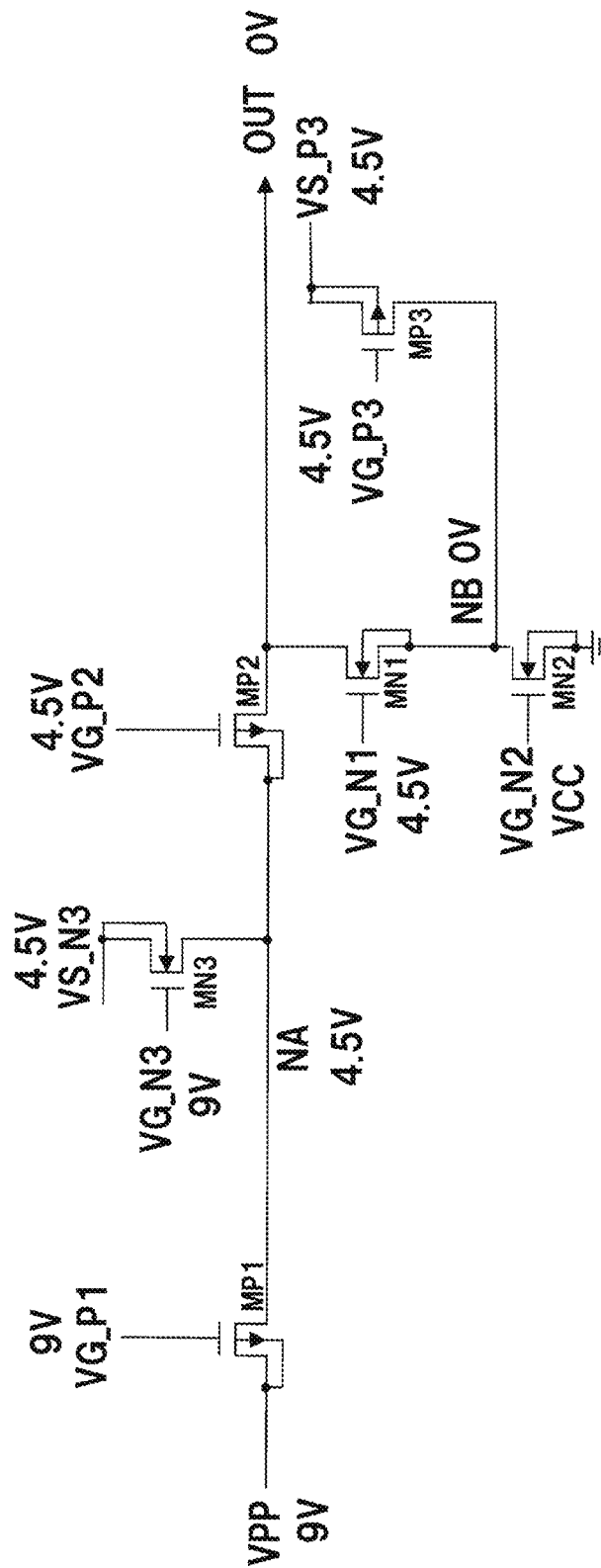
FIG. 64B is an example of the voltage application conditions (when erase is non-selected) of the high voltage driver of the present invention

FIG. 64A and FIG. 64B shows the voltage application conditions at the time of erasure in the high voltage driver.

FIG. 64A shows the case where 9V is applied to the selection SL. The gate potential VG_N1 of MN1 is set at 4.5V and the gate potential VG_N2 of MN2 is set at 0V. The central node NB of MN1 and MN2 which are connected in series is charged to 4.5V by MP3 and MN1 and MN2 are both switched OFF. When VPP (9V) is output via MP1, MP2, the gate potentials VG_P1, VG_P2 of MP1 and MP2 are set at 4.5V and in this voltage condition the gate electrical field stress of MP1 and MP2 falls to 4.5V. The gate potential VN_N3 is set at 4.5V and MN3 for supplying a voltage to the central node NA of MP1 and MP2 is switched to OFF.

FIG. 64B shows the case where 0V is applied to the non-selection SL. By setting the gate potential VG_N1 of MN1 at 4.5V and the gate potential VG_N2 of MN2 at VCC, MN1 and MN2 are switched ON and 0V is output. The gate potential VG_P3 of MP3 for supplying a voltage to the central node NB of MN1 and MN2 is set at 4.5V and switched OFF. The gate potential VG_P1 of MP1 is set at VPP (9V) and switched OFF. The central node NA of MP1 and MP2 is charged to 4.5V by MN3, the gate potential is VG_P2 is set at 4.5V and MP2 is also switched OFF In this way, in the high voltage driver circuit of the present invention, it is possible to reduce the voltage difference between two arbitrary terminals of each transistor lower than VPP. In the examples shown in FIG. 64A and FIG. 64B, it is possible to set the voltage difference between two arbitrary terminals of each transistor lower than 4.5V. In order to obtain these effects, it is necessary to change the gate potential VG_P1 of MP1 to within the range of VP (>0V)/VPP. Consequently, a level conversion circuit for converting the input level 0V/VCC to VP (>0V)/VPP is required. Furthermore, in the example above, the gate of MN3 is driven by a signal which changes in the rages of VP (>0V)/VPP, however, the gate may also be driven by a signal which changes in a different range.

Embodiment Five

Figure 65:
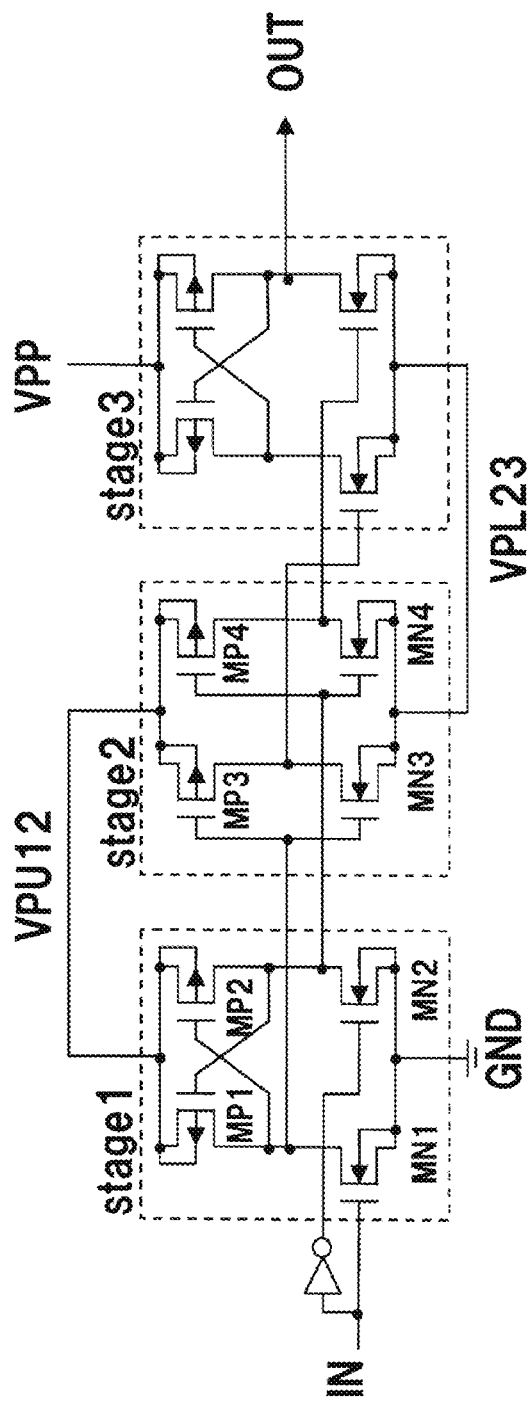
FIG. 65 is a circuit diagram of a level converter circuit related to embodiment five of the present invention.

Embodiment five of a level conversion circuit which used in a high voltage driver circuit in the present invention is shown in FIG. 65. The level conversion circuit has a three stage structure and the odd numbered stage is a usual CVSL circuit and the even numbered stage is an INVERTER circuit. The power supply of each stage is alternately connected as shown in FIG. 65.

Figure 69A:
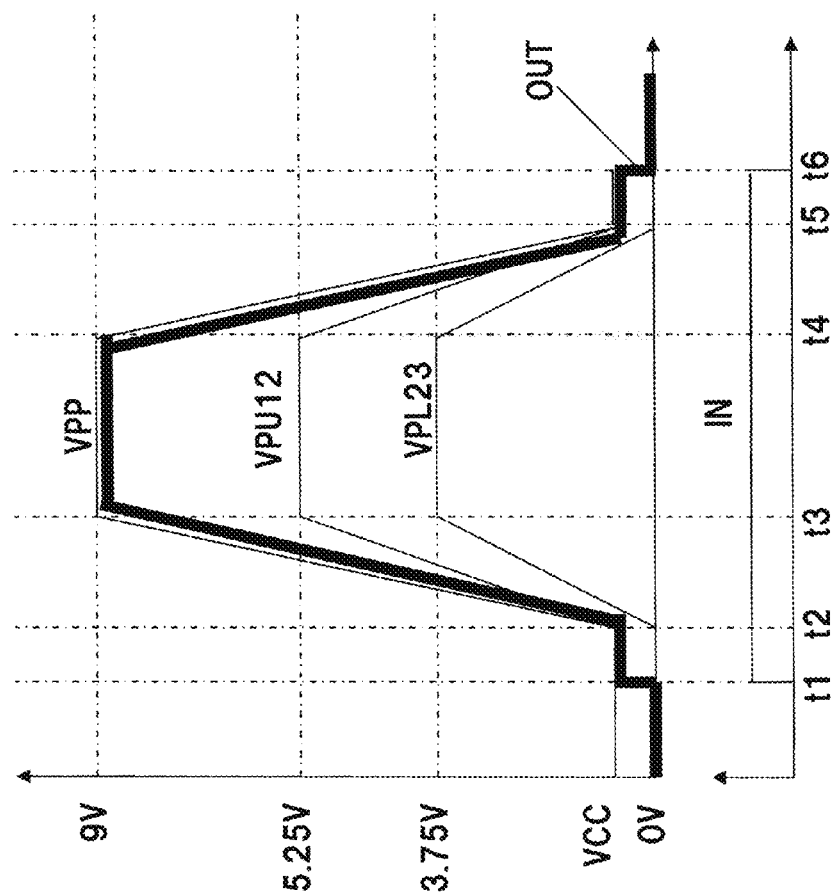
FIG. 69A is a voltage application timing example in the level inverter circuit related to embodiments five to seven of the present invention.

The voltage relationship of each stage is shown in FIG. 68 and the voltage application timing is shown in FIGS. 69A and 69B. A 0V/VCC input level is converted to a level 0V/VPU12 (=5.25V) by the stage one CVSL circuit, converted to a level VPL23 (=3.75V)/VPU12 (=5.25V) in the stage two INVERTER circuit and converted to a level VPL23 (=3.75V)/VPP (=9V) in the stage three CVSL circuit. In this way, in the conversion circuit in embodiment five of the present invention, it is possible to finally convert a 0V/VCC input level to a level VPL23 (=3.75V)/VPP (=9V).

In addition, in each stage, a voltage difference between two arbitrary terminals of a transistor can be set to 5.25V or less which relieves electric field stress. Here, the available values of each power supply have the following relationship; VPP>VPU12>VPL23>GND, and the voltage level conditions which meet this relationship are not limited to the voltage levels described above. Here, the relationship between VPU12 and VPL23 is determined by the voltage range in which the stage two INVERTER circuit operates and is given as VPU12−VPL23=1.5V in the example in FIG. 11. In the voltage application timing there is method for changing an input signal IN before each power supply is initiated as is shown in FIG. 69A, and a method for changing the input signal IN after each power supply is initiated as is shown in FIG. 69B.

Embodiment Six

Figure 66:
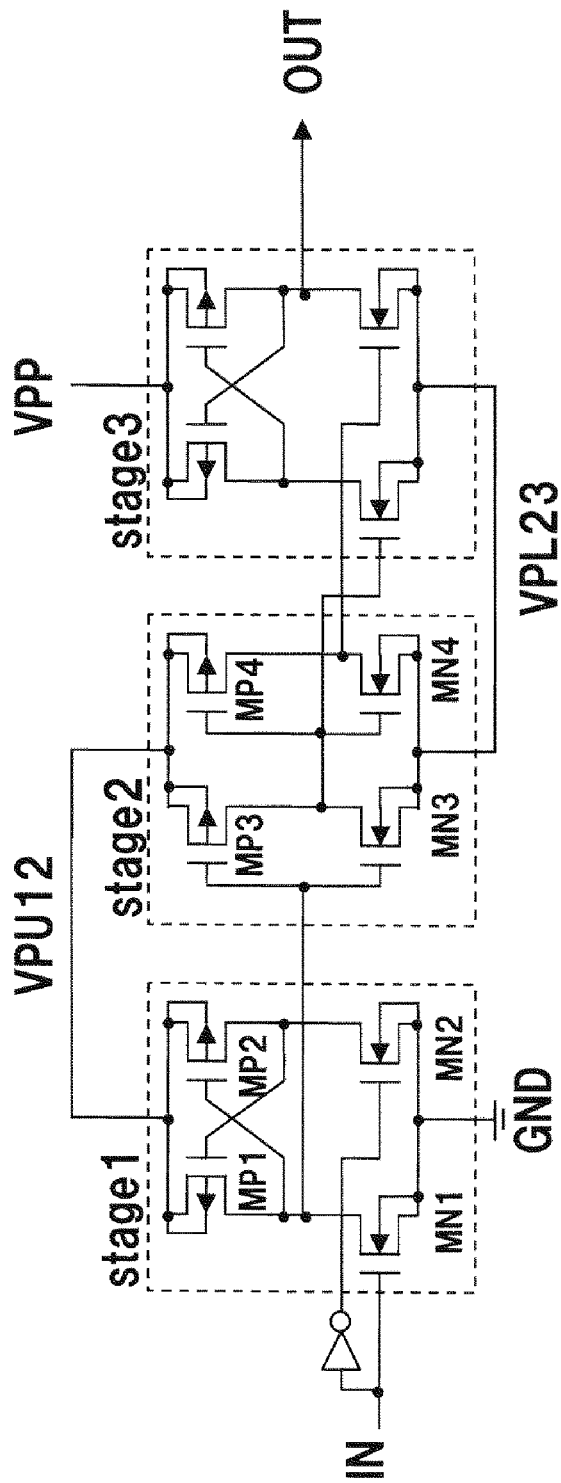
FIG. 66 is a circuit diagram of a level converter circuit related to embodiment six of the present invention.

A level conversion circuit of embodiment six is shown in FIG. 66. The difference between embodiment five is only the connection method of the even numbered stage INVERTER circuit. In embodiment five, an input of the INVERTER circuit formed by MP4 and MN4, uses an output of a stage one CVSL circuit, however, in embodiment six, an output of an INVERTER circuit formed by MP3 and MN3 is used.

Embodiment Seven

Figure 67:
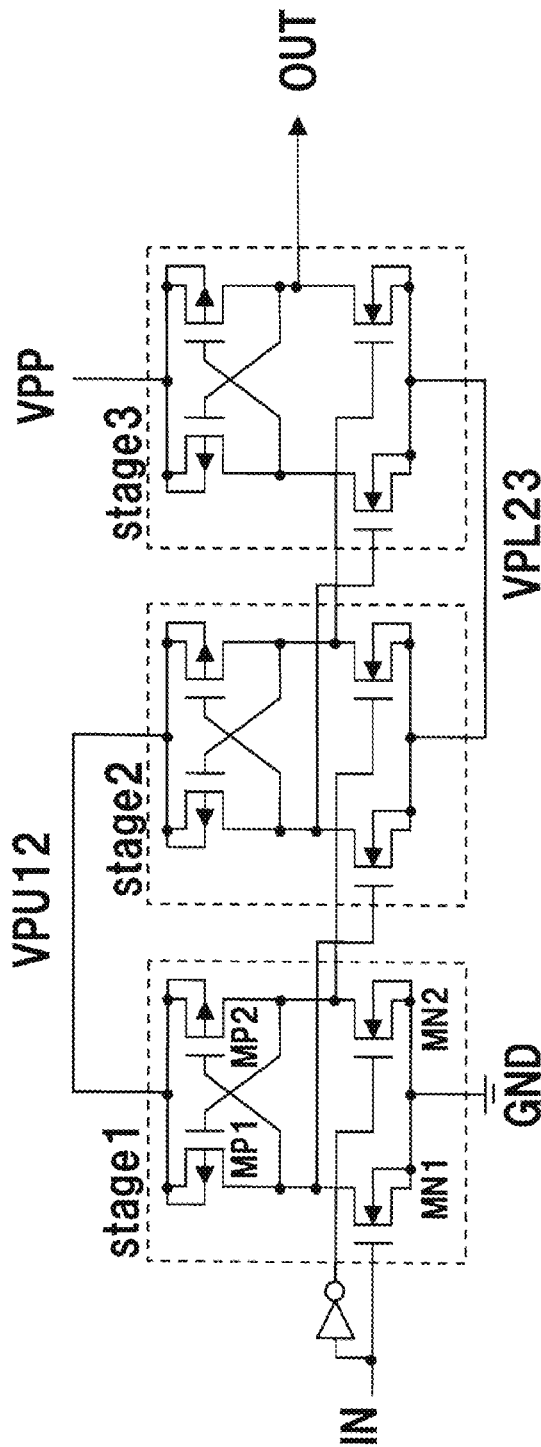
FIG. 67 is a circuit diagram of a level converter circuit related to embodiment seven of the present invention.

A level conversion circuit of embodiment seven is shown in FIG. 67. The difference between embodiment five is that the even numbered stage INVERTER circuit is changed to a CVSL circuit. In this way, all the stages are realized by CVSL circuits.

The level conversion circuits of embodiments five to seven shown in FIG. 65 to 67 have a three stage structure and it is possible to finally convert the input level 0V/VCC to VPL23 (=3.75V)/VPP (=9V), and it is possible to set the voltage difference between two arbitrary terminals of a transistor to 5.25V or less in each stage.

In the present embodiment, an example of a three stage structure was given, however, as long as there are an odd number of stages, a structure may have five or more stages. The largest voltage difference between two arbitrary terminals of a transistor within a level conversion circuit in the case where the total number of stages is given as N (N is an odd number of three or more), is calculated by the following formula.

$$Vds\_max = (2VPP + (N-1)Vod)/(N+1)$$

$$Vg\_max = (2VPP + (N-1)Vod)/(N+1)$$

Vds_max: largest voltage difference between source and drain
Vg_max: largest voltage difference between gate and source/ and between gate and drain
VPP: output voltage
Vod: VPUk, k+1−VPLk+1, k+2
For example, when VPP=9V and Vod=1.5V, Vds_max=Vg_max=5.25V in the three stage structure of embodiments five to seven, and becomes Vds_max=Vg_max=4V when in a five stage structure. In this way, by increasing the number of stages in a level conversion circuit, it becomes possible to relieve the electrical field stress which is applied to a transistor. In addition, in a five stage structure, when VPP=9V and Vod=2.5V, Vds_max=Vg_max=4.5V, and means that it is possible to relieve electrical field stress the lower the Vod voltage.

Embodiment Eight

Figure 70:
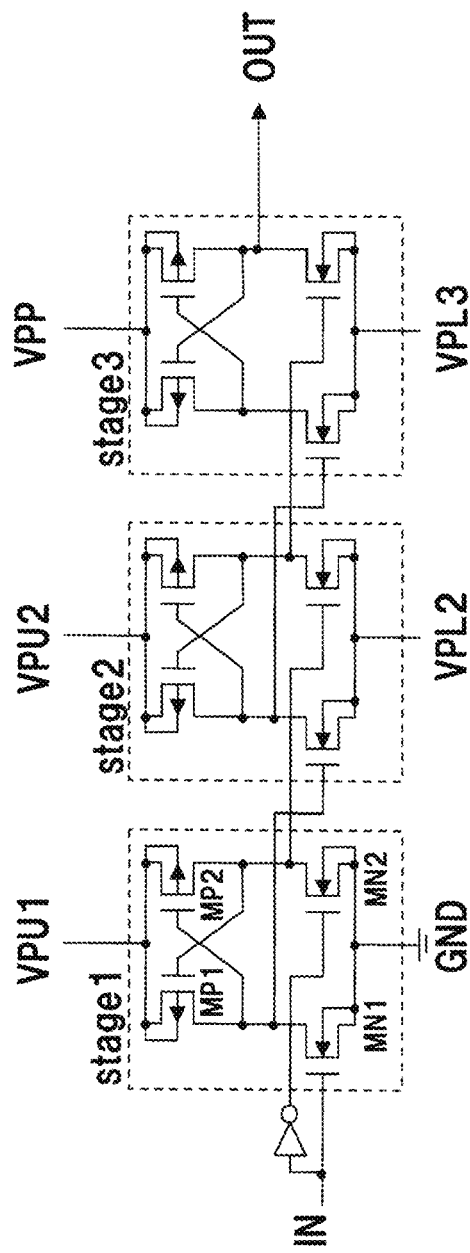
FIG. 70 is a circuit diagram of a level converter circuit related to embodiment eight of the present invention.

FIG. 70 shows a level conversion circuit of embodiment eight which is used by a high voltage driver circuit in the present invention. The level conversion circuit has a three stage structure and a usual CVSL circuit is applied to all the stages. The power supply of each stage is independently set as is shown in FIG. 60.

Figure 71:
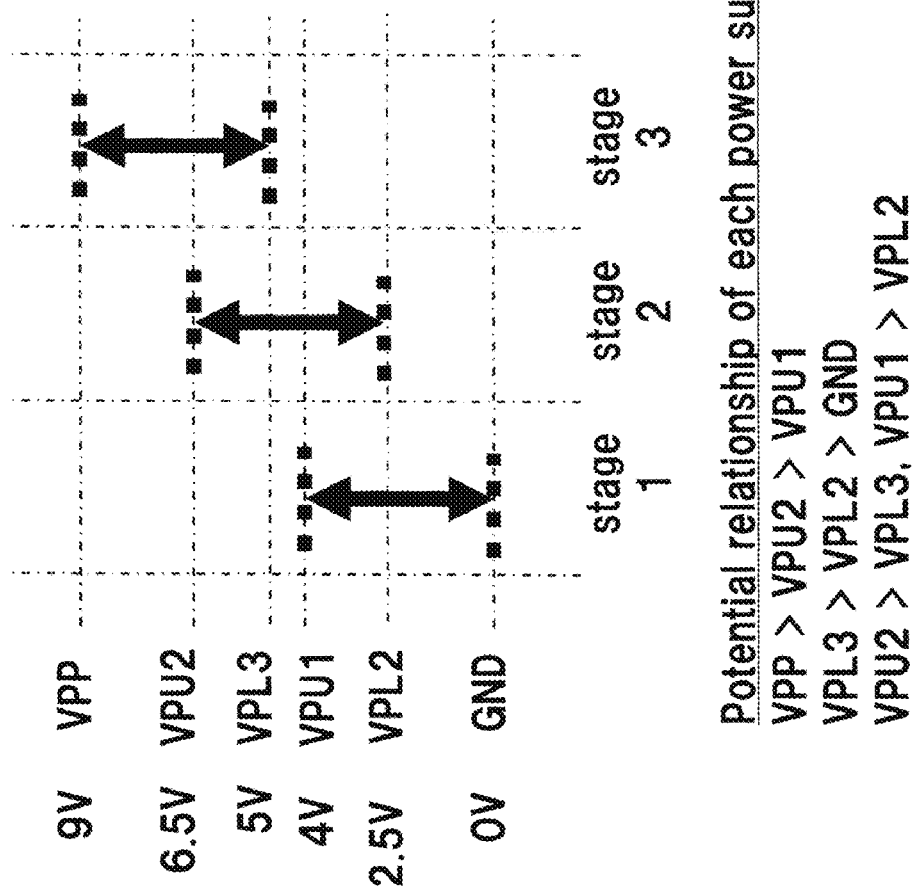
FIG. 71 is a voltage application example in the level inverter circuit related to embodiment eight of the present invention.
Figure 72A:
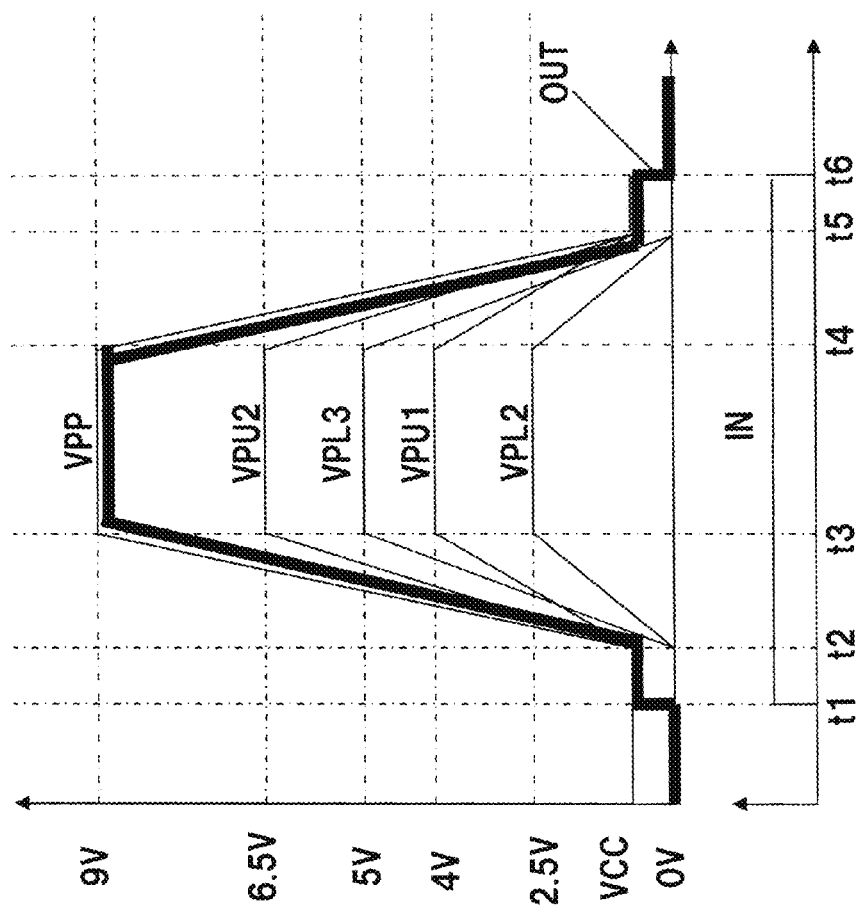
FIG. 72A is a voltage application timing example in the level inverter circuit related to embodiment eight of the present invention.

The voltage relationship of each stage is shown in FIG. 71 and the voltage application timing is shown in FIGS. 72A and 72B. A 0V/VCC input level is converted to a level 0VNPU1 (=4V) by the stage one CVSL circuit, converted to a level VPL2 (=2.5V) NPU1 (=6.5V) in the stage two CVSL circuit and converted to a level VPL3 (=5V)/VPP (=9V) in the stage three CVSL circuit.

In this way, in the conversion circuit in embodiment eight of the present invention, it is possible to finally convert a 0V/VCC input level to a level VPL3 (=5V)/VPP (=9V). In addition, in each stage, a voltage difference between an arbitrary source and drain of a transistor can be set to 4V or less, and a voltage difference between a gate and source/gate and drain can be set at 6.5V or less which relieves electric field stress. Here, the available values of each power supply have the following relationship;

VPP>VPU2>VPU1

VPL3>VPL2>GND

VPU2>VPL3,VPU1>VPL2 and the voltage level conditions which meet this relationship are not limited to the voltage levels described above.

Here, the relationship between VPU2 and VPL3 and the relationship between VPU1 and VPL2 is determined by the voltage range in which the CVSL circuits of stage two and stage three operate, and is given as VPU2−VPL3=VPU1−VPL2=1.5V in the example in FIG. 71. Comparing embodiments five to seven, while gate electrical field stress becomes larger by increasing the number of power supplies, electrical stress can be relieved between a source and drain.

In the voltage application timing there is method for changing an input signal IN before each power supply is initiated as is shown in FIG. 72A, and a method for changing the input signal IN after each power supply is initiated as is shown in FIG. 72B.

An example of a level conversion circuit with a three stage structure in embodiment eight shown in FIG. 70 was given, however, as long as there are three or more stages, there can be any number of odd or even stages. The largest voltage difference between two arbitrary terminals of a transistor within a level conversion circuit in the case where the total number of stages is given as N (N is an integer of three or more), is calculated by the following formula.

$Vds\_max=(VPP+(N-1)Vod)/N$ $Vg\_max=(2VPP+(N-2)Vod)/N$

Vds_max: largest voltage difference between source and drain
Vg_max: largest voltage difference between gate and source/ and between gate and drain
VPP: output voltage
Vod: VPUk, k+1−VPLk+1, k+2

For example, when VPP=9V and Vod=1.5V, Vds_max=4V and Vg_max=6.5V in the three stage structure of embodiment eight, and becomes Vds_max=3.375V and Vg_max=5.25V in a four stage structure, and becomes Vds_max=3V and Vg_max=4.5V in a five stage structure. In this way, by increasing the number of stages in a level conversion circuit, it becomes possible to relieve the electrical field stress which is applied to a transistor.

Figure 73:
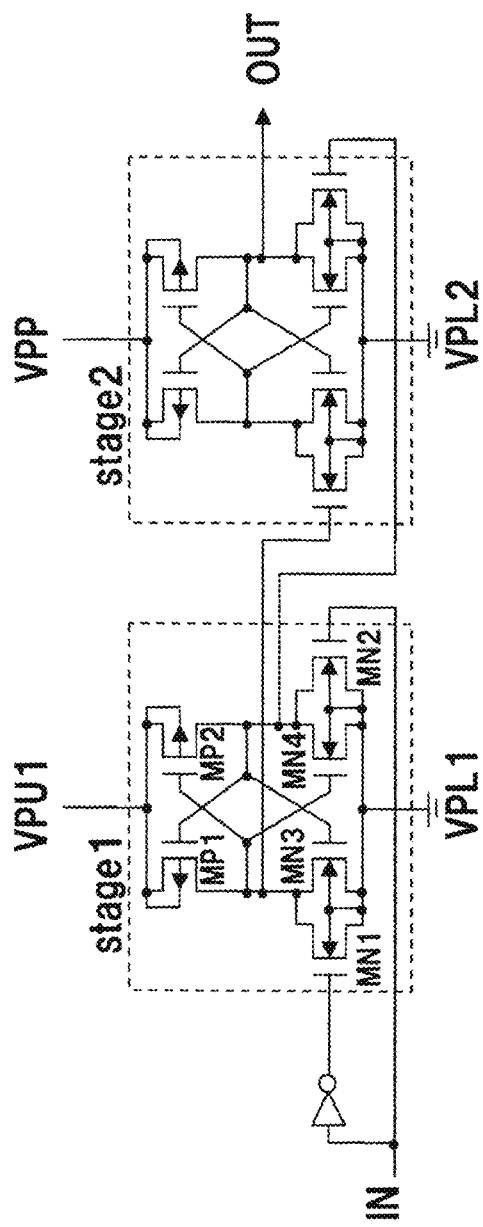
FIG. 73 is a circuit diagram of a level converter circuit related to embodiment nine of the present invention.

FIG. 73 shows a level conversion circuit of embodiment nine which is used in a high voltage driver circuit in the present invention. The level conversion circuit has a two stage structure and a latch type CVSL circuit is applied to all the stages. In addition to NMOS transistors MN1 and MN2 and PMOS transistors MP1 and MP2 which form a usual CVSL circuit, the latch of the latch type CVSL circuit as is shown in FIG. 79 is formed by MP1, MP2, MN3 and MN4.

Figure 74:
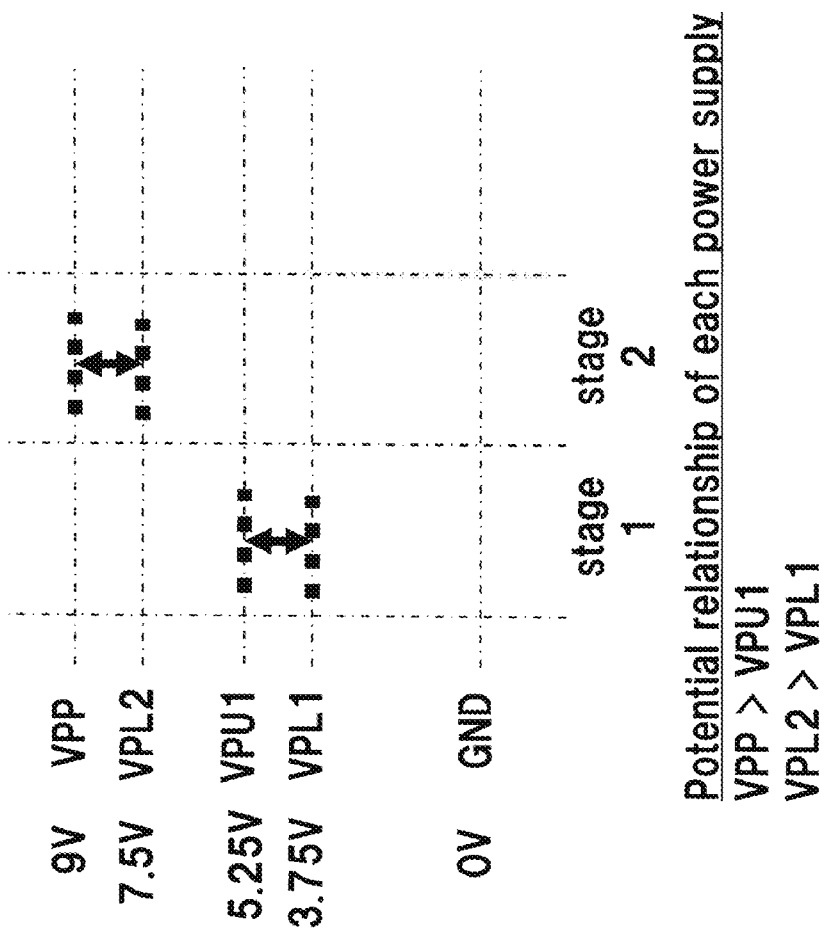
FIG. 74 is a voltage application example in the level inverter circuit related to embodiment nine of the present invention.
Figure 75:
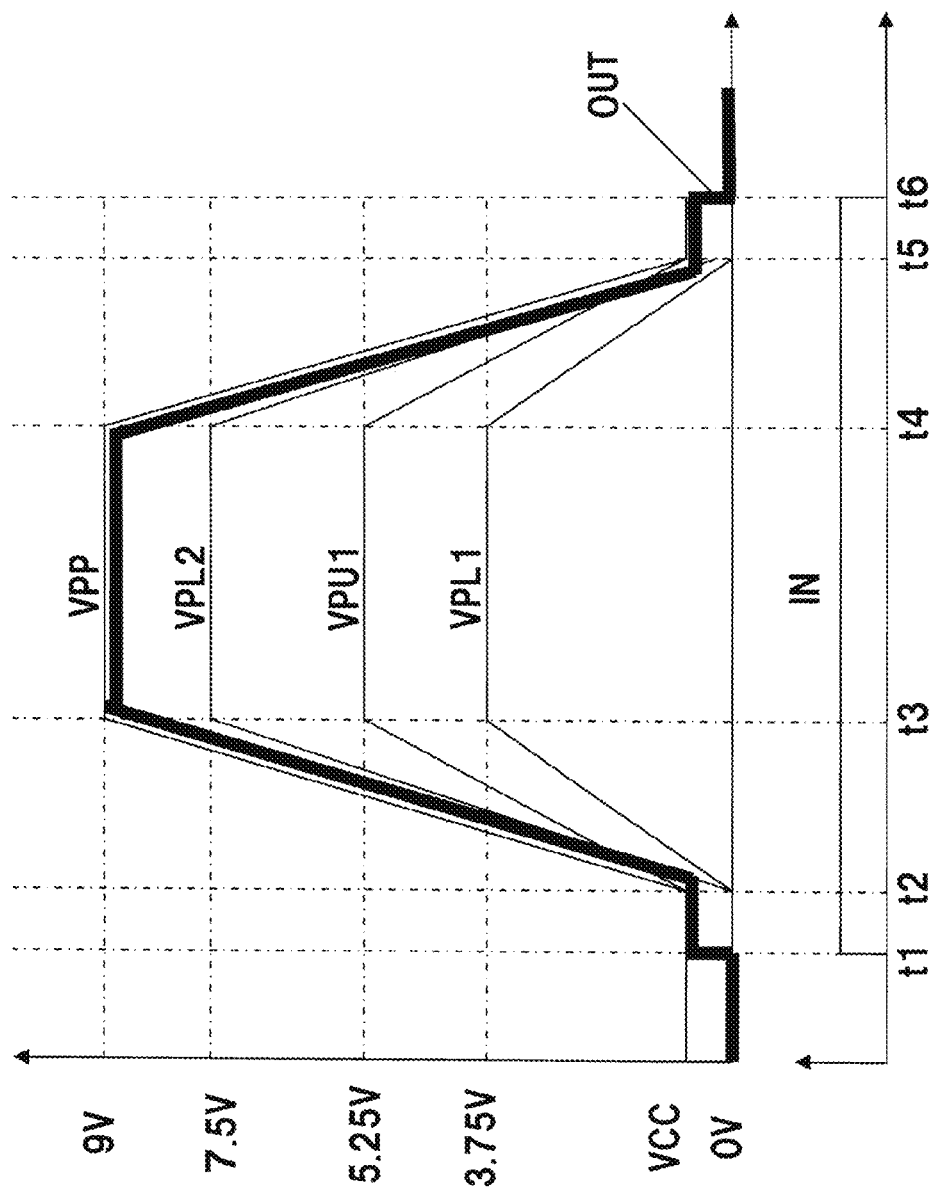
FIG. 75 is a voltage application timing example in the level inverter circuit related to embodiment nine of the present invention.

The power supply of each stage is set independently as is shown in FIG. 73. The voltage relationship of each stage is shown in FIG. 74 and voltage application timing is shown in FIG. 75. A 0V/VCC input level is converted to a level VPL1 (=3.75V)/VPU1 (=5.25V) by the stage one latch type CVSL circuit and converted to a level VPL2 (=7.5V)/VPP (=9V) in the stage two latch type CVSL circuit.

In this way, in the level conversion circuit in embodiment nine of the present invention, it is possible to finally convert a 0V/VCC input level to a level VPL2 (=7.5V)/VPP (=9V). In addition, in each stage, a voltage difference between an arbitrary source and drain of a transistor can be set to 1.5V or less, and a voltage difference between a gate and source/gate and drain can be set at 5.25V or less which relieves electric field stress. Here, the available values of each power supply have the following relationship;

VPP>VPU1

VPL2>VPL1 and the voltage level conditions which meet this relationship are not limited to the voltage levels described above In embodiment eight, in the relationship between VPU2 and VPL3 and the relationship between VPU1 and VPL2, there was a restriction whereby the voltage range in which the stage two and stage three CVSL circuits operated had to be set, however, in the present embodiment, as is shown in FIG. 75, the above stated restriction does not exist because the input signal IN is changed before each power supply is initiated and the state of the latch can be maintained. Compared to embodiments five to seven, while the number of transistors per staged increases the electrical field stresses between a source and drain and gate electrical field stress can be relieved.

Embodiment Nine

An example of a level conversion circuit with a two stage structure in embodiment nine shown in FIG. 73 was given, however, as long as there are two or more stages, there can be any number of odd or even stages. The largest voltage difference between two arbitrary terminals of a transistor within a level conversion circuit in the case where the total number of stages is given as N (N is an integer of two or more), is calculated by the following formula.

$Vds\_max=Vod$ $Vg\_max=(VPP+(N-1)Vod)/N$

Vds_max: largest voltage difference between source and drain
Vg_max: largest voltage difference between gate and source/ and between gate and drain VPP: output voltage
Vod: VPUk, k+1−VPLk+1, k+2
(*) Here, for simplification, VCC=Vod For example, when VPP=9V and Vod=1.5V, Vds_max=1.5V and Vg_max=5.25V in the two stage structure of embodiment nine, and becomes Vds_max=1.5V and Vg_max=4V in a three stage structure, and becomes Vds_max=1.5V and Vg_max=3.375V in a four stage structure. In this way, by increasing the number of stages in a level conversion circuit, it becomes possible to relieve the electrical field stress which is applied to a transistor.

Figure 76:
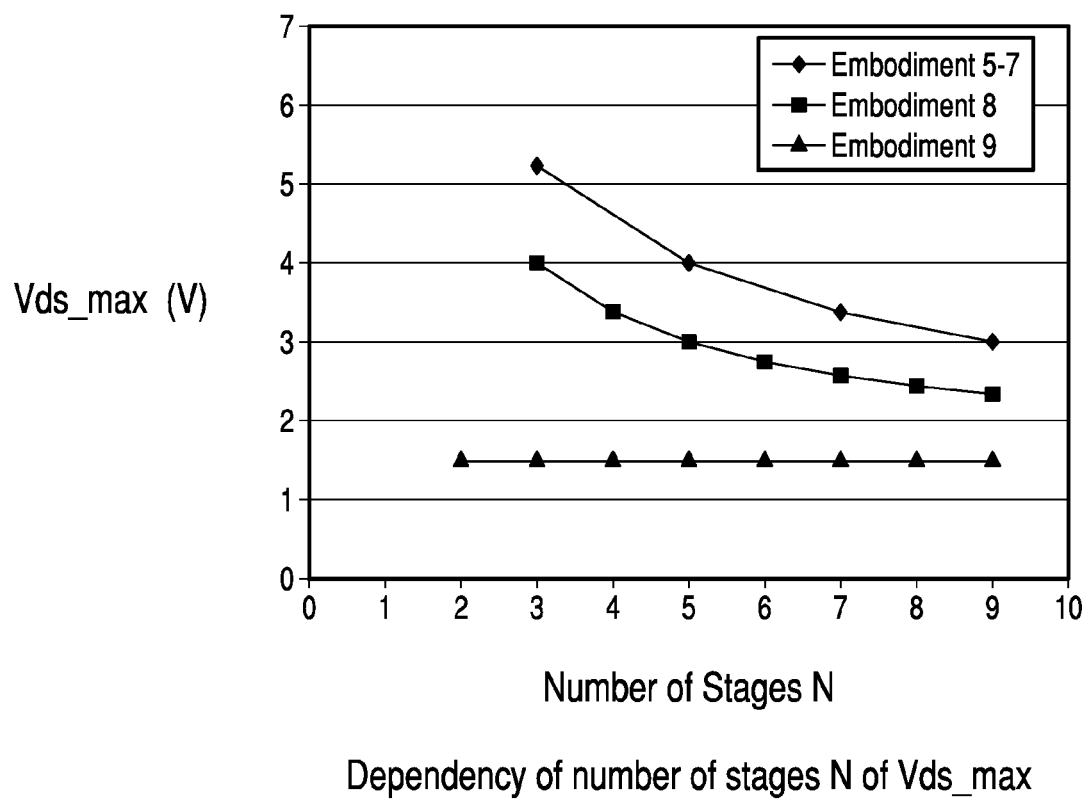
FIG. 76 is a graph which shows the number of stages N dependency of Vds_max in the level converter circuit related to each embodiment five to nine of the present invention.
Figure 77:
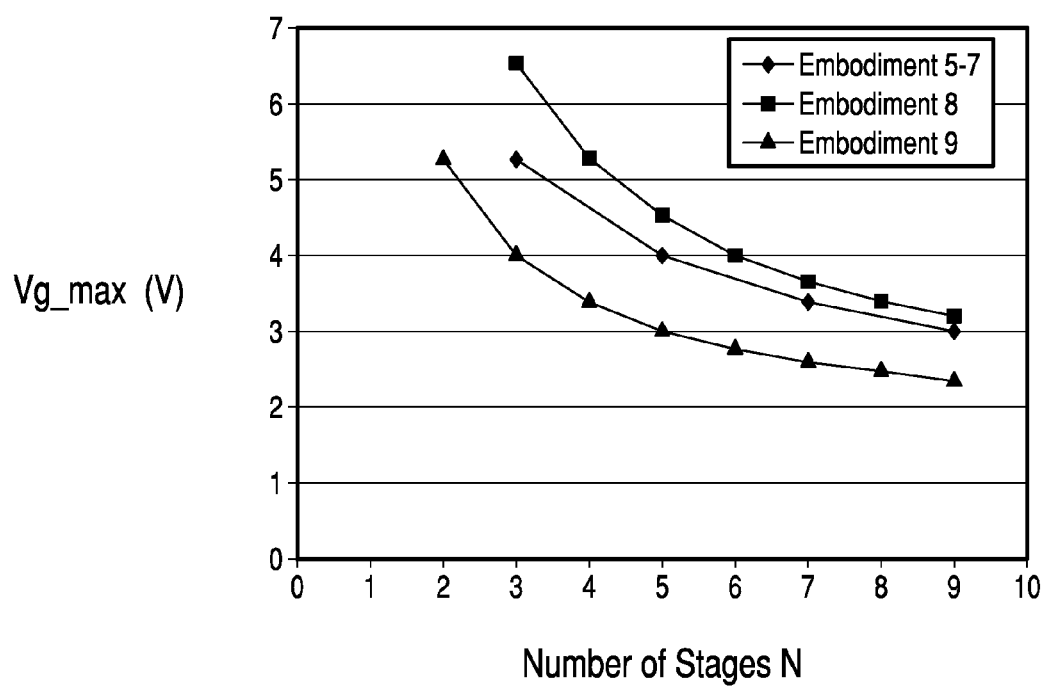
FIG. 77 is a graph which shows the number of stages N dependency of Vds_max in the level converter circuit related to each embodiment five to nine of the present invention.

The N dependency of the number of Vds_max and Vg_max in the level conversion circuits in embodiments five to nine are shown in FIG. 76 and FIG. 77. This graph is plotted based on each formula described above. There are merits and demerits in each embodiment, however, it is possible to appropriately use the level conversion circuits according to purpose.

Compared to embodiments five to seven, embodiment eight has the merit of being able to reduce Vds_max. However, because Vg_max increases compared to embodiments five to seven, it is necessary to select according to each standard value of Vds_max and Vg_max. Compared to embodiments five to eight, embodiment nine has the demerit of an increase in the number of transistors per stage, however, because it is possible to reduce Vds_max and Vg_max, it is effective when the electrical field stress standard of each transistor is severe. In the voltage application timing, because there is a restriction in that it is necessary to determine an input signal in advance before each power supply is initiated only in embodiment nine, it is necessary to select according to operation specifications.

The level conversion circuit explained above in embodiments five to nine is used to drive MP1 of a high voltage driver circuit in FIG. 63. In addition, this high voltage driver circuit is used in driving SL of the nonvolatile semiconductor memory device in FIG. 58 through to FIG. 60.

The present invention can be applied to nonvolatile semiconductor memory devices and logic products which incorporate nonvolatile semiconductor memory devices.

What is claimed is:

1. A nonvolatile semiconductor memory device comprising:
   a first PMOS transistor and a second PMOS transistor having a gate, the first and the second PMOS transistors being connected in series between a first terminal and a third terminal; and
   a first NMOS transistor and a second NMOS transistor having a gate, the first and the second NMOS transistors being connected in series between a second terminal and a fourth terminal;
   wherein the gate of the second PMOS transistor and the gate of the second NMOS transistor are commonly connected and floated, and
   wherein the third terminal and the fourth terminal are controlled independently.

2. The nonvolatile semiconductor memory device according to claim 1, further comprising:
   a first n type well formed in a substrate, the first and the second PMOS transistors being formed in the first n type well; and
   a second p type well formed in the substrate, the first and the second NMOS transistors being formed in the second p type well.

3. The nonvolatile semiconductor memory device according to claim 2, further comprising a third well to enclose the first n type well and the second p type well.

4. The nonvolatile semiconductor memory device according to claim 1, further comprising a capacitor commonly connected to the gates of the second PMOS and the second NMOS.

5. The nonvolatile semiconductor memory device according to claim 4 further comprising: a programming circuit for applying a first voltage to the first terminal connected to the first PMOS transistor, for turning the first PMOS transistor on, applying a fourth voltage higher than the first voltage to a node of the capacitor, and applying a second voltage higher than the first voltage to a substrate node of the second PMOS transistor in order to inject electrons into the gate of the second PMOS transistor.

6. The nonvolatile semiconductor memory device according to claim 4 further comprising an erasing circuit for applying a fifth voltage to a node of the capacitor, and applying a third voltage higher than the fifth voltage to the second terminal connected to the first NMOS transistor in order to extract electrons from the gate of the second NMOS transistor.

7. The nonvolatile semiconductor memory device according to claim 1, wherein the first and the second PMOS transistors and the first and the second NMOS transistors are configured to a first cell unit;
   the nonvolatile semiconductor memory device further comprising:
   a third PMOS transistor and a fourth PMOS transistor having a gate, the third and the fourth PMOS transistors being connected in series; and
   a third NMOS transistor and a fourth NMOS transistor having a gate, the third and the fourth NMOS transistors being connected in series;
   wherein the gate of the fourth PMOS transistor and the gate of the fourth NMOS transistor are commonly connected and floated, and the third and the fourth PMOS transistors and the third and the fourth NMOS transistors are configured to a second cell unit; and
   wherein the first cell unit and the second cell unit store a pair of complementary data.

8. The nonvolatile semiconductor memory device according to claim 7, wherein the first PMOS transistor has a gate, the third PMOS transistor has a gate, and the gates of the first PMOS transistor and the third PMOS transistor are commonly connected to a first row line; and wherein the first NMOS transistor has a gate, the third NMOS transistor has a gate, and the gates of the first NMOS transistor and the third NMOS transistor are commonly connected to a second row line.

9. The nonvolatile semiconductor memory device according to claim 7 further comprising a sense amplifier to compare a first current flowing through the first and the second PMOS transistor or through the first and the second NMOS transistor and a second current flowing through the third and the fourth PMOS transistor or through the third and the fourth NMOS transistor.

10. The nonvolatile semiconductor memory device according to claim 7 further comprising:
    a programming circuit for applying a first voltage to the first terminal connected to the first PMOS transistor, for turning the first PMOS transistor on, and applying a second voltage higher than the first voltage to a substrate node of the second PMOS transistor in order to inject electrons into the gate of the second PMOS transistor; and an erasing circuit for applying a third voltage to a fifth terminal connected to the third NMOS transistor in order to extract electrons from the gate of the third NMOS transistor.

11. The nonvolatile semiconductor memory device according to claim 7 further comprising:
a programming circuit for applying a first voltage to a terminal of the first PMOS transistor, for turning the first PMOS transistor on, applying a fourth voltage higher than the first voltage to a node of the capacitor, and applying a second voltage higher than the first voltage to a substrate node of the second PMOS transistor in order to inject electrons into the gate of the second PMOS transistor; and
an erasing circuit for applying a fifth voltage to a node of the capacitor, and applying a third voltage to a terminal of the third NMOS transistor in order to extract electrons from the gate of the third NMOS transistor.

12. The nonvolatile semiconductor memory device according to claim 1 further comprising a sense amplifier to detect a current flowing through the first and the second PMOS transistor or through the first and the second NMOS transistor.

13. The nonvolatile semiconductor memory device according to claim 1 further comprising a programming circuit for applying a first voltage to the first terminal of the first PMOS transistor, for turning the first PMOS transistor on, and applying a second voltage higher than the first voltage to a substrate node of the second PMOS transistor in order to inject electrons into the gate of the second PMOS transistor.

14. The nonvolatile semiconductor memory device according to claim 13 wherein the first voltage is a negative voltage.

15. The nonvolatile semiconductor memory device according to claim 13 wherein the second voltage is a positive voltage.

16. The nonvolatile semiconductor memory device according to claim 1 further comprising an erasing circuit for applying a third voltage to the second terminal connected to the first NMOS transistor in order to extract electrons from the gate of the second NMOS transistor.

17. The nonvolatile semiconductor memory device according to claim 1, further comprising a first capacitor commonly connected to the gates of the second PMOS and the second NMOS, wherein the first and the second PMOS transistors ,the first and the second NMOS transistors, and the first capacitor are configured to a first cell unit; and
a third PMOS transistor and a fourth PMOS transistor having a gate, the third and the fourth PMOS transistors being connected in series;
a third NMOS transistor and a fourth NMOS transistor having a gate, the third and the fourth NMOS transistors being connected in series; and
a second capacitor commonly connected to the gates of the fourth PMOS and the fourth NMOS;
wherein the gate of the fourth PMOS transistor and the gate of the fourth NMOS transistor are commonly connected and floated, and the third and the fourth PMOS transistors ,the third and the fourth NMOS transistors and the second capacitor are configured to a second cell unit; and
wherein the first cell unit and the second cell unit store a pair of complementary data.

18. The nonvolatile semiconductor memory device according to claim 17, wherein the first PMOS transistor has a gate, the third PMOS transistor has a gate, and the gates of the first PMOS transistor and the third PMOS transistor are commonly connected to a first row line; wherein the first NMOS transistor has a gate, the third NMOS transistor has a gate, and the gates of the first NMOS transistor and the third NMOS transistor are commonly connected to a second row line; and wherein the first capacitor and the second capacitor are commonly connected to a third row line.

19. The nonvolatile semiconductor memory device according to claim 1 wherein source and drain nodes of the first and the second PMOS transistors and the first and the second NMOS transistors are asymmetrically formed.

20. The nonvolatile semiconductor memory device according to claim 1 wherein the gate of the second PMOS transistor is made of p type polysilicon and the gate of the second NMOS transistor is made of n type polysilicon.

* * * * *